(12) United States Patent
Sawaki

(10) Patent No.: US 10,297,774 B2
(45) Date of Patent: May 21, 2019

(54) PHOTOELECTRIC CONVERSION ELEMENT AND IMAGING ELEMENT

(71) Applicant: FUJIFILM CORPORATION, Tokyo (JP)

(72) Inventor: Daigo Sawaki, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 15/350,472

(22) Filed: Nov. 14, 2016

(65) Prior Publication Data

US 2017/0062746 A1 Mar. 2, 2017

Related U.S. Application Data

(63) Continuation of application No. PCT/JP2015/068931, filed on Jul. 1, 2015.

(30) Foreign Application Priority Data

Jul. 31, 2014 (JP) ................................ 2014-157098

(51) Int. Cl.
*H01L 51/42* (2006.01)
*H01L 31/10* (2006.01)
(Continued)

(52) U.S. Cl.
CPC .... *H01L 51/4273* (2013.01); *H01L 27/14665* (2013.01); *H01L 27/307* (2013.01);
(Continued)

(58) Field of Classification Search
CPC ..... H01L 27/146; H01L 27/307; H01L 31/10; H01L 51/4273; H01L 51/442;
(Continued)

(56) References Cited

U.S. PATENT DOCUMENTS

2004/0175568 A1* 9/2004 Takaguchi ............. B82Y 30/00
428/402
2006/0222978 A1* 10/2006 Tong .................... G03G 5/0578
430/64

(Continued)

FOREIGN PATENT DOCUMENTS

CN 102460760 A 5/2012
JP 2008-166339 A 7/2008

(Continued)

OTHER PUBLICATIONS

Translation of the International Preliminary Report on Patentability issued in PCT/JP2015/068931; dated Feb. 9, 2017; 7pp.

(Continued)

*Primary Examiner* — Thanh T Nguyen
(74) *Attorney, Agent, or Firm* — Studebaker & Brackett PC

(57) ABSTRACT

Provided is a photoelectric conversion element including: a lower electrode, a charge blocking layer which suppresses injection of a charge from the lower electrode, an organic layer which includes a photoelectric conversion layer, and an upper electrode which includes a transparent electrode layer, which are laminated in this order on a substrate. The photoelectric conversion layer is configured of an amorphous film and has a bulk hetero-structure of a P-type organic semiconductor and an N-type organic semiconductor formed of fullerenes. A difference between the ionization potential of the photoelectric conversion layer having the bulk hetero-structure and the electron affinity of the N-type semiconductor is 1.30 eV or greater.

3 Claims, 4 Drawing Sheets

(51) Int. Cl.
  *H01L 27/30* (2006.01)
  *H01L 27/146* (2006.01)
  *H01L 51/44* (2006.01)
  *H01L 51/00* (2006.01)

(52) U.S. Cl.
  CPC ............ *H01L 31/10* (2013.01); *H01L 51/006* (2013.01); *H01L 51/0059* (2013.01); *H01L 51/0061* (2013.01); *H01L 51/0072* (2013.01); *H01L 51/0073* (2013.01); *H01L 51/442* (2013.01)

(58) Field of Classification Search
  CPC ............... H01L 51/448; H01L 51/0072; H01L 2251/303; H01L 51/0061; H01L 51/441; H01L 51/0074; H01L 51/0052; H01L 51/0094; H01L 51/0054; H01L 51/006; H01L 51/447
  See application file for complete search history.

(56) References Cited

U.S. PATENT DOCUMENTS

| | | | |
|---|---|---|---|
| 2010/0032548 A1* | 2/2010 | Murata | H01L 27/305 250/206 |
| 2011/0204208 A1 | 8/2011 | Mitsui et al. | |
| 2012/0080585 A1 | 4/2012 | Fukuzaki et al. | |
| 2013/0015435 A1* | 1/2013 | Sawaki | B82Y 10/00 257/40 |
| 2013/0020566 A1 | 1/2013 | Suzuki | |
| 2014/0231781 A1 | 8/2014 | Imai | |
| 2016/0111473 A1* | 4/2016 | Liu | G01T 1/2018 378/51 |

FOREIGN PATENT DOCUMENTS

| | | |
|---|---|---|
| JP | 2010-287607 A | 12/2010 |
| JP | 2011-199263 A | 10/2011 |
| JP | 2011-222949 A | 11/2011 |
| JP | 2011-228623 A | 11/2011 |
| JP | 2013-118365 A | 6/2013 |
| JP | 2013-189602 A | 9/2013 |
| JP | 2014-003094 A | 1/2014 |
| JP | 2014-029905 A | 2/2014 |
| JP | 2014-090093 A | 5/2014 |
| TW | 201212215 A | 3/2012 |
| WO | 2013/176180 A1 | 11/2013 |
| WO | 2014-020989 A1 | 2/2014 |
| WO | 2014/061128 A1 | 4/2014 |

OTHER PUBLICATIONS

International Search Report issued in PCT/JP2015/068931; dated Aug. 11, 2015.
Written Opinion issued in PCT/JP2015/068931; dated Aug. 11, 2015.
An Office Action issued by the Chinese Patent Office (SIPO) on Aug. 3, 2017, which corresponds to Chinese Patent Application No. 201580030626.X and is related to U.S. Appl. No. 15/350,472; with English language translation.
An Office Action; "Notification of Reasons for Refusal", issued by the Japanese Patent Office dated Sep. 5, 2017, which corresponds to Japanese Patent Application No. 2016-538229 and is related to U.S. Appl. No. 15/350,472; with English language translation.
An Office Action; "Notification of Reasons for Refusal", mailed by the Japanese Patent Office dated May 8, 2018, which corresponds to Japanese Patent Application No. 2016-538229 and is related to U.S. Appl. No. 15/350,472; with English language translation.
An Office Action issued by Chinese Patent Office dated Apr. 28, 2018, which corresponds to Chinese Patent Application No. 201580030626.X and is related to U.S. Appl. No. 15/350,472.
An Office Action mailed by The State Intellectual Property Office of the People's Republic of China dated Dec. 3, 2018, which corresponds to Chinese Patent Application No. 201580030626.X and is related to U.S. Appl. No. 15/350,472.
An Office Action mailed by the Taiwanese Patent Office dated Dec. 11, 2018, which corresponds to Taiwanese Patent Application No. 104123952 and is related to U.S. Appl. No. 15/350,472.
An Office Action mailed by the Japanese Patent Office dated Feb. 5, 2019, which corresponds to Japanese Patent Application No. 2016-538229 and is related to U.S. Appl. No. 15/350,472.

* cited by examiner

PHOTOELECTRIC CONVERSION ELEMENT AND IMAGING ELEMENT

CROSS-REFERENCE TO RELATED APPLICATIONS

This application is a Continuation of PCT International Application No. PCT/JP2015/068931 filed on Jul. 1, 2015, which claims priority under 35 U.S.C. § 119(a) to Japanese Patent Application No. 2014-157098 filed on Jul. 31, 2014. The above application is hereby expressly incorporated by reference, in its entirety, into the present application.

BACKGROUND OF THE INVENTION

1. Field of the Invention

The present invention relates to a photoelectric conversion element and an imaging element in which a photoelectric conversion layer that generates a charge in response to received light is configured using an organic compound and which convert a visible light image into an electrical signal and particularly relates to a photoelectric conversion element an imaging element which have a small dark current and are capable of obtaining a high-resolution image.

2. Description of the Related Art

As an image sensor used for a digital still camera, a digital video camera, a camera for a mobile phone, or a camera for an endoscope, a solid-state imaging element such as a charge coupled device (CCD) sensor or a complementary metal oxide semiconductor (CMOS) sensor which arranges pixels including photodiodes on a semiconductor substrate such as a silicon chip and in which a signal charge corresponding to a photoelectron generated by a photodiode of each pixel is acquired by a CCD type or CMOS type read circuit has been widely known. Meanwhile, a photoelectric conversion element using an organic compound has been developed. In order to improve imaging characteristics, a dark current thereof is required to be small and, accordingly, various elements having a reduced dark current have been suggested (JP2011-228623A and JP2011-199263A).

JP2011-228623A discloses a photoelectric conversion element which includes a pair of electrodes and a photoelectric conversion layer interposed between the pair of electrodes. The photoelectric conversion layer of the photoelectric conversion element in JP2011-228623A is a bulk hetero-layer in which fullerenes or a fullerene derivative and a P-type organic semiconductor material are mixed with each other, and the ionization potential of the photoelectric conversion layer is in a range of 5.2 eV to 5.6 eV. At least one electron blocking layer is provided between at least one electrode from a pair of electrodes and the photoelectric conversion layer, and the ionization potential of the electron blocking layer adjacent to the photoelectric conversion layer is greater than the ionization potential of the photoelectric conversion layer.

JP2011-199263A discloses an organic photoelectric conversion element which includes a photoelectric conversion layer including a first electrode, a second electrode facing the first electrode, and an organic material provided between the first electrode and the second electrode. In the organic photoelectric conversion element of JP2011-228623A, the number of electron spins of the photoelectric conversion layer is $1.0 \times 10^{15}/cm^3$ or less.

SUMMARY OF THE INVENTION

In the related art, a reduction in dark current has been suggested as described in JP2011-228623A and JP2011-199263A, but there has been a recent demand for further improvement of imaging characteristics, for example, acquisition of high-resolution images.

An object of the present invention is to solve the above-described problems of the related art and to provide a photoelectric conversion element and an imaging element which have a small dark current and are capable of obtaining a high-resolution image.

In order to achieve the above-described object, according to a first aspect of the present invention, there is provided a photoelectric conversion element comprising: a lower electrode; a charge blocking layer which suppresses injection of a charge from the lower electrode; an organic layer which includes a photoelectric conversion layer; and an upper electrode which includes a transparent electrode layer which are laminated in this order on a substrate, in which the photoelectric conversion layer is configured of an amorphous film and has a bulk hetero-structure of a P-type organic semiconductor and an N-type organic semiconductor formed of fullerenes, and a difference between an ionization potential of the photoelectric conversion layer having the bulk hetero-structure and an electron affinity of the N-type semiconductor is 1.30 eV or greater.

It is preferable that a molecular weight of the charge blocking layer is in a range of 400 to 1300.

According to a second aspect of the present invention, there is provided an imaging element comprising: the photoelectric conversion element according to the first aspect of the present invention.

For example, the imaging element further comprises a charge accumulation unit which accumulates a charge generated in the photoelectric conversion layer of the photoelectric conversion element; and a connection unit which transmits the charge of the photoelectric conversion layer to the charge accumulation unit.

According to the present invention, a dark current can be reduced and thus a high-resolution image can be obtained.

DESCRIPTION OF THE PREFERRED EMBODIMENTS

Hereinafter, a photoelectric conversion element and an imaging element of the present invention will be described in detail based on preferred embodiments illustrated in the accompanying drawings.

Further, the numerical ranges shown using "to" described below include the numerical values described before and after "to". For example, if ε is in a range of a numerical value α to a numerical value β, the range of ε is a range including the numerical value α and the numerical value β and is shown as "α≤ε≤β" using mathematical symbols.

Figure 1A:
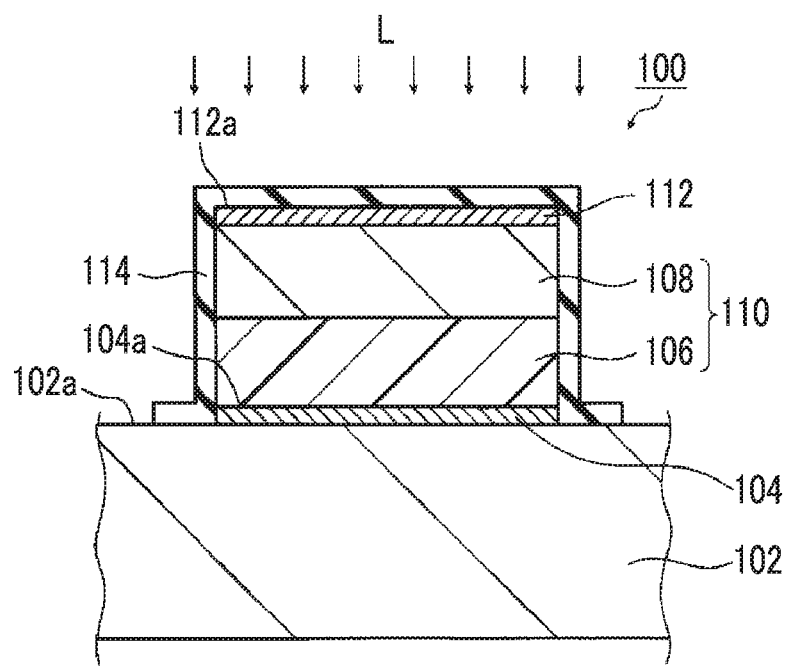
FIG. 1A is a cross-sectional view schematically illustrating a photoelectric conversion element according to an embodiment of the present invention and FIG. 1B is an enlarged view of a main portion of a sealing layer of the photoelectric conversion element according to the embodiment of the present invention by enlarging another configuration example.
Figure 1B:
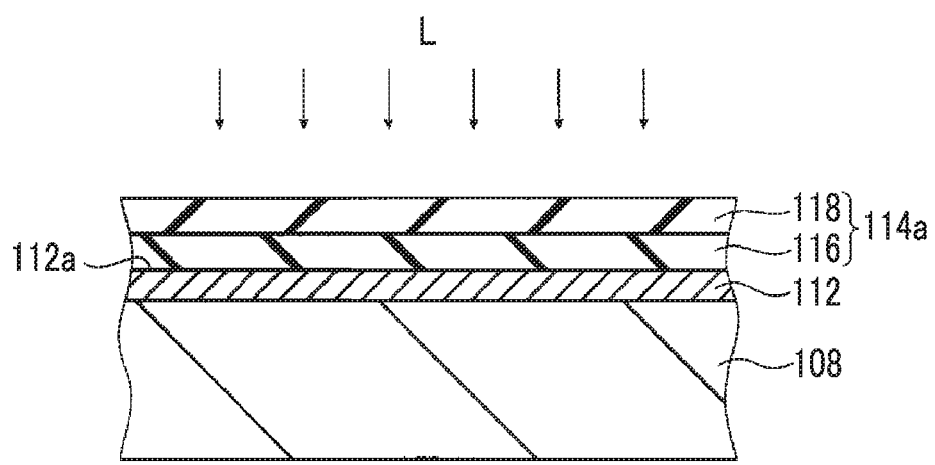

FIG. 1A is a cross-sectional view schematically illustrating a photoelectric conversion element according to an embodiment of the present invention and FIG. 1B is an enlarged view of a main portion of a sealing layer of the photoelectric conversion element according to the embodiment of the present invention by enlarging another configuration example.

A photoelectric conversion element 100 illustrated in FIG. 1A is an element for converting a visible light image into an electric signal and an incidence ray L is changed into an electrical signal. The photoelectric conversion element 100 is formed by a lower electrode 104 being laminated on a surface 102a of a substrate 102. A charge blocking layer 106 is laminated on a surface 104a of the lower electrode 104 and a photoelectric conversion layer 108 is laminated on the charge blocking layer 106. The charge blocking layer 106 and the photoelectric conversion layer 108 are collectively referred to as an organic layer 110. A sealing layer 114 that covers the lower electrode 104, the organic layer 110, and an upper electrode 112 is formed.

In the photoelectric conversion element 100, the incidence ray L is incident on the photoelectric conversion layer 108 of the organic layer 110 from the surface 112a side of the upper electrode 112 and the incidence ray L is converted into an electric signal in the photoelectric conversion layer 108. Accordingly, the sealing layer 114 and the upper electrode 112 transmit the incidence ray L as described below.

A silicon substrate or a glass substrate may be used as the substrate 102.

The lower electrode 104 is an electrode for collecting positive holes from the charge generated by the organic layer 110 (photoelectric conversion layer 108). The lower electrode 104 is configured of conductive materials such as indium tin oxide (ITO) and titanium nitride (TiN).

Moreover, it is preferable to use an ITO substrate, as the substrate 102, on which an ITO electrode is formed as the lower electrode 104.

The photoelectric conversion layer 108 receives the incidence ray L, generates a charge in accordance with the light quantity of the incidence ray L, and is configured to include organic photoelectric conversion materials. The photoelectric conversion layer 108 is configured of an amorphous film having a bulk hetero-structure of a P-type organic semiconductor and an N-type organic semiconductor formed of fullerenes. A difference between the ionization potential (IP) of the photoelectric conversion layer 108 having the bulk hetero-structure and the electron affinity (Ea) of the N-type semiconductor is 1.30 eV or greater. The photoelectric conversion layer 108 will be described in detail later.

The charge blocking layer 106 is a layer for suppressing injection of a charge to the organic layer 110 from the lower electrode 104. The charge blocking layer 106 is configured to include an organic material or an inorganic material or both of the organic material and the inorganic material.

From the viewpoints of sufficiently suppressing the contact between the lower electrode 104 and the photoelectric conversion layer 108 and avoiding the influence of defects and dust on the surface of the lower electrode 104, the thickness of the charge blocking layer 106 is preferably 20 nm or greater, more preferably 40 nm or greater, and particularly preferably 60 nm or greater.

When the charge blocking layer 106 is extremely thick, there is a problem in that a supply voltage required for applying suitable field intensity to the photoelectric conversion layer 108 is increased or a carrier transport process in the charge blocking layer 106 adversely affects the performance of the photoelectric conversion element. The total film thickness of the charge blocking layer 106 is preferably 300 nm or less, more preferably 200 nm or less, and still more preferably 100 nm or less.

In addition, the charge blocking layer 106 may be formed of a plurality of layers. When the charge blocking layer 106 is formed of a plurality of layers, an interface is generated between each of the layers constituting the charge blocking layer 106 and discontinuity occurs in intermediate levels present in each layer. As the result, a charge is unlikely to be moved through intermediate levels and thus charge blocking effects can be improved. Since the intermediate levels present in each layer may be completely the same as each other when each layer constituting the charge blocking layer 106 is formed of the same material, it is preferable that materials constituting each of the layers are different from each other in order to further improve charge blocking effects.

The upper electrode 112 is an electrode that collects electrons in a charge generated by the organic layer 110. In order to allow the incidence ray L to be incident on the organic layer 110, the upper electrode 112 is forming of a transparent electrode layer which is sufficiently transparent with respect to light having a wavelength to which the organic layer 110 has sensitivity or includes a transparent electrode layer. For example, conductive materials such as ITO are used for the transparent electrode layer.

When a bias voltage is applied to a space between the upper electrode 112 and the lower electrode 104, positive holes and electrons in a charge generated by the photoelectric conversion layer 108 can be respectively moved to the lower electrode 104 and the upper electrode 112.

The light transmittance of the transparent electrode film at a visible light wavelength is preferably 60% or greater, more preferably 80% or greater, still more preferably 90% or greater, and even still more preferably 95% or greater.

When the thickness of a conductive thin film is reduced to have a value smaller than a certain range, this typically leads to a sudden increase in resistance value. However, the sheet resistance of the transparent electrode layer is preferably in a range of 100Ω/□ to 10000Ω/□ and the degree of freedom in a range of the film thickness which can be reduced is large. Further, the quantity of light to be absorbed becomes small as the thickness of the transparent electrode layer is smaller. Accordingly, the light transmittance is usually increased. It is highly preferable that the light transmittance is increased because an increase in light transmittance leads to an increase in quantity of light to be absorbed by the photoelectric conversion layer 108 and leads to an increase in photoelectric conversion capability. In consideration of an increase in resistance value of a thin film accompanied by a reduction in film thickness and an increase in transmittance of light, the film thickness of the transparent electrode layer, that is, the upper electrode 112 is preferably in a range of 5 nm to 30 nm and more preferably in a range of 5 nm to 20 nm.

As a method of preparing the upper electrode 112, various methods are used depending on the material constituting the upper electrode, but a sputtering method is preferably used.

The sealing layer 114 is a layer for preventing factors that deteriorate an organic material, such as water or oxygen, from penetrating into the photoelectric conversion layer 108 containing an organic material. The sealing layer 114 covers the lower electrode 104, the charge blocking layer 106, the organic layer 110, and the upper electrode 112 and seals the space between the surface 102a of the substrate 102 and the sealing layer.

In the photoelectric conversion element 100 configured in the above-described manner, since the upper electrode 112 is set to be an electrode on the light incident side, when the incidence ray L is incident from the above of the upper electrode 112, the incidence ray L is transmitted through the upper electrode 112 and then is incident on the organic layer 110, and a charge is generated in the organic layer. Positive holes from the generated charge are moved to the lower electrode 104. Light can be converted into a voltage signal and then extracted by converting the positive holes moved to the lower electrode 104 into voltage signals in accordance with the amount of the positive holes and reading the voltage signals. Further, electrons or positive holes collected by the upper electrode 112 may be converted into voltage signals in accordance with the amount of the electrons or the positive holes and then extracted to the outside. In this case, a charge blocking layer or a positive hole blocking layer may be provided between the upper electrode 112 and the photoelectric conversion layer 108.

The sealing layer 114 is not limited to a single layer structure and may be a two-layer structure formed by laminating a first sealing layer 116 which blocks penetration of a factor which deteriorates a photoelectric conversion material, such as water molecules, as the sealing layer 114a illustrated in FIG. 1B and an auxiliary sealing layer 118 having functions which are unlikely to be achieved by the first sealing layer 116, for example, chemical resistance or a stress relaxation function, on the first sealing layer 116.

Next, a method of manufacturing the photoelectric conversion element 100 will be described.

First, an ITO film is formed on the surface 102a of the substrate 102 as the lower electrode 104 by forming an ITO film on the surface 102a of the substrate 102 under preset film formation conditions according to a sputtering method.

Subsequently, the charge blocking layer 106 is formed by forming a film of a charge blocking material on the surface 104a of the lower electrode 104 under preset film formation conditions in a vacuum at a preset pressure according to a vapor deposition method.

Next, a P-type organic semiconductor and an N-type organic semiconductor formed of fullerenes are formed on the charge blocking layer 106, as photoelectric conversion materials, under preset film formation conditions according to a vapor deposition method. The photoelectric conversion layer 108 which is configured of an amorphous film having a bulk hetero-structure of the P-type organic semiconductor and the N-type organic semiconductor formed of fullerenes and in which a difference between the ionization potential (IP) of the photoelectric conversion layer 108 having the bulk hetero-structure and the electron affinity of the N-type semiconductor is 1.30 eV or greater is formed.

Next, the upper electrode 112 is formed a film of by forming a transparent electrode material, such as ITO, on the photoelectric conversion layer 108 under preset film formation conditions according to a sputtering method.

Next, the sealing layer 114 is formed by forming a film of a sealing material, such as silicon oxide, on the upper electrode 112 and the substrate 102 under preset film formation conditions according to a sputtering method to form a SiON film.

In a case where the photoelectric conversion element 100 is used, the external electric field can be applied to the photoelectric conversion element 100 of the present embodiment. In this case, the lower electrode 104 and the upper electrode 112 are set to a pair of electrodes and the external electric field applied to a space between the pair of electrodes in order to obtain excellent characteristics of the photoelectric conversion efficiency, the dark current, and the optical response speed is preferably in a range of 1 V/cm to $1 \times 10^7$ V/cm, more preferably in a range of $1 \times 10^4$ V/cm to $1 \times 10^7$ V/cm, and particularly preferably in a range of $5 \times 10^4$ V/cm to $1 \times 10^6$ V/cm.

In the photoelectric conversion layer 108 of the photoelectric conversion element 100 according to the present embodiment, when the photoelectric conversion layer 108 which is configured of an amorphous film having a bulk hetero-structure of the P-type organic semiconductor and the N-type organic semiconductor formed of fullerenes is formed and a difference between the ionization potential (IP) of the photoelectric conversion layer 108 having the bulk hetero-structure and the electron affinity (Ea) of the N-type semiconductor is set to 1.30 eV or greater, the dark current value can be decreased. In this manner, a high-resolution image can be obtained.

Next, an imaging element for which the photoelectric conversion element 100 is used will be described.

Figure 2:
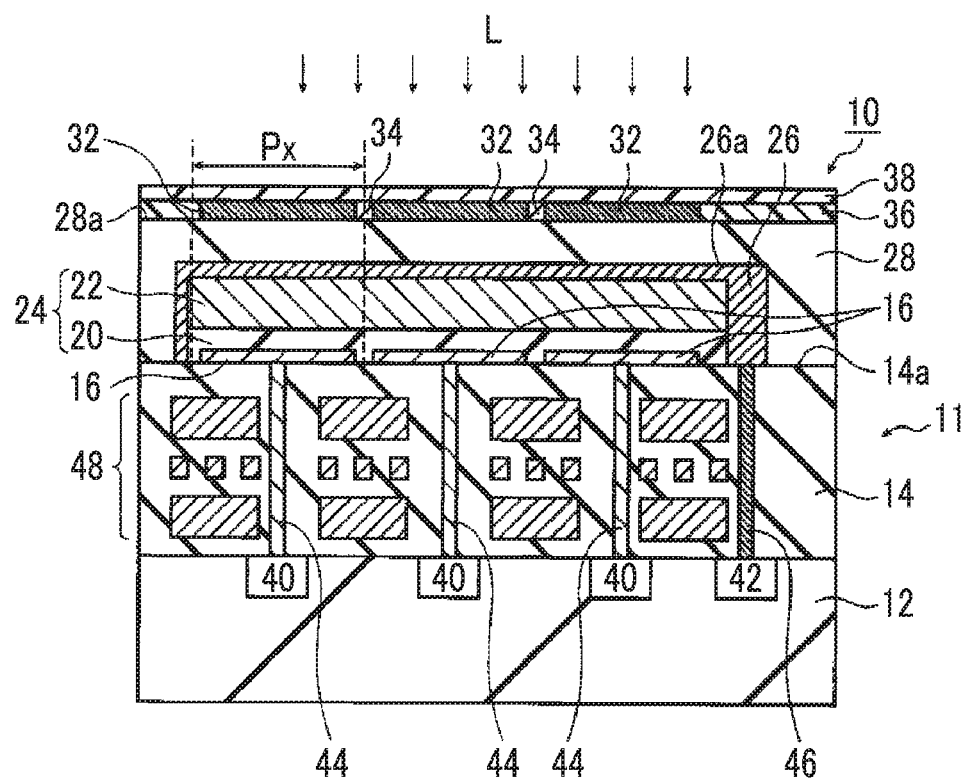
FIG. 2 is a cross-sectional view schematically illustrating an imaging element according to an embodiment of the present invention.

FIG. 2 is a cross-sectional view schematically illustrating an imaging element according to an embodiment of the present invention.

An imaging device such as a digital camera or a digital video camera can be used as the imaging element 10 according to the embodiment of the present invention. Further, the imaging element 10 may be used by being mounted on an imaging module such as an electronic endoscope or a mobile phone.

The imaging element 10 illustrated in FIG. 2 includes a substrate 12, an insulating layer 14, a pixel electrode 16 (lower electrode), a charge blocking layer 20, a photoelectric conversion layer 22, a counter electrode 26 (upper electrode), the sealing layer (protective film) 28, a color filter 32, a partition wall 34, a light shielding layer 36, and a protective layer 38. The charge blocking layer 20 and the photoelectric conversion layer 22 are collectively referred to as an organic layer 24.

A readout circuit 40 and a counter electrode voltage supply unit 42 are formed on the substrate 12.

Moreover, the pixel electrode 16 corresponds to the lower electrode 104 of the photoelectric conversion element 100 described above, the counter electrode 26 corresponds to the upper electrode 112 of the photoelectric conversion element 100 described above, the organic layer 24 corresponds to the organic layer 110 of the photoelectric conversion element 100 described above, and the sealing layer 28 corresponds to the sealing layer 114 of the photoelectric conversion element 100 described above. Moreover, the sealing layer 28 may have a two-layer structure similar to the sealing layer 114a illustrated in FIG. 1B. In this case, the sealing layer 28 is formed of a first sealing layer (not illustrated) and an auxiliary sealing layer (not illustrated).

As the substrate 12, for example, a glass substrate or a semiconductor substrate such as Si is used. The insulating layer 14 formed of a known insulating material is formed on the substrate 12. A plurality of pixel electrodes 16 are formed on the surface of the insulating layer 14. The pixel electrodes 16 are arranged one-dimensionally or two-dimensionally.

In addition, a first connection unit 44 that connects the pixel electrodes 16 to the readout circuit 40 is formed on the insulating layer 14. Further, a second connection unit 46 that connects the counter electrode 26 to the counter electrode voltage supply unit 42 is formed on the insulating layer 14. The second connection unit 46 is formed in a position which is not connected to the pixel electrodes 16 nor the organic layer 24. The first connection unit 44 and the second connection unit 46 are formed of conductive materials.

Further, a wiring layer 48 formed of a conductive material which is used to connect the readout circuit 40 and the counter electrode voltage supply unit 42 to the outside of the imaging element 10 is formed in the inside of the insulating layer 14.

As described above, a substrate in which each pixel electrode 16 being connected to each first connection unit 44 is formed on the surface 14a of the insulating layer 14 on the substrate 12 is referred to as a circuit substrate 11. Moreover, the circuit substrate 11 is also referred to as a CMOS substrate.

The charge blocking layer 20 is formed on the pixel electrodes 16 so as to cover the plurality of pixel electrodes 16 and to avoid the second connection unit 46, and the photoelectric conversion layer 22 is formed on the charge blocking layer 20.

The charge blocking layer 20 corresponds to the charge blocking layer 106 of the photoelectric conversion element 100 described above and suppresses injection of electrons to the photoelectric conversion layer 22 from the pixel electrodes 16.

The photoelectric conversion layer 22 corresponds to the photoelectric conversion layer 108 of the photoelectric conversion element 100 described above and thus the detailed description thereof will not be repeated. The photoelectric conversion layer 22 is configured of an amorphous film having a bulk hetero-structure of a P-type organic semiconductor and an N-type organic semiconductor formed of fullerenes or fullerene derivatives, and a difference between the ionization potential (IP) of the photoelectric conversion layer 108 having the bulk hetero-structure and the electron affinity (Ea) of the N-type semiconductor is set to 1.30 eV or greater.

Further, the film thicknesses of the charge blocking layer 20 and the photoelectric conversion layer 22 may not be constant as long as both of the charge blocking layer 20 and the photoelectric conversion layer 22 have a constant film thickness on the pixel electrodes 16. The photoelectric conversion layer 22 will be described in detail later.

The counter electrode 26 is an electrode facing the pixel electrodes 16 and provided to cover the organic layer 24, and the organic layer 24 is disposed between the pixel electrodes 16 and the counter electrode 26.

Since the counter electrode 26 allows light to be incident on the photoelectric conversion layer 22, the counter electrode 26 is configured of a transparent conductive layer which is sufficiently transparent with respect to the incidence ray L (visible light). As described above, the counter electrode 26 has the same configuration as the upper electrode 112 and the detailed description thereof will not be repeated.

The counter electrode 26 is electrically connected to the second connection unit 46 disposed on a side outer than the photoelectric conversion layer 22 and is connected to the counter electrode voltage supply unit 42 through the second connection unit 46.

Examples of the material of the counter electrode 26 (upper electrode 112) include metals, metal oxides, metal nitrides, metal borides, organic conductive compounds, and mixtures of these. Specific examples thereof include conductive metal oxides such as tin oxide ($SnO_2$), zinc oxide, indium oxide, indium tin oxide (ITO), indium zinc oxide (IZO), indium tungsten oxide (IWO), and titanium oxide; metal nitrides such as TiN; metals such as gold (Au), platinum (Pt), silver (Ag), chromium (Cr), nickel (Ni), and aluminum (Al); mixtures or laminates of these metals and conductive metal oxides; organic conductive compounds such as polyaniline, polythiophene, and polypyrrole; and laminates of these and ITO. As the material of the transparent conductive film, any one of ITO. IZO, tin oxide ($SnO_2$), antimony-doped tin oxide (ATO), fluorine-doped tin oxide (FTO), zinc oxide, antimony-doped zinc oxide (AZO), and gallium-doped zinc oxide (GZO) is particularly preferable. As the material of the counter electrode 26 (upper electrode 112), any one of ITO. IZO, tin oxide, antimony-doped tin oxide (ATO), fluorine-doped tin oxide (FTO), zinc oxide, antimony-doped zinc oxide (AZO), and gallium-doped zinc oxide (GZO) is particularly preferable.

The counter electrode voltage supply unit 42 applies a predetermined voltage to the counter electrode 26 through the second connection unit 46. In a case where the voltage to be applied to the counter electrode 26 is higher than the power supply voltage of the imaging element 10, the predetermined voltage is supplied by boosting the power supply voltage using a booster circuit such as a charge pump.

The pixel electrodes 16 are electrodes for collecting a charge generated by the photoelectric conversion layer 22 provided between the pixel electrodes 16 and the counter electrode 26 facing the pixel electrodes 16. The pixel electrodes 16 are connected to the readout circuits 40 through the first connection units 44. The readout circuits 40 are provided on the substrate 12 corresponding to each of the plurality of pixel electrodes 16 and read a signal in accordance with the charge collected by the corresponding pixel electrodes 16.

Examples of the material of the pixel electrodes 16 (lower electrode 104) include metals, metal oxides, metal nitrides, metal borides, organic conductive compounds, and mixtures of these. Specific examples thereof include conductive metal oxides such as tin oxide ($SnO_2$), zinc oxide, indium oxide, indium tin oxide (ITO), indium zinc oxide (IZO), indium tungsten oxide (IWO), and titanium oxide; metal nitrides such as titanium nitride (TiN); metals such as gold (Au), platinum (Pt), silver (Ag), chromium (Cr), nickel (Ni), and aluminum (Al); mixtures or laminates of these metals and conductive metal oxides; organic conductive compounds such as polyaniline, polythiophene, and polypyrrole; and laminates of these and ITO. As the material of the lower electrode 104, any one of ITO, IZO, tin oxide, antimony-doped tin oxide (ATO), fluorine-doped tin oxide (HO), zinc oxide, antimony-doped zinc oxide (AZO), and gallium-doped zinc oxide (GZO) is particularly preferable.

When a level difference corresponding to the film thickness of the pixel electrode 16 in an end portion of the pixel electrode 16 is steep, the surface of the pixel electrode 16 is significantly uneven, or fine particles are attached to the pixel electrode 16, the layer on the pixel electrode 16 becomes thinner than a desired film thickness or cracks are generated. If the counter electrode 26 (upper electrode 112) is formed on the layer in such a state, an increase in dark current or pixel failure such as short circuit occurs due to the contact between the pixel electrode 16 in a portion with defects and the counter electrode 26 or electric field concentration. Further, the above-described defects may lead to a degradation of adhesiveness of the pixel electrode 16 to the layer provided thereon or heat resistance of the photoelectric conversion element 100.

In order to prevent the above-described defects and improve reliability of the element, a surface roughness Ra (arithmetic average roughness) of the pixel electrode 16 is preferably 0.6 nm or less. The unevenness of the surface of the pixel electrode 16 is small and the surface flatness is excellent as the surface roughness Ra thereof becomes smaller. Moreover, in order to remove particles on the pixel electrode 16, it is particularly preferable that the pixel electrodes 16 and the like are cleaned according to a typical cleaning technique used for a process of manufacturing a semiconductor before the charge blocking layer 20 is formed.

The readout circuit 40 is configured of a CCD circuit, a CMOS circuit, or a thin film transistor (TFT) circuit and light is shielded by a light shielding layer (not illustrated) provided in the insulating layer 14. Further, it is preferable to employ a CCD circuit or a CMOS circuit for the readout circuit 40 when applied to typical image sensors and preferable to employ a CMOS circuit from the viewpoints of reducing noise and improving the speed.

Moreover, although not illustrated, for example, a high-concentration N region surrounded by a P region is formed on the substrate 12 and the first connection unit 44 is connected to the N region. The readout circuit 40 is provided on the P region. The N region functions as a charge accumulation unit that accumulates a charge generated in the photoelectric conversion layer 22. The charge accumulated on the N region is converted into a signal by the readout circuit 40 in accordance with the amount of the charge and output to the outside of the imaging element 10 through the wiring layer 48.

The sealing layer (protective film) 28 is to protect the photoelectric conversion layer 22 including organic matter from deterioration factors such as water molecules. The sealing layer 28 is formed so as to cover the counter electrode 26. The sealing layer 28 may be a sealing layer 114a having a two-layer structure illustrated in FIG. 1B.

The following conditions are required for the sealing layer 28 (sealing layer 114).

First, penetration of factors that deteriorate organic photoelectric conversion materials included in a solution or a plasma during each process of manufacturing an element is inhibited and the photoelectric conversion layer is protected.

Second, penetration of factors that deteriorate organic photoelectric conversion materials, such as water molecules, after an element is manufactured is inhibited and deterioration of the photoelectric conversion layer 22 is prevented during the storage or use for a long period of time.

Third, deterioration of the photoelectric conversion layer which has been already formed is prevented during the formation of the sealing layer 28.

Fourth, since an incidence ray reaches the photoelectric conversion layer 22 through the sealing layer 28, the sealing layer 28 needs to be transparent with respect to light having a wavelength which can be detected by the photoelectric conversion layer 22.

The sealing layer 28 (sealing layer 114) can be configured of a thin film formed of a single material, but effects such as stress relaxation of the entire sealing layer 28, suppression of cracking due to dust during the manufacturing process, suppression of defects such as pinholes, and ease of optimization of material development can be expected by forming the sealing layer to have a multilayer structure and providing functions different from each other for each layer. For example, the sealing layer 28 has a two-layer structure formed of a layer that serves for the original purpose of inhibiting penetration of deterioration factors such as water molecules and an auxiliary sealing layer, having a function which is unlikely to be achieved by the above-described layer, being laminated thereon. The sealing layer may have a configuration of three or more layers, but it is preferable that the number of layers is small when the manufacturing cost is considered.

The sealing layer 28 (sealing layer 114) can be formed in the following manner.

The performance of the photoelectric conversion materials significantly deteriorates due to the presence of deterioration factors such as water molecules. Therefore, the entire photoelectric conversion layer needs to be covered and sealed with diamond-like carbon (DLC) or ceramics such as a dense metal oxide film, metal nitride film, and a metal nitride oxide film which prevent penetration of water molecules. In the related art, aluminum oxide, silicon oxide, silicon nitride, silicon nitride oxide, or a laminated structure of these, or a laminated structure of these and an organic polymer is set as a sealing layer and is formed using various vacuum film forming techniques. In a sealing layer of the related art, since a thin film is unlikely to be grown (due to a shadow made by a level difference) in a level difference formed by a structure on the substrate surface, fine defects on the substrate surface, or particles attached to the substrate surface, the film thickness thereof becomes significantly thin compared to a flat portion. Accordingly, the level difference portion becomes a path for penetration of deterioration factors. In order to completely cover the level difference with the sealing layer 28, the entire sealing layer 28 needs to be thicker by forming the sealing layer on the flat portion such that the film thickness thereof is 1 µm or greater.

In the imaging element 10 having a pixel size of less than 2 µm and particularly approximately 1 µm, when the distance between the color filter 32 and the photoelectric conversion layer 22, that is, the film thickness of the sealing layer 28 is large, an incidence ray is diffracted or emitted in the sealing layer 28 and thus color mixture occurs. Therefore, in the imaging element 10 having a pixel size of approximately 1 µm, a sealing layer material and the manufacturing, method in which the element performance does not deteriorate even when the film thickness of the entire sealing, layer 28 is reduced are required.

An atomic layer deposition (ALD) method is a type of chemical vapor deposition (CVD) method and is a technique of alternately repeating adsorption of organic metal compound molecules, metal halide molecules, or metal hydride molecules forming thin film materials to the substrate surface, reaction therebetween, and decomposition of non-reacted groups included the above-described molecules to form a thin film. Since the thin film materials are in a low molecular state at the time of reaching the substrate surface, a thin film can be grown if there is a small space for low molecules to enter. Accordingly, a level difference portion which has not been completely covered by a thin film forming method of the related art is completely covered (the thickness of a thin film grown to a level difference portion is the same as the thickness of a thin film grown to a flat portion). In other words, level difference coverage is extremely excellent. Accordingly, since a level difference formed by a structure on the substrate surface, fine defects on the substrate surface, or particles attached to the substrate surface can be completely covered, the level difference portion does not become a path for penetration of deterioration factors of photoelectric conversion materials. In a case where the sealing layer 28 is formed using an atomic layer deposition (ALD) method, the required film thickness of the sealing layer can be made thinner more effectively than the technique of the related art.

In the case where the sealing layer 28 is formed using an atomic layer deposition method, a material corresponding to the above-described preferable sealing layer can be suitably selected. However, the selection is limited to materials in which a thin film can be grown at a relatively low temperature such that photoelectric conversion material does not deteriorate. According to an atomic layer deposition method using alkyl aluminum or aluminum halide as a material, a dense aluminum oxide thin film can be formed at a temperature of lower than 200° C. at which the photoelectric conversion material does not deteriorate. It is particularly preferable to use trimethyl aluminum because an aluminum oxide thin film can be formed at a temperature of approximately 100° C. Even in a case of silicon oxide or titanium oxide, a dense thin film can be formed as the sealing layer 28 at a temperature of lower than 200° C. similar to aluminum oxide by appropriately selecting the material.

From the viewpoint of sufficiently inhibiting penetration of factors that deteriorate photoelectric conversion materials, such as water molecules, the film thickness of the sealing layer 28 (sealing layer 114) is preferably 10 nm or greater. When the film thickness of the sealing layer is large, an incidence ray is diffracted or emitted in the sealing layer and thus color mixture occurs. Accordingly, the film thickness of the sealing layer is preferably 200 nm or less.

In the case where the sealing layer is formed using an atomic layer deposition method, the sealing layer is a thin film and an exceptionally excellent thin film can be formed at a low temperature from the viewpoints of level difference coverage and denseness. However, the thin film occasionally deteriorates due to chemicals used in a photolithographic process. For example, since an aluminum oxide thin film formed using an atomic layer deposition method is amorphous, the surface thereof is eroded by an alkali solution such as a developer or a peeling solution. In such a case, it is necessary for a thin film having excellent chemical resistance to be provided on an aluminum oxide thin film formed using an atomic layer deposition method. That is, an auxiliary sealing layer serving as a functional layer that protects the sealing layer becomes necessary. In this case, the sealing layer 114a having a two-layer structure similar to the sealing layer illustrated in FIG. 1B is obtained as described above.

In a case where the sealing layer 28 (sealing layer 114) has a two-layer structure, a configuration with an auxiliary sealing layer, which includes any one of aluminum oxide ($Al_2O_3$), silicon oxide ($SiO_2$), silicon nitride (SiN), and silicon oxide nitride (SiON), formed on the first sealing layer using a sputtering method is preferable. In addition, the film thickness of the sealing layer 28 (sealing layer 114) is preferably in a range of 0.05 μm to 0.2 μm. Further, it is preferable that the sealing layer 28 (sealing layer 114) includes any one of aluminum oxide, silicon oxide, and titanium oxide.

The color filters 32 are formed in a position facing each pixel electrode 16, on the surface 28a of the sealing layer 28. The partition walls 34 are provided between the color filters 32 on the surface 28a of the sealing layer 28 and used to improve light transmission efficiency of the color filters 32. The light shielding layer 36 is formed in a portion other than the region (effective pixel region) provided with the color filters 32 and the partition walls 34 on the surface 28a of the sealing layer 28 and used to prevent light from being incident on the photoelectric conversion layer 22 formed in a portion other than the effective pixel region. The color filters 32, the partition walls 34, and the light shielding layer 36 are formed to have approximately the same thickness and formed by performing a photolithographic process, a resin baking process, and the like.

The protective layer 38 is used to protect the color filters 32 from the subsequent process and formed so as to cover the color filters 32, the partition walls 34, and the light shielding layer 36. The protective layer 38 is also referred to as an overcoat layer.

In the imaging element 10, one pixel electrode 16 provided with the organic layer 24, the counter electrode 26, and the color filters 32 formed over the pixel electrode becomes a unit pixel Px.

The protective layer 38 can be formed by appropriately using high molecular weight materials such as an acrylic resin, a polysiloxane resin, a polystyrene resin, and a fluorine resin or inorganic materials such as silicon oxide and silicon nitride. It is preferable that photosensitive resins such as a polystyrene resin are used since the protective layer 38 can be patterned according to a photolithographic method and thus the protective layer 38 is used as a photoresist when a peripheral light shielding layer, a sealing layer, or an insulating layer on a bonding pad is open and the protective layer 38 itself is easily processed to a micro lens. Meanwhile, it is also preferable that films of various low refractive index materials used as partition walls of the color filters 32 are formed since the protective layer 38 can be also used as an antireflection layer. Moreover, for the purpose of acquiring a function as a protective layer and a function as an antireflection layer with respect to the subsequent process, the protective layer 38 can be formed to have a configuration of two or more layers obtained by combining the above-described materials.

Moreover, in the present embodiment, the pixel electrode 16 is configured by being formed on the surface 14a of the insulating layer 14, but the configuration is not limited thereto and the pixel electrode 16 may be configured by being buried in the surface 14a of the insulating layer 14. Further, a configuration in which one second connection unit 46 and one counter electrode voltage supply unit 42 are provided is employed, but a plurality of second connection units 46 and counter electrode voltage supply units 42 may be provided. For example, voltage drop in the counter electrode 26 can be suppressed by supplying a voltage to the counter electrode 26 from both end portions of the counter electrode 26. The number of sets of the second connection units 46 and the counter electrode voltage supply units 42 may be appropriately adjusted in consideration of a chip area of the element.

Figure 3A:
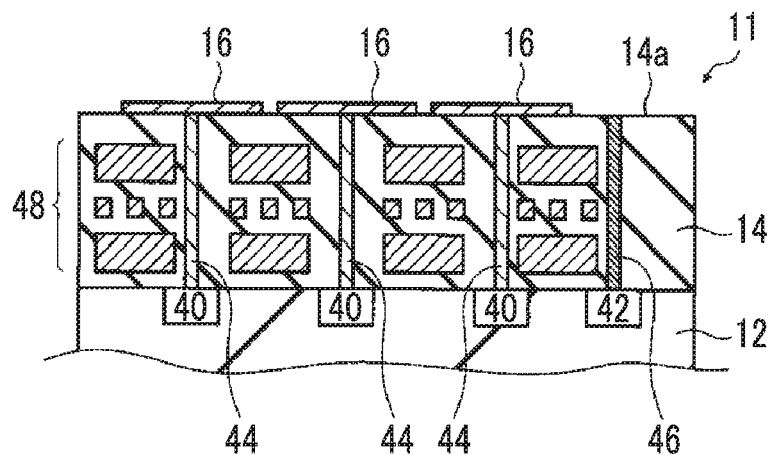
FIGS. 3A to 3C are cross-sectional views schematically illustrating a method of manufacturing the imaging element according to an embodiment of the present invention in order of processes.
Figure 3B:
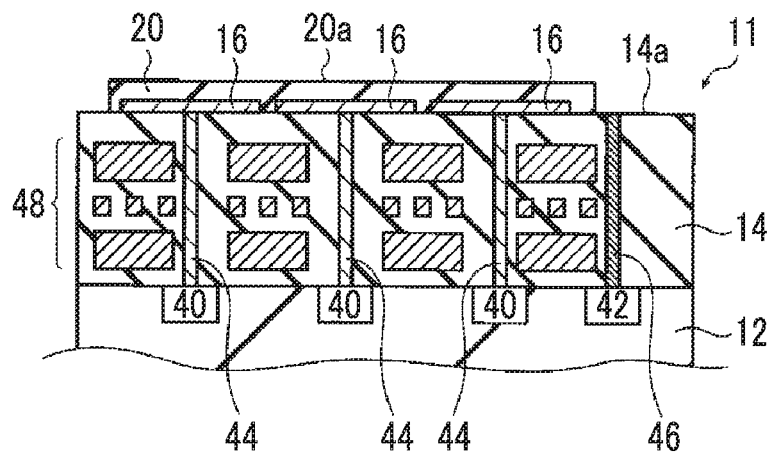
Figure 3C:
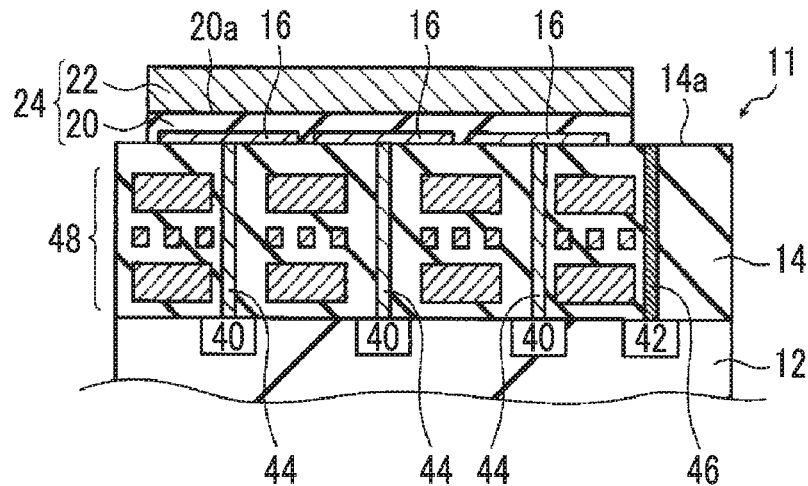
Figure 4A:
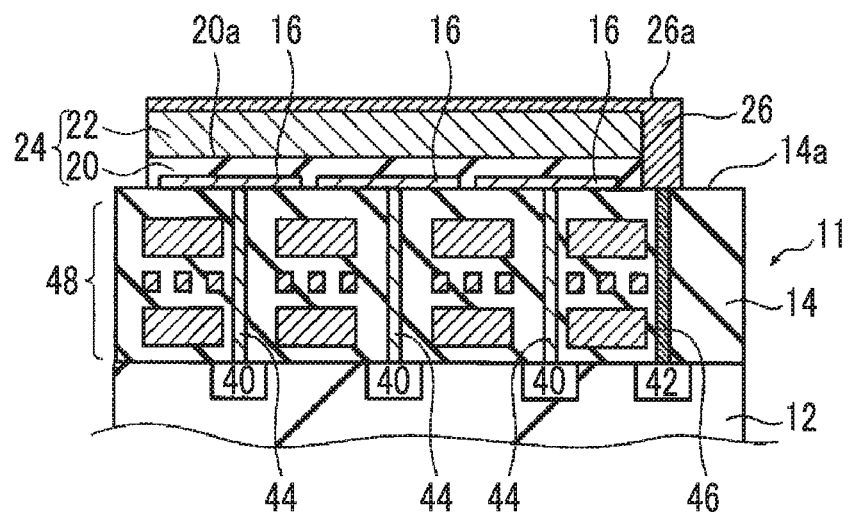
FIGS. 4A and 4B are cross-sectional views schematically illustrating the method of manufacturing the imaging element according to the embodiment of the present invention in order of processes and illustrate processes subsequent to the process of FIG. 3C.
Figure 4B:
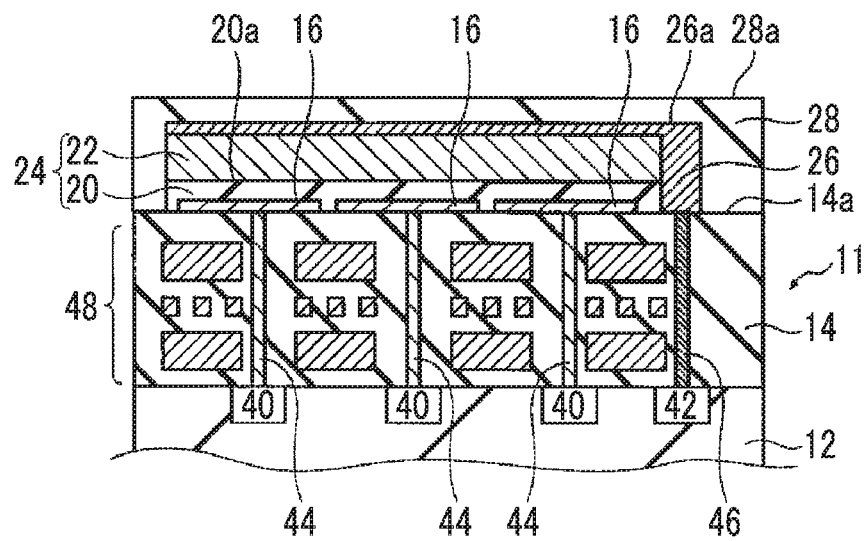

Next, a method of producing the imaging element 10 according to the embodiment of the present invention will be described. FIGS. 3A to 3C are cross-sectional views schematically illustrating a method of manufacturing the imaging element according to an embodiment of the present invention in order of processes. FIGS. 4A and 4B are cross-sectional views schematically illustrating the method of manufacturing the imaging element according to the embodiment of the present invention in order of processes and illustrate processes subsequent to the process of FIG. 3C.

In the method of manufacturing the imaging element 10 according to the embodiment of the present invention, first, a circuit substrate 11 (CMOS substrate) in which the first connection units 44, the second connection unit 46, and the insulating layer 14 for which the wiring layer 48 is provided are formed on the substrate 12 on which the readout circuits 40 and the counter electrode voltage supply unit 42 are formed and the pixel electrodes 16 connected to each of the first connection units 44 are formed on the surface 14a of the insulating layer 14, as illustrated in FIG. 3A, is prepared. In this case, as described above, the first connection units 44 and the readout circuits 40 are connected to each other and the second connection unit 46 and the counter electrode voltage supply unit 42 are connected with each other. The pixel electrodes 16 are formed of, for example, ITO or TiN.

Next, the charge blocking layer 20 is formed by conveying a charge blocking material through a predetermined conveyance path in a film forming chamber (not illustrated) of the charge blocking layer 20, covering all of the pixel electrodes 16 except the second connection unit 46 as illustrated in FIG. 3B, forming a film of the charge blocking material on the surface 14a of the insulating layer 14 under preset film formation conditions in a vacuum at a predetermined pressure according to a vapor deposition method. The charge blocking material will be described in detail below.

Next, a P-type organic semiconductor and an N-type organic semiconductor formed of fullerenes are conveyed through a predetermined conveyance path in a film forming chamber (not illustrated) of the photoelectric conversion layer 22 and formed on the surface 20a of the charge blocking layer 20, as illustrated in FIG. 3C, under preset film formation conditions according to a vapor deposition method. Further, the photoelectric conversion layer 22 which is configured of an amorphous film having a bulk hetero-structure of the P-type organic semiconductor and the N-type organic semiconductor formed of fullerenes and in which a difference between the ionization potential (IP) of the photoelectric conversion layer 108 having the bulk hetero-structure and the electron affinity (Ea) of the N-type semiconductor is set to 1.30 eV or greater is formed. In this manner, the photoelectric conversion layer 22 is formed and then the organic layer 24 is formed.

The charge blocking layer 20 and the photoelectric conversion layer 22 can be formed in the same film forming chamber or separate film forming chambers.

Next, after a counter electrode material is conveyed through a predetermined conveyance path in a film forming chamber (not illustrated) of the counter electrode 26, the counter electrode 26 is formed in a pattern on the second connection unit 46 such that the photoelectric conversion layer 22 is covered, as illustrated in FIG. 4A, under preset film formation conditions according to a sputtering method. For example, ITO is used as the counter electrode material.

Next, silicon oxide is conveyed through a predetermined conveyance path in a film forming chamber (not illustrated) of the sealing layer 28 and the sealing layer 28 is formed on the surface 14a of the insulating layer 14 such that the entire surface 26a of the counter electrode 26 is covered as illustrated in FIG. 4B under preset film forming conditions according to a sputtering method.

Next, the color filter 32, the partition wall 34, and the light shielding layer 36 are formed on the surface 28a of the sealing layer 28 using, for example, a photolithographic method. As the color filter 32, the partition wall 34, and the light shielding layer 36, known members used for an organic solid-state imaging element may be used. The process of forming the color filter 32, the partition wall 34, and the light shielding layer 36 may be carried out in vacuum or non-vacuum.

Subsequently, the protective layer 38 is formed using, for example, a coating method such that the color filter 32, the partition wall 34, and the light shielding layer 36 are covered. In this manner, the imaging element 10 illustrated in FIG. 2 can be formed. As the protective layer 38, a known member used for an organic solid-state imaging element may be used.

In a case of using the imaging element 10, the external electric field can be applied to the imaging element 10. In this case, the pixel electrode 16 and the counter electrode 26 are set to a pair of electrodes and the external electric field applied to a space between the pair of electrodes in order to obtain excellent characteristics of the photoelectric conversion efficiency, the dark current, and the optical response speed is preferably in a range of 1 V/cm to $1 \times 10^7$ V/cm, more preferably in a range of $1 \times 10^4$ V/cm to $1 \times 10^7$ V/cm, and particularly preferably in a range of $5 \times 10^4$ V/cm to $1 \times 10^6$ V/cm.

Even in the imaging element 10, when the photoelectric conversion layer 22 is configured of an amorphous film having a bulk hetero-structure of the P-type organic semiconductor and the N-type organic semiconductor formed of fullerenes and a difference between the ionization potential (IP) of the photoelectric conversion layer 108 having the bulk hetero-structure and the electron affinity (Ea) of the N-type semiconductor is set to 1.30 eV or greater, the dark current value can be decreased and a high-resolution image can be obtained in the imaging element 10.

Hereinafter, the organic layer 24 of the above-described imaging element 10 and the organic layer 110 of the photoelectric conversion element 100 will be described. Further, the charge blocking layer 20 and the photoelectric conversion layer 22 of the imaging element 10 described above respectively correspond to the charge blocking layer 106 and the photoelectric conversion layer 108 of the photoelectric conversion element 100.

The photoelectric conversion layer 22 (photoelectric conversion layer 108 of the photoelectric conversion element 100) of the imaging element 10 includes a P-type organic semiconductor and an N-type organic semiconductor formed of fullerenes and is configured of an amorphous film having a bulk hetero-structure of the P-type organic semiconductor and the N-type organic semiconductor formed of fullerenes. A difference between the ionization potential (IP) of the photoelectric conversion layer 108 having the bulk hetero-structure and the electron affinity (Ea) of the N-type semiconductor is set to 1.30 eV or greater.

The exciton dissociation efficiency can be increased by performing bulk heterobonding of the P-type organic semiconductor to the N-type organic semiconductor to form a donor-acceptor interface. Consequently, the photoelectric conversion layer with the configuration in which the P-type organic semiconductor and the N-type organic semiconductor are bonded to each other exhibits high photoelectric conversion efficiency. Particularly, the bonded interface of the photoelectric conversion layer in which the P-type organic semiconductor and the N-type organic semiconductor are mixed with each other is increased and thus the photoelectric conversion efficiency is improved, which is preferable.

When the photoelectric conversion layer 22 (photoelectric conversion layer 108) has a bulk heterobonding structure, a disadvantage that the carrier diffusion length of the photoelectric conversion layer 22 is short can be compensated and the photoelectric conversion efficiency of the photoelectric conversion layer 22 can be improved. Further, the bulk heterobonding structure is described in JP2005-303266A in detail.

The photoelectric conversion layer 22 is formed of an amorphous film having a bulk hetero-structure. When the photoelectric conversion layer 22 is formed of an amorphous film, the movement of electrons can be more suppressed and the dark current can be more reduced compared to a crystal structure.

The amorphous film is selected based on the surface roughness (Ra) thereof by measuring the photoelectric conversion layer 22 using an atomic force microscope (AFM). A film having a surface roughness (Ra) of 0.3 nm or less is set as an amorphous film. Further, a film having a surface roughness (Ra) of greater than 0.3 nm is set as a microcrystalline film.

In the photoelectric conversion layer 22 (photoelectric conversion layer 108) of the present embodiment, a difference between the ionization potential (IP) of the photoelectric conversion layer 108 having the bulk hetero-structure and the electron affinity (Ea) of the N-type semiconductor is set to 1.30 eV or greater.

It is assumed that carriers generated by light irradiation are thermally excited by the electron affinity of the N-type semiconductor from the ionization potential of the bulk hetero-structure. However, it is assumed that the thermally excited carriers do not reach and the dark current is decreased when a difference between the ionization potential (IP) and the electron affinity (Ea) of the N-type semiconductor is 1.30 eV or greater.

In a photoelectric conversion layer of the related art, it is assumed that microscopic crystallinity between dyes is increased, a trap level is generated due to microscopic grain boundaries, and thus a low dark current cannot be realized because the interaction between the photoelectric conversion layer and the N-type semiconductor is small. In the photoelectric conversion layer of the present invention, it is assumed that a small dark current can be realized because the interaction between the photoelectric conversion layer and the N-type semiconductor is strong and crystallinity between dyes is suppressed.

The thickness of the photoelectric conversion layer 22 is preferably in a range of 10 nm to 1000 nm, more preferably in a range of 50 nm to 800 nm, and particularly preferably in a range of 100 nm to 500 nm. When the thickness of the photoelectric conversion layer 22 is set to 10 nm or greater, suitable effects of suppressing the dark current can be obtained. When the thickness of the photoelectric conversion layer 22 is set to 1000 nm or less, suitable photoelectric conversion effects can be obtained.

Hereinafter, photoelectric conversion materials constituting the photoelectric conversion layer 22 (photoelectric conversion layer 108) will be described.

(Photoelectric Conversion Layer)

The photoelectric conversion layer 22 (photoelectric conversion layer 108) contains a P-type organic semiconductor and an N-type organic semiconductor formed of fullerenes.

The photoelectric conversion layer 22 (photoelectric conversion layer 108) includes at least one selected from the group consisting of a compound represented by the following Formula (1), a compound represented by the following Formula (2), and a compound represented by the following Formula (3) as the P-type organic semiconductor. Excellent photoelectric conversion efficiency and responsiveness can be obtained by using these compounds for the photoelectric conversion layer 22.

First, the compounds represented by Formulae (1) to (3) used for the photoelectric conversion layer 22 will be described in detail.

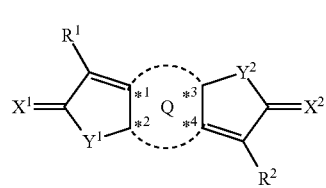

Formula (1)

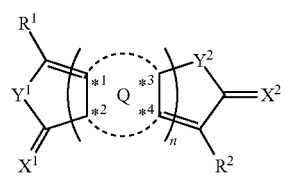

Formula (2)

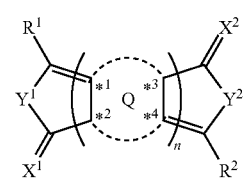

Formula (3)

In Formulae (1) to (3), $R^1$ and $R^2$ each independently represent a substituent. As the substituent, the following substituents W may be exemplified and examples thereof include an alkyl group which may have a substituent, an amino group which may have a substituent (such as a diarylamino group), an aryl group which may have a substituent (such as an aryl group having an alkoxy group, a group represented by the following Formula (14), a group represented by the following Formula (18), or a group represented by the following Formula (15)), and a heteroaryl group which may have a substituent. Among these, from the viewpoint that the characteristic (photoelectric conversion efficiency or responsiveness) of the photoelectric conversion element is more excellent (hereinafter, also simply referred to as "from the viewpoint of more excellent effects of the present invention"), an aryl group which may have a substituent or a heteroaryl group which may have a substituent is preferable.

The number of carbon atoms in the alkyl group is not particularly limited, but is preferably in a range of 1 to 10, more preferably in a range of 1 to 6, and still more preferably in a range of 1 to 3, from the viewpoint that the characteristic (photoelectric conversion efficiency or responsiveness) of the photoelectric conversion element is more excellent. The alkyl group may be linear, branched, or cyclic.

Preferred examples of the alkyl group include a methyl group, an ethyl group, an n-propyl group, an n-butyl group, and an n-hexyl group. Further, the alkyl group may include the following substituents W.

The amino group may be an unsubstituted amino group or an amino group having a substituent, but an amino group having a substituent (substituted amino group) is preferable and a diarylamino group is particularly preferable, from the viewpoint that the characteristic (photoelectric conversion efficiency or responsiveness) of the photoelectric conversion element is more excellent.

The aryl group included in a diarylamino group has the same definition as that for an aryl group described below.

The number of carbon atoms in the aryl group is not particularly limited, but is preferably in a range of 6 to 30 and more preferably in a range of 6 to 18, from the viewpoint that the characteristic (photoelectric conversion efficiency or responsiveness) of the photoelectric conversion element is more excellent. The aryl group may have a single ring structure or a fused ring structure formed by two or more rings being fused and may have substituents W.

Examples of the aryl group include a phenyl group, a naphthyl group, an anthryl group, a pyrenyl group, a phenanthrenyl group, a biphenyl group, and a fluorenyl group. Among these, a phenyl group, a naphthyl group, or an anthryl group is preferable.

The number of carbon atoms in the heteroaryl group (monovalent aromatic heterocyclic group) is not particularly limited, but is preferably in a range of 3 to 30 and more preferably in a range of 3 to 18, from the viewpoint that the characteristic (photoelectric conversion efficiency or responsiveness) of the photoelectric conversion element is more excellent. The heteroaryl group may include the following substituents W.

The heteroacyl group contains hetero atoms other than carbon atoms and hydrogen atoms, and examples of the hetero atoms include a nitrogen atom, a sulfur atom, an oxygen atom, a selenium atom, a tellurium atom, a phosphorus atom, a silicon atom, and a boron atom. Among these, a nitrogen atom, a sulfur atom, or an oxygen atom is preferable. The number of hetero atoms contained in the heteroaryl group is not particularly limited, but is typically in a range of 1 to 10 and preferably in a range of 1 to 4.

The number of ring members of the heteroaryl group is not particularly limited, but is preferably in a range of 3 to 8, more preferably in a range of 5 to 7, and particularly preferably 5 or 6.

Examples of the heteroaryl group include a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzoisoxazolyl group, an isothiazolyl group, a benzoisothiazolyl group, an oxadiazolyl group, a thiadiazolyl group, a triazolyl group, a tetrazolyl group, a furyl group, a benzofuryl group, a thienyl group, a benzothienyl group, a thienothienyl group, a dibenzofuryl group, a dibenzothienyl group, a pyrrolyl group, an indolyl group, an imidazopyridinyl group, and a carbazolyl group.

Further, $R^1$ and $R^2$ may represent different groups, but it is preferable that $R^1$ and $R^2$ represent the same substituent (the same type of substituent) from the viewpoint that the characteristic (photoelectric conversion efficiency or responsiveness) of the photoelectric conversion element is more excellent.

As preferred embodiments of $R^1$ and $R^2$, groups represented by Formula (14) may be exemplified. It is preferable that at least one of $R^1$ or $R^2$ represents a group represented by Formula (14).

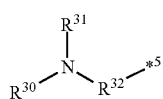

Formula (14)

In Formula (14), $R^{30}$ and $R^{31}$ each independently represent an alkyl group, an aryl group which may have a substituent, or a heteroaryl group which may have a substituent. The definitions of the alkyl group, the aryl group, and the heteroaryl group are as described above.

$R^{32}$ represents an arylene group which may have a substituent or a heteroaryl group which may have a substituent. Further, *5 represents a binding position.

The number of carbon atoms in the arylene group is not particularly limited, but is preferably in a range of 6 to 30 and more preferably in a range of 6 to 20 from the viewpoint that the characteristic (photoelectric conversion efficiency or responsiveness) of the photoelectric conversion element is more excellent.

Examples of the arylene group include a phenylene group, a biphenylene group, a terphenylene group, a naphthylene group, an anthrylene group, a phenanthrylene group, a pyrenediyl group, a perylenediyl group, a fluorenediyl group, a chrysenediyl group, a triphenylenediyl group, a benzoanthracenediyl group, and a benzophenanthrenediyl group.

The number of carbon atoms in the heteroarylene group is not particularly limited, but is preferably in a range of 1 to 20 and more preferably in a range of 2 to 12 from the viewpoint that the characteristic (photoelectric conversion efficiency or responsiveness) of the photoelectric conversion element is more excellent.

Examples of the heteroarylene group include a pyridylene group, a quinolylene group, an isoquinolylene group, an acridinediyl group, a phenanthridinediyl group, a pyrazinediyl group, a quinoxalinediyl group, a pyrimidinediyl group, a triazinediyl group, an imidazolediyl group, a pyrazolediyl group, an oxadiazolediyl group, a triazolediyl group, a furylene group, a thienylene group, a benzothienylene group, a thienothienylene group, a pyrrolediyl group, an indolediyl group, and a carbazolediyl group.

$R^{30}$ to $R^{32}$ may be bonded to each other to form a ring.

In addition, at the time of bonding, it is preferable that $R^{30}$ and $R^{31}$, $R^{30}$ and $R^{32}$, and $R^{31}$ and $R^{32}$ are respectively bonded to each other directly or through a linking group to form a ring and more preferable that $R^{30}$ and $R^{31}$, $R^{30}$ and $R^{32}$, and $R^{31}$ and $R^{32}$ are respectively bonded to each other through a linking group to form a ring from the viewpoint that the characteristic (photoelectric conversion efficiency or responsiveness) of the photoelectric conversion element is more excellent.

In addition, the structure of the linking group is not particularly limited, and examples thereof include an oxygen atom, a sulfur atom, an alkylene group, a silylene group, an alkenylene group, a cycloalkylene group, a cycloalkenylene group, an arylene group, a divalent heterocyclic group, an imino group, and a group formed by combining these and these may further have a substituent. Among these, an alkylene group, a silylene group, an alkenylene group, a cycloalkylene group, a cycloalkenylene group, or an arylene group is preferable and an alkylene group is more preferable.

As further preferred embodiments of $R^1$ and $R^2$ (preferred embodiments of groups represented by Formula (14)), groups represented by Formula (18) may be exemplified. It is preferable that at least one of IV or $R^2$ represents a group represented by Formula (18).

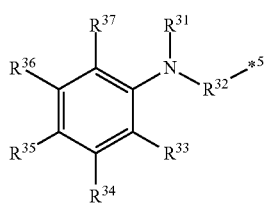

Formula (18)

In Formula (18), $R^{31}$ represents an alkyl group, an aryl group which may have a substituent, or a heteroaryl group which may have a substituent. The definition of $R^{31}$ is as described above.

$R^{32}$ represents an arylene group which may have a substituent or a heteroarylene group which may have a substituent. The definition of $R^{32}$ is as described above.

$R^{33}$ to $R^{37}$ each independently represent a hydrogen atom or a substituent. The definitions and preferred embodiments of the substituent are the same as the definitions and preferred embodiments of the substituents represented by $R^1$ and $R^2$ described above. Further, *5 represents a binding position.

In addition, $R^{33}$ and $R^{32}$, $R^{37}$ and $R^{31}$, and $R^{31}$ and $R^{32}$ may be bonded to each other to form a ring. It is preferable that $R^{37}$ and $R^{31}$, $R^{32}$ and $R^{33}$, and $R^{32}$ and $R^{31}$ are respectively bonded to each other directly or through a linking group to form a ring and more preferable that $R^{37}$ and $R^{31}$, $R^{32}$ and $R^{33}$, and $R^{32}$ and $R^{31}$ are respectively bonded to each other through a linking group to form a ring from the viewpoint that the characteristic (photoelectric conversion efficiency or responsiveness) of the photoelectric conversion element is more excellent. The definition of the linking group is as described above.

As further preferred embodiments of $R^1$ and $R^2$ (preferred embodiments of groups represented by Formula (14)), groups represented by Formula (15) may be exemplified. It is preferable that at least one of $R^1$ or $R^2$ represents a group represented by Formula (15).

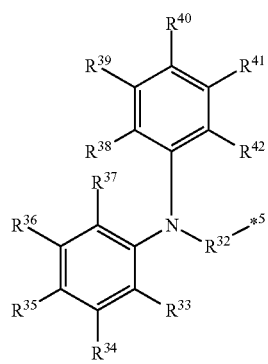

Formula (15)

In Formula (15), $R^{33}$ to $R^{42}$ each independently represent a hydrogen atom or a substituent. The definitions and preferred embodiments of the substituent are the same as the definitions and preferred embodiments of the substituents represented by $R^1$ and $R^2$ described above.

$R^{32}$ represents an arylene group which may have a substituent or a heteroarylene group which may have a substituent. The definition of $R^{32}$ is as described above.

Further, *5 represents a binding position.

In addition, $R^{37}$ and $R^{38}$, $R^{32}$ and $R^{33}$, and $R^{32}$ and $R^{42}$ may be bonded to each other to form a ring. At the time of bonding, it is preferable that $R^{37}$ and $R^{38}$, $R^{32}$ and $R^{33}$, and $R^{32}$ and $R^{42}$ are respectively bonded to each other directly or through a linking group to form a ring and more preferable that $R^{37}$ and $R^{38}$, $R^{32}$ and $R^{33}$, and $R^{32}$ and $R^{42}$ are respectively bonded to each other through a linking group to form a ring from the viewpoint that the characteristic (photoelectric conversion efficiency or responsiveness) of the photoelectric conversion layer is more excellent. The definition of the linking group is as described above.

In Formulae (1) to (3), $X^1$ and $X^2$ each independently represent an oxygen atom, a sulfur atom, $=CR^{1a}R^{1b}$, or $=NR^{1c}$.

$Y^1$ and $Y^2$ each independently represent an oxygen atom, a sulfur atom, $>CR^{1d}R^{1e}$, or $>SiR^{1f}R^{1g}$.

$R^{1a}$ to $R^{1g}$ each independently represent a hydrogen atom or a substituent. Examples of the substituent include the substituents W described below, such as an alkyl group.

$X^1$, $X^2$, $Y^1$, and $Y^2$ of Formulae (1) to (3) may be in any combination, but $X^1=X^2$ and $Y^1=Y^2$ are preferable and it is more preferable that all of $X^1$, $X^2$, $Y^1$, and $Y^2$ represent an oxygen atom, from the viewpoint of more excellent effects of the present invention.

Among the examples, from the viewpoint of more excellent effects of the present invention, a compound represented by Formula (12) and a compound represented by Formula (13) are preferable. Further, the definitions of respective groups in Formulae (12) and (13) are as described above.

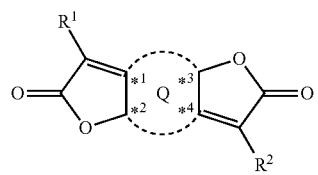

Formula (12)

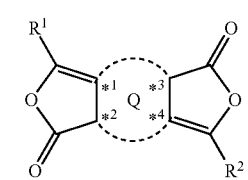

Formula (13)

Q represents any one selected from the group consisting of groups represented by Formulae (4) to (8).

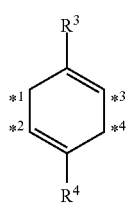

Formula (4)

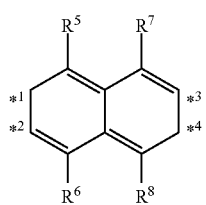

Formula (5)

Formula (6)

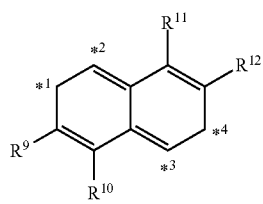

Formula (7)

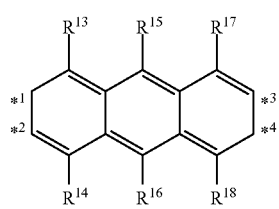

Formula (8)

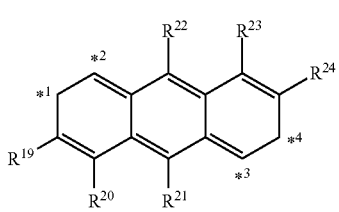

In Formulae (4) to (8), $R^3$ to $R^{24}$ each independently represent a hydrogen atom or a substituent. As the substituent, the following substituents W may be exemplified and examples thereof include an alkyl group, an alkoxy group, and a halogen atom. Among these, from the viewpoint that the characteristic (photoelectric conversion efficiency or responsiveness) of the photoelectric conversion element is more excellent, it is preferable that $R^3$ to $R^{24}$ represent a hydrogen atom.

In addition, the carbon atoms represented by *1 to *4 in Formulae (4) to (8) respectively correspond to carbon atoms represented by *1 to *4 in Formulae (1) to (3). More specifically, groups represented by the following Formulae (4) to (8) represent structural formulae in a case of being introduced to Q in Formulae (1) to (3).

Formula (4A)

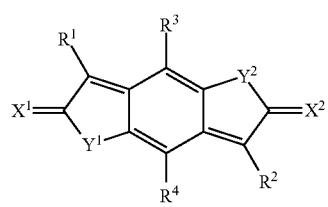

Formula (4B)

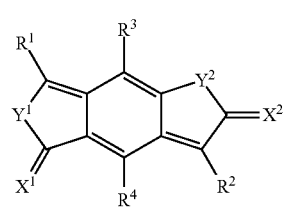

Formula (4C)

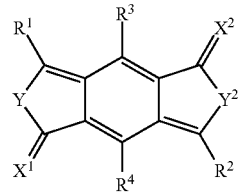

Formula (5A)

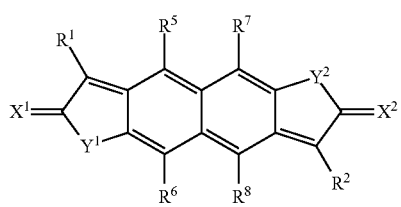

Formula (5B)

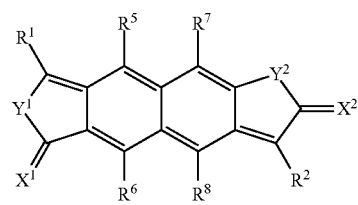

Formula (5C)

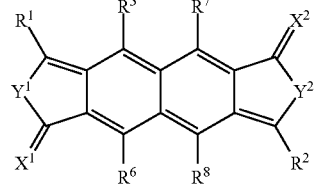

Formula (6A)

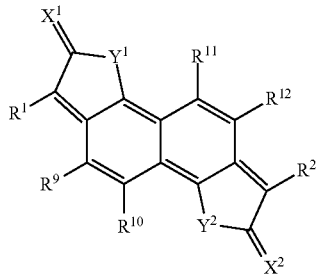

Formula (6B)

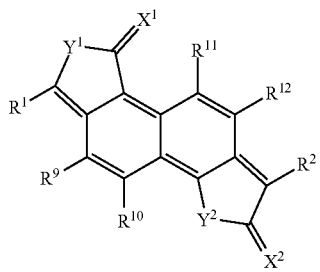

Formula (6C)

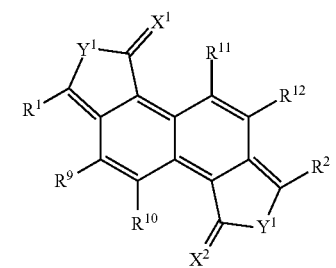

Formula (7A)

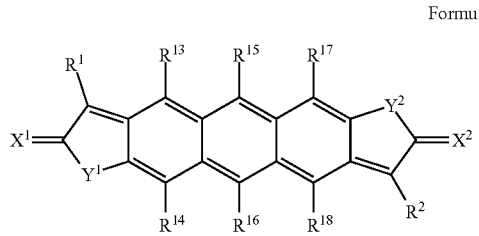

Formula (7B)

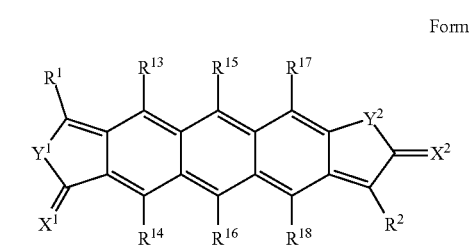

Formula (7C)

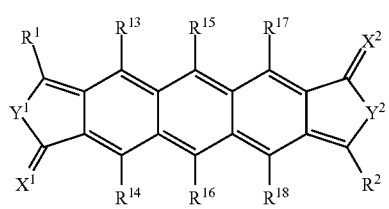

Formula (8A)

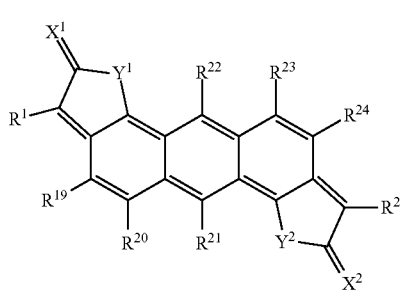

Formula (8B)

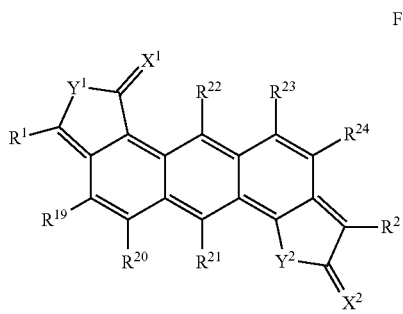

Formula (8C)

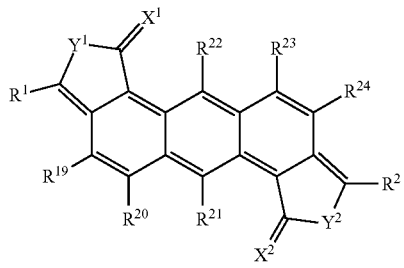

n represent 0 or 1. Among these, from the viewpoint that the characteristic (photoelectric conversion efficiency or responsiveness) of the photoelectric conversion element is more excellent, it is preferable that n represents 0.

In a case where n represents 1, the compounds represented by the above-described Formulae (4A) to (8C) may be exemplified.

Further, in a case where n represents 0, the carbon atom represented by *1 and the carbon atom represented by *3 are the same as each other and the carbon atom represented by *2 and the carbon atom represented by *4 are the same as each other. That is, in a case where n represent 0 in Formulae (1) to (3), the compounds represented by the following Formulae (9) to (11) may be exemplified.

Further, the definitions of respective groups in Formulae (9) to (11) are as described above.

Formula (9)

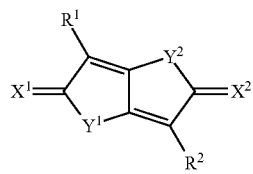

Formula (10)

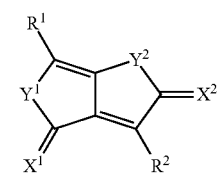

Formula (11)

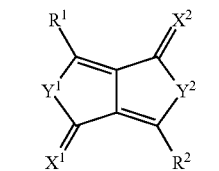

Among these, from the viewpoint of more excellent effects of the present invention, a compound represented by Formula (16) and a compound represented by Formula (17) are more preferable.

Formula (16)

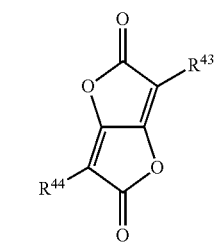

In Formula (16), $R^{43}$ and $R^{44}$ each independently represent an aryl group which may have a substituent or a heteroaryl group which may have a substituent and at least one of $R^{43}$ or $R^{44}$ represents a group represented by the above-described Formula (14).

The definitions of the aryl group and the heteroaryl group are as described above.

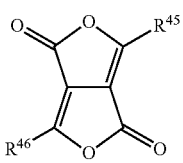

Formula (17)

In Formula (17), $R^{45}$ and $R^{46}$ each independently represent an aryl group which may have a substituent or a heteroaryl group which may have a substituent and at least one of $R^{45}$ or $R^{46}$ represents a group represented by the above-described Formula (14).

The definitions of the aryl group and the heteroaryl group are as described above.

The substituents W in the present specification will be described.

Examples of the substituents W include a halogen atom, an alkyl group (such as a cycloalkyl group, a bicycloalkyl group, or a tricycloalkyl group), an alkenyl group (such as a cycloalkenyl group or a bicycloalkenyl group), an alkynyl group, an aryl group, a heterocyclic group (also referred to as a hetero group), a cyano group, a hydroxyl group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (such as an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or an arylsulfinyl group, an alkyl- or arylsulfonyl group, an acyl group, an aryloxycarbonyl group, an alkoxycarbonyl group, a carbamoyl group, an aryl- or heterocyclic azo group, an imide group, a phosphino group, a phosphinyl group, a phosphinyloxy group, a phosphinylamino group, a phosphono group, a silyl group, a hydrazino group, an ureido group, a boronic acid group (—B(OH)$_2$), a phosphato group (—OPO(OH)$_2$), a sulfato group (—OSO$_3$H), and other known substituents.

Further, the details of the substituents W are described in the paragraph [0023] of JP2007-234651A.

Hereinafter, compounds represented by Formulae (1) to (3) will be exemplified. Further, the compounds represented by Formulae (1) to (3) may be used alone or in combination of two or more kinds thereof

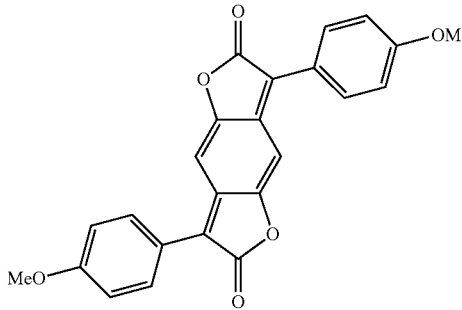

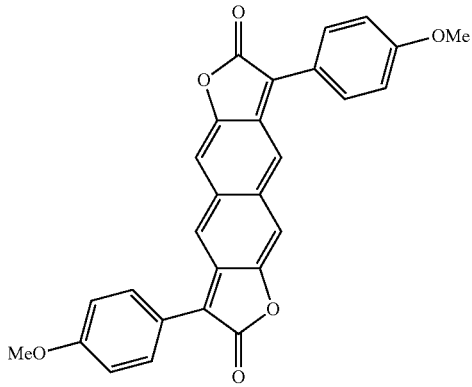

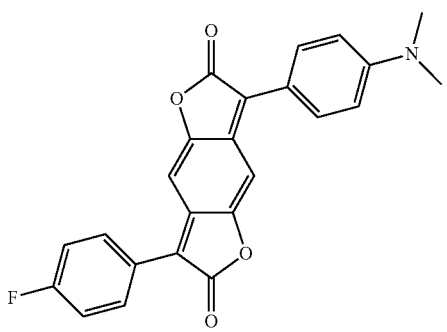

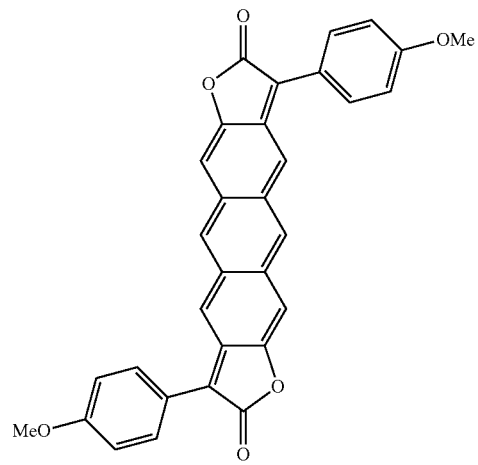

-continued
27
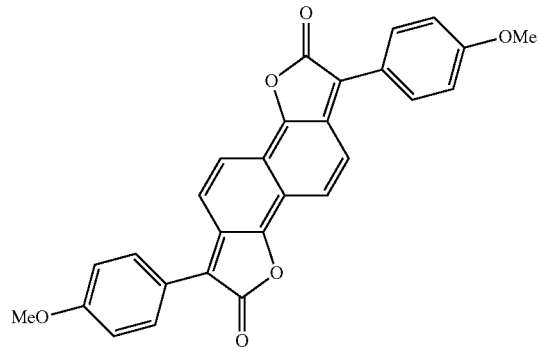
28
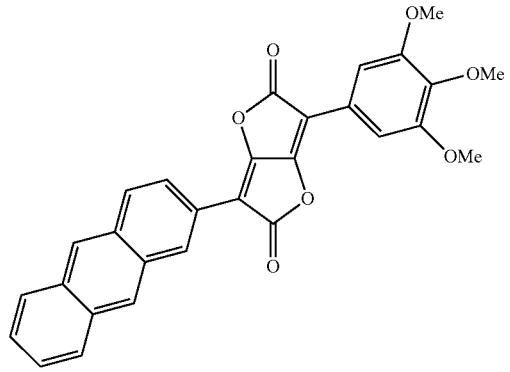
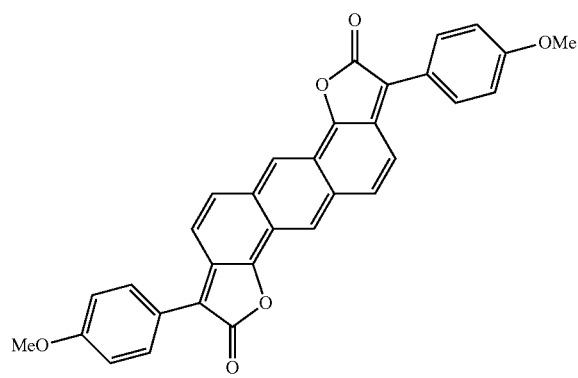
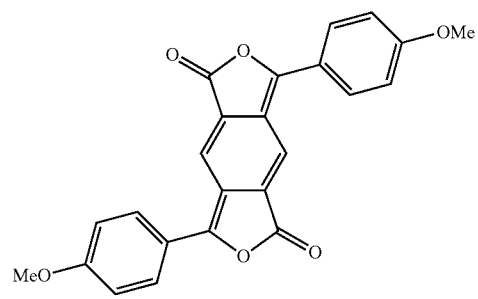
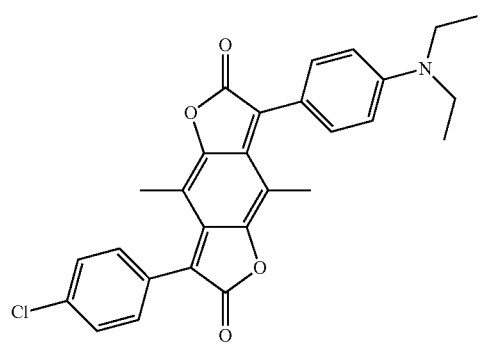
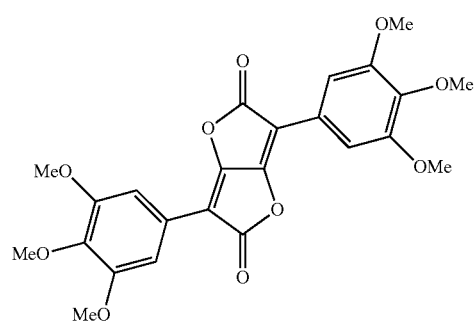
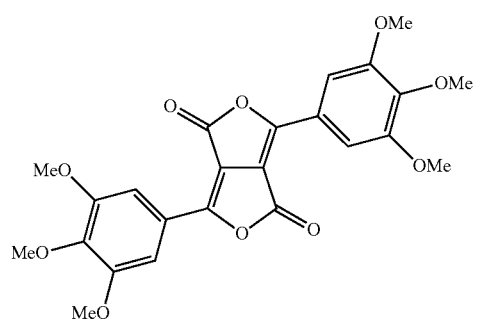
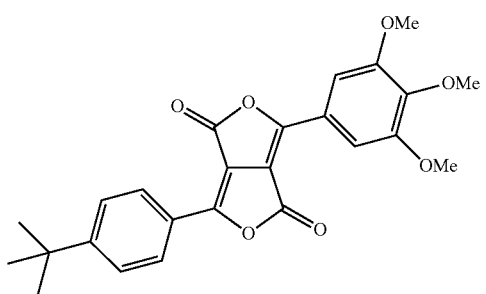

-continued
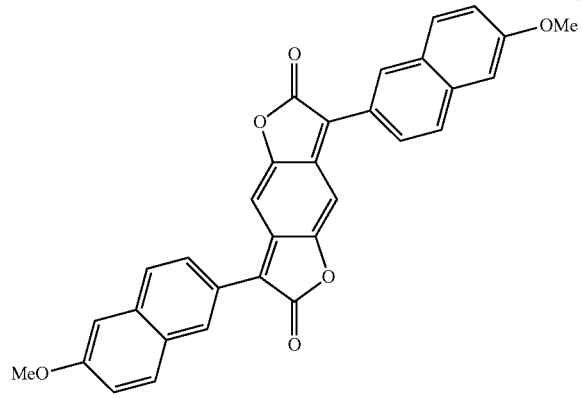
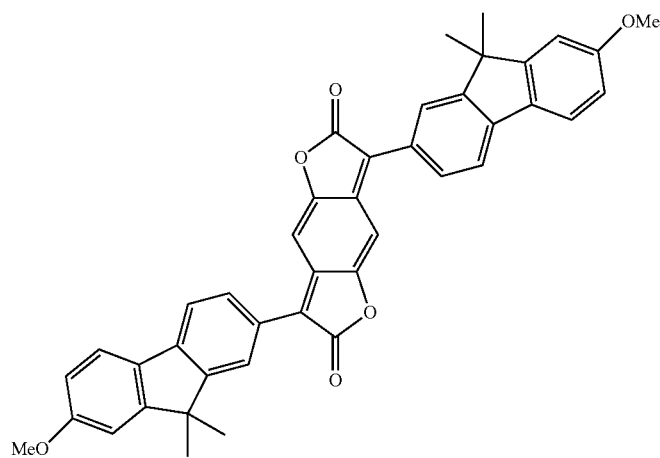
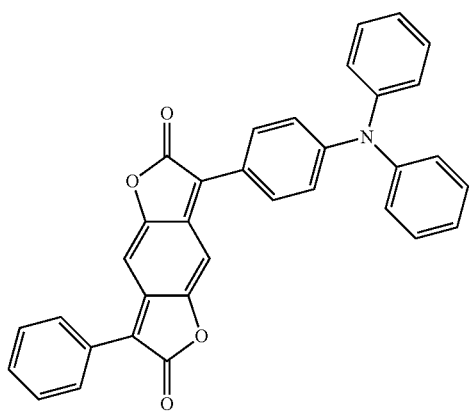
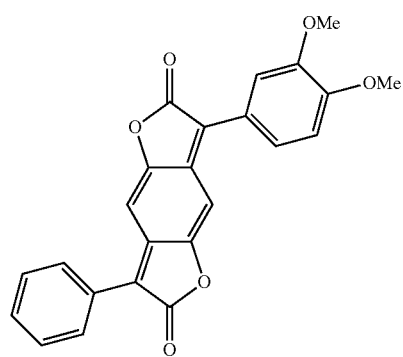
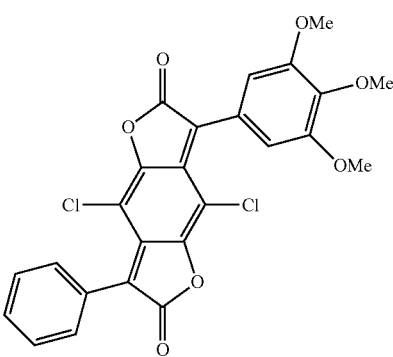
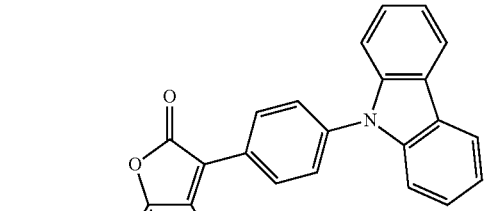
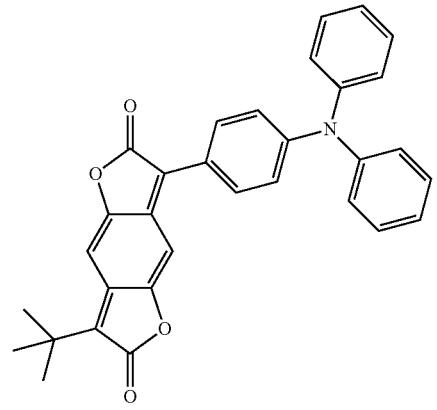

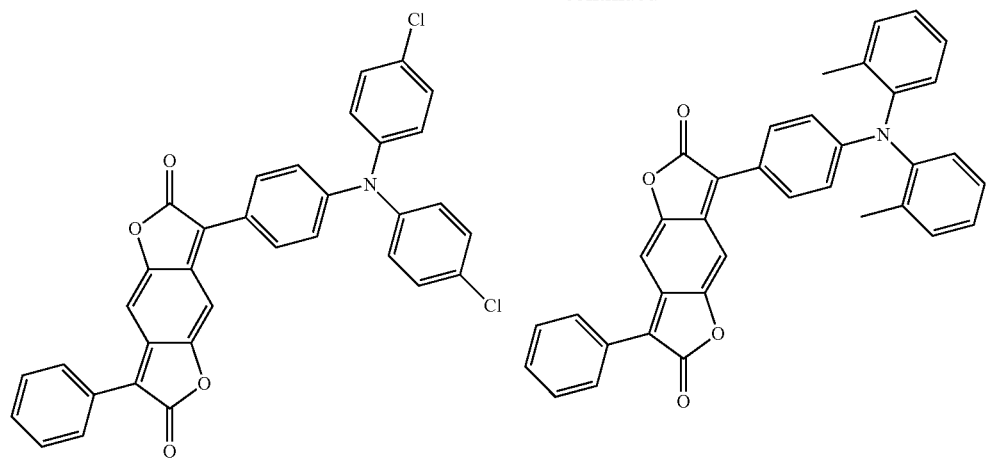
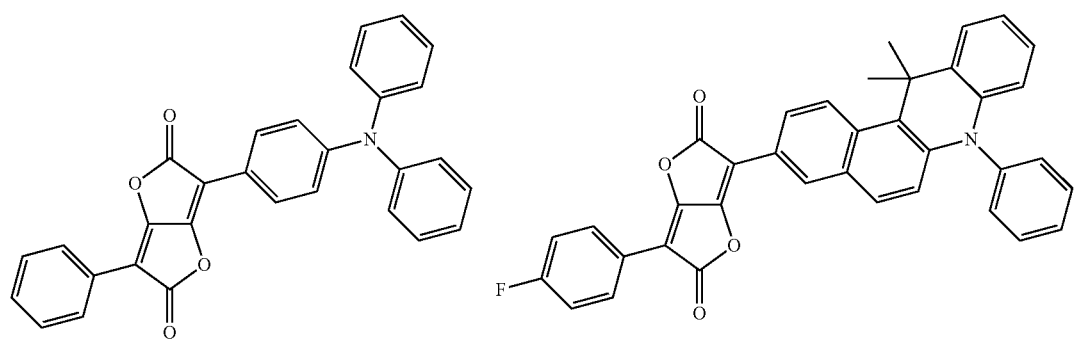
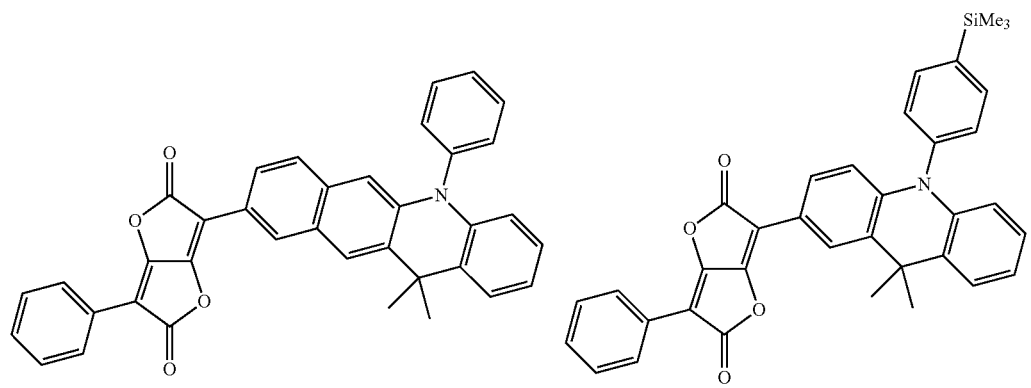
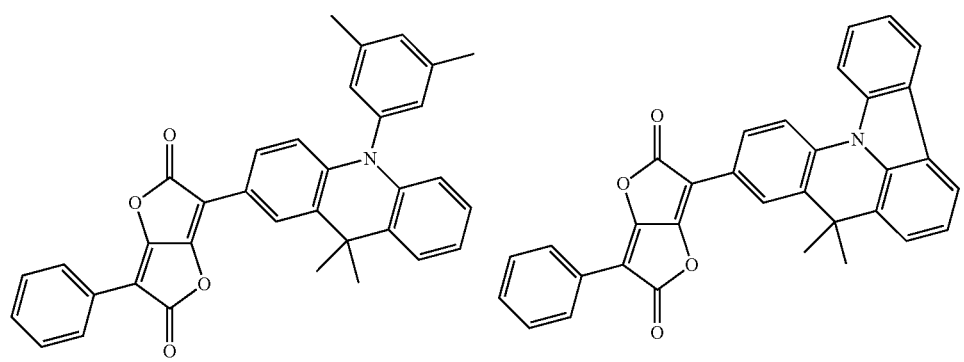

-continued
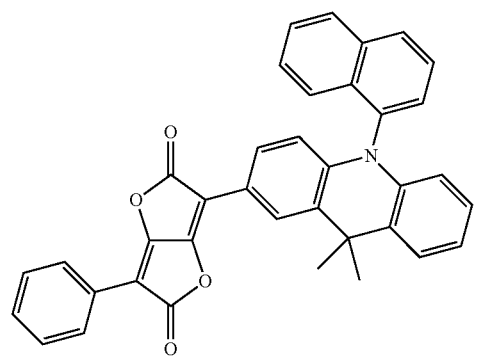
33
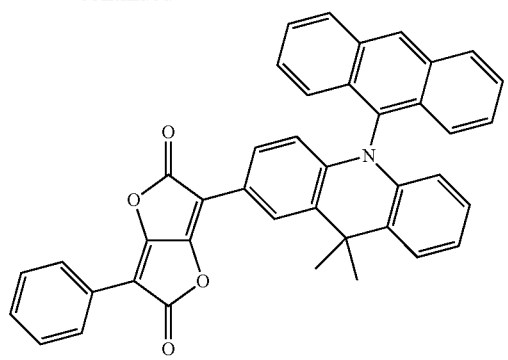
34
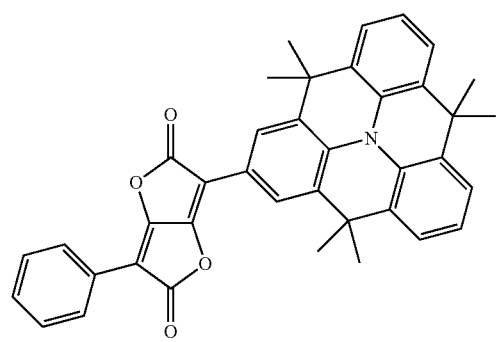
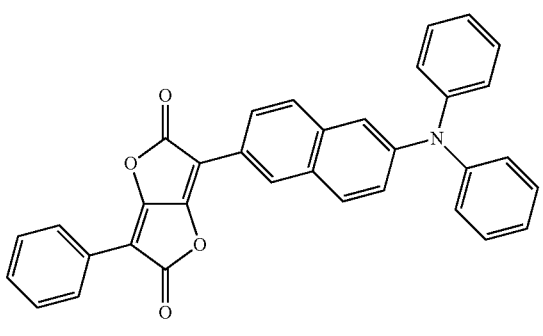
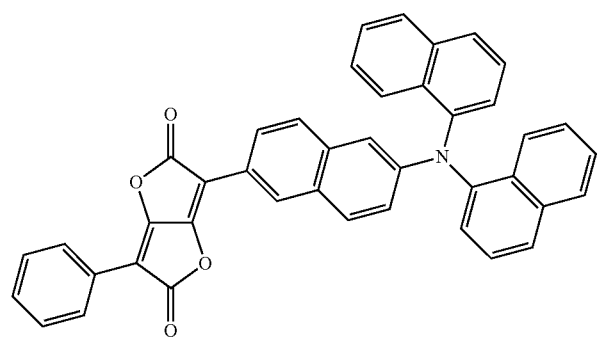
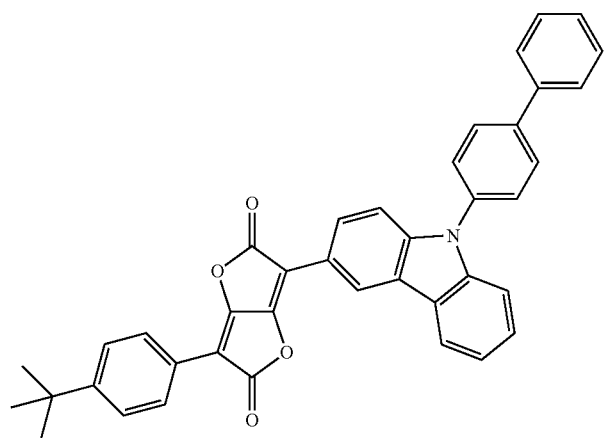
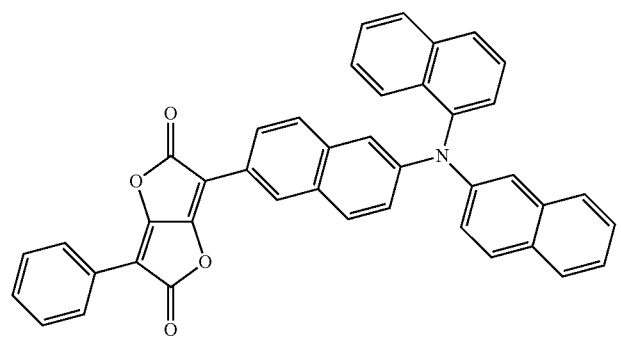
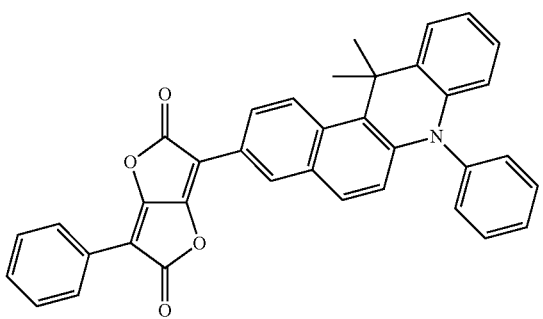

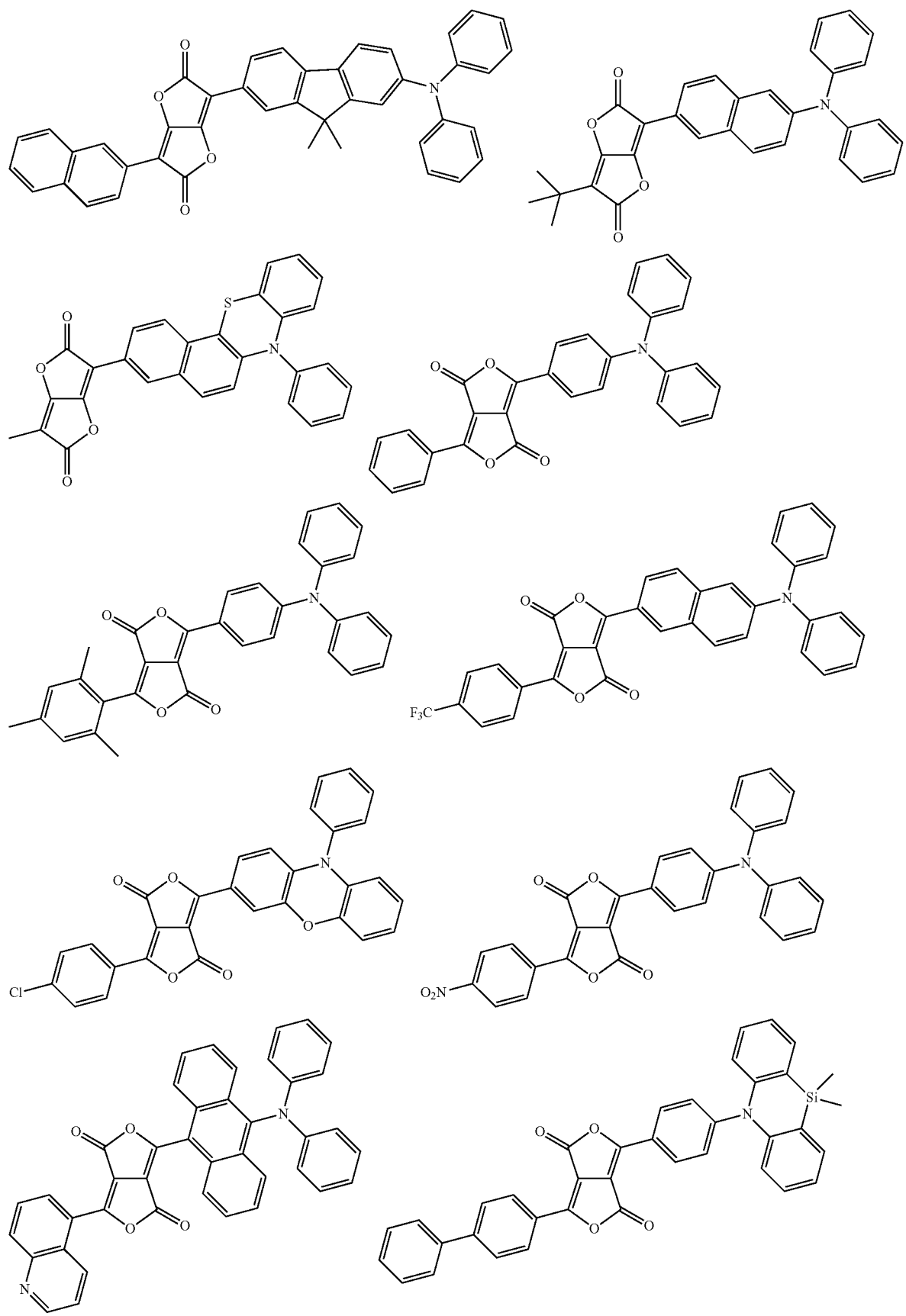

-continued
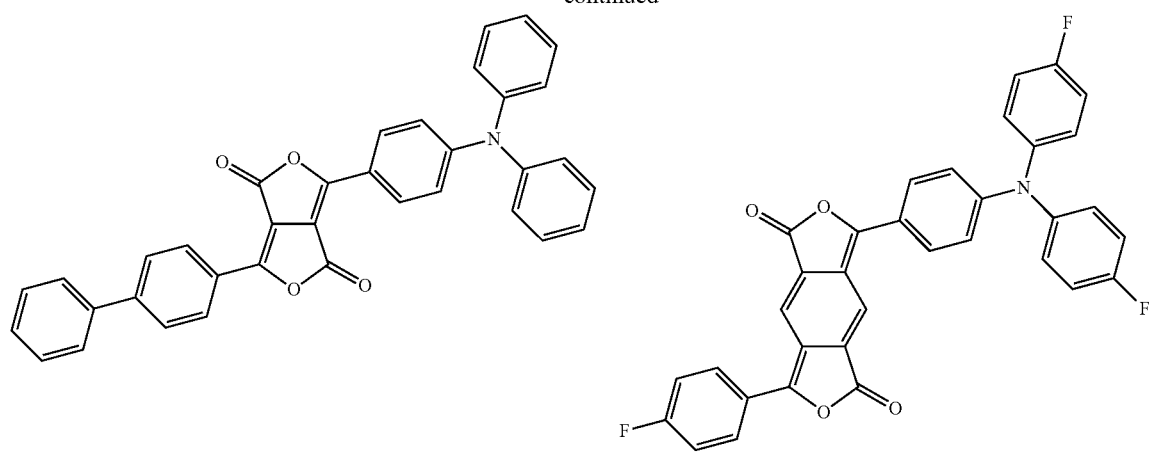
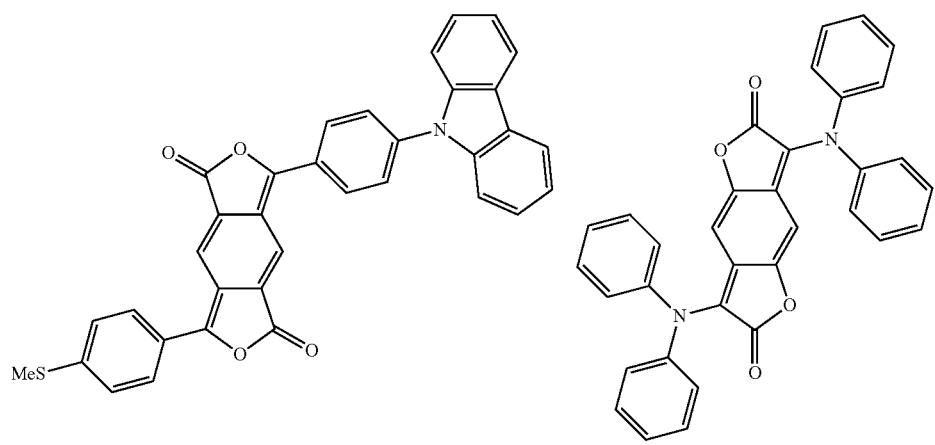
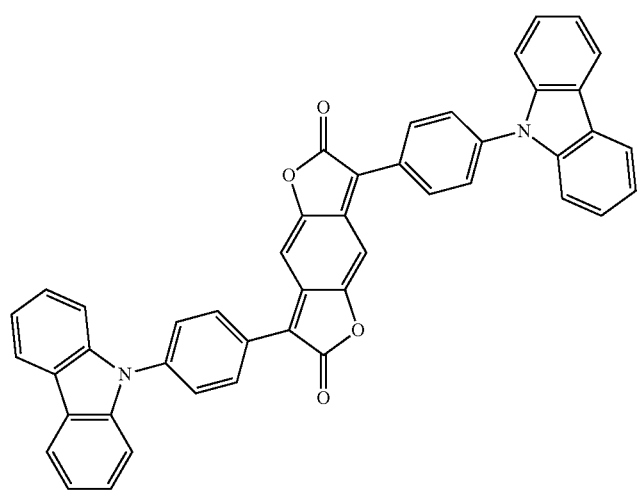

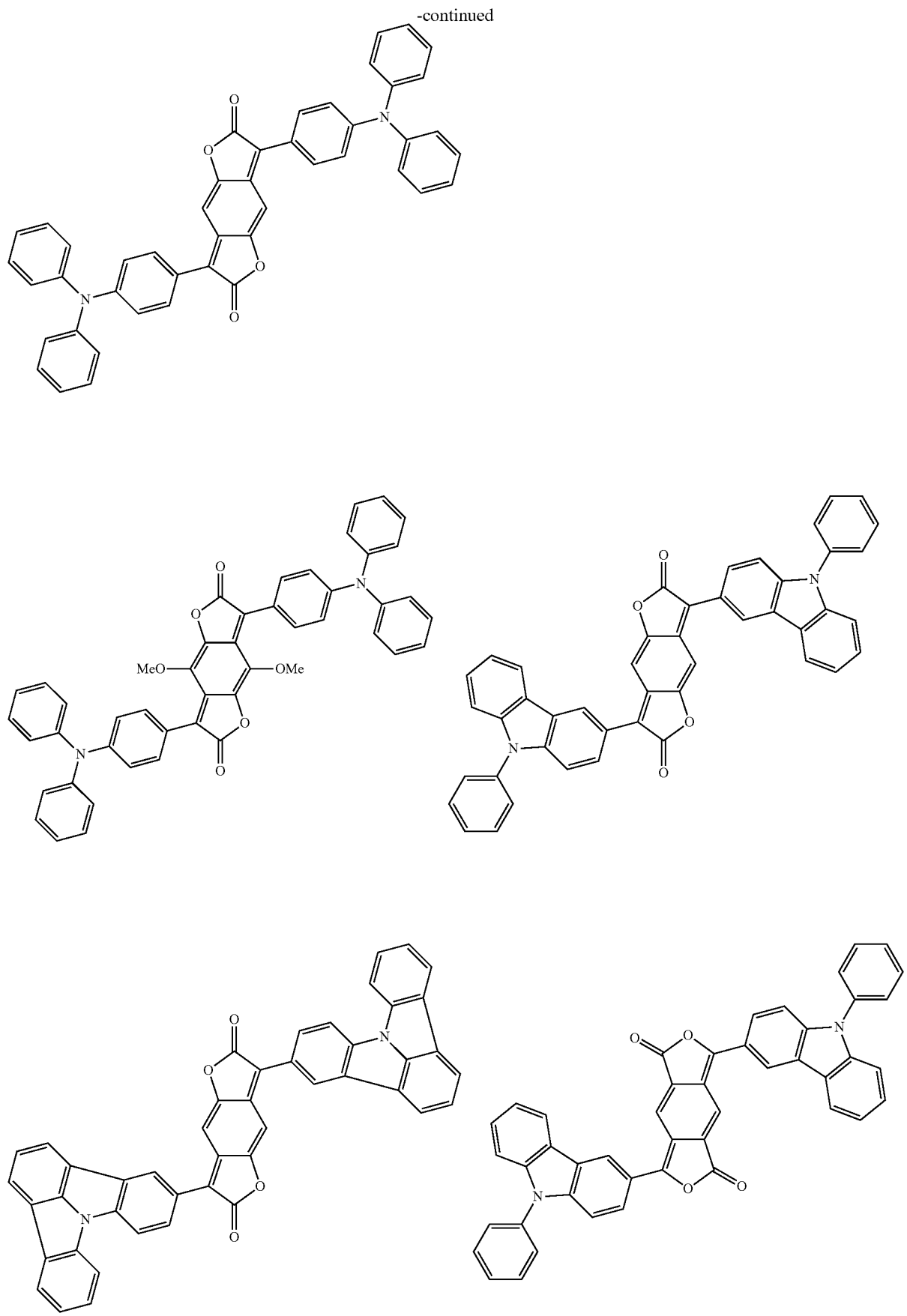

-continued
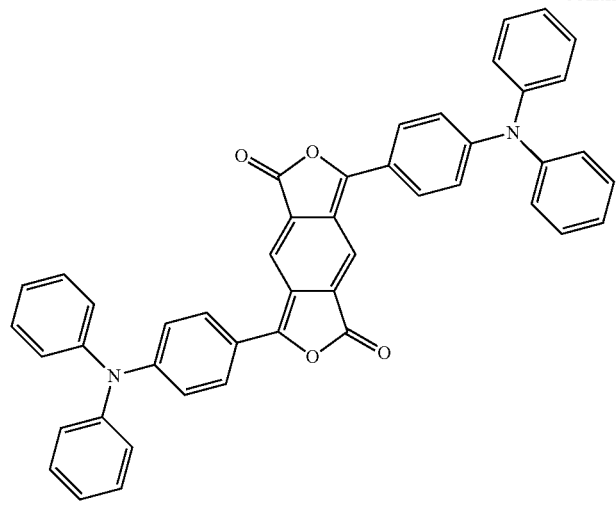
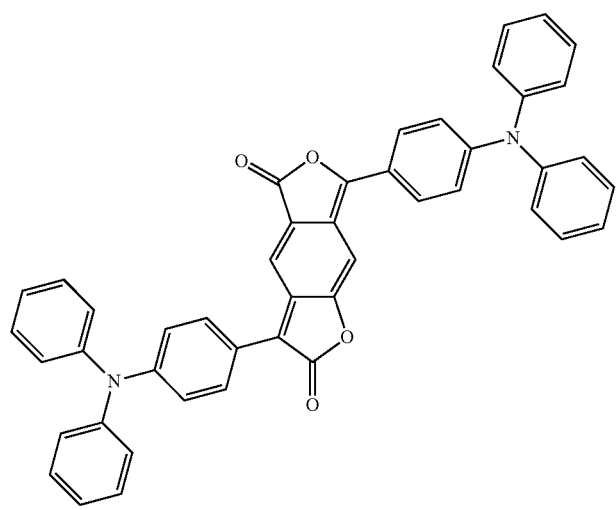
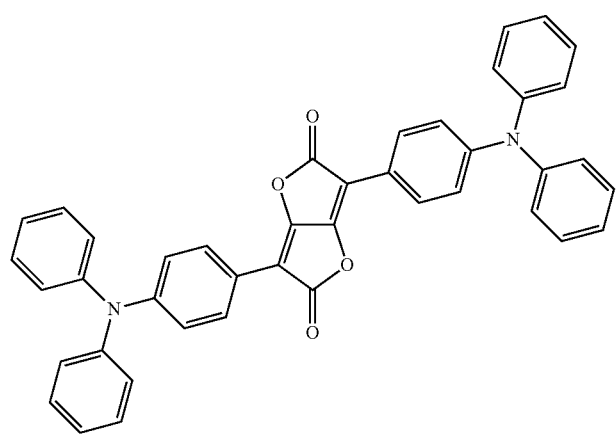

-continued
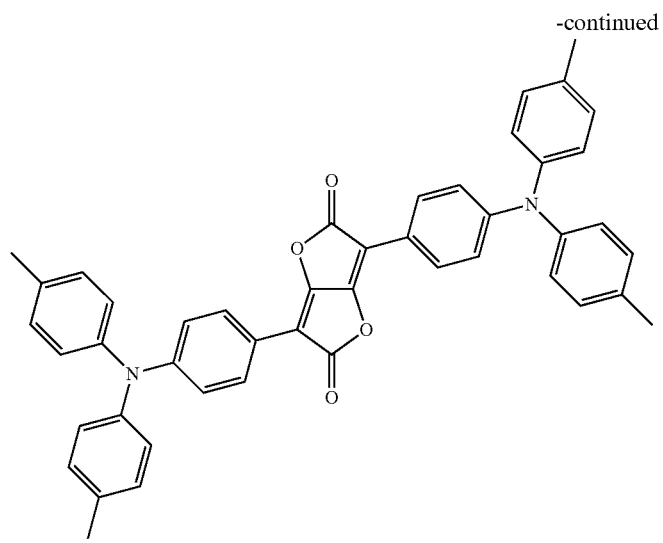
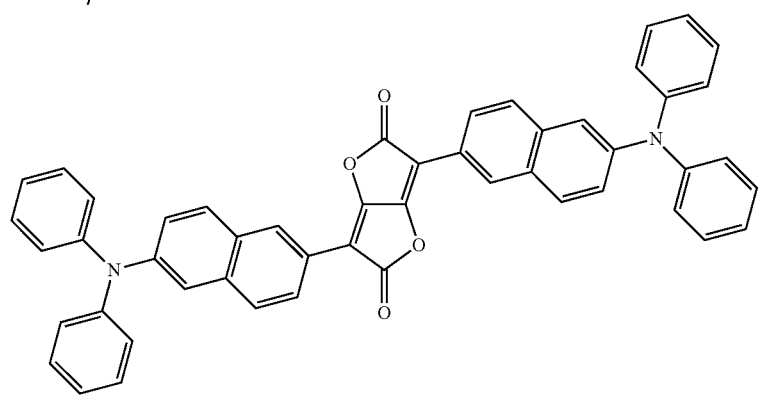
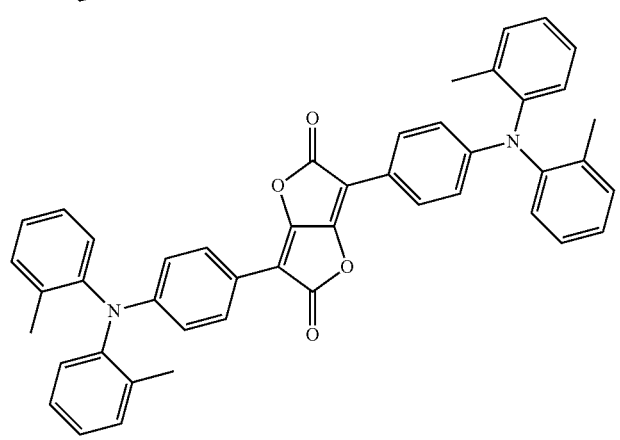
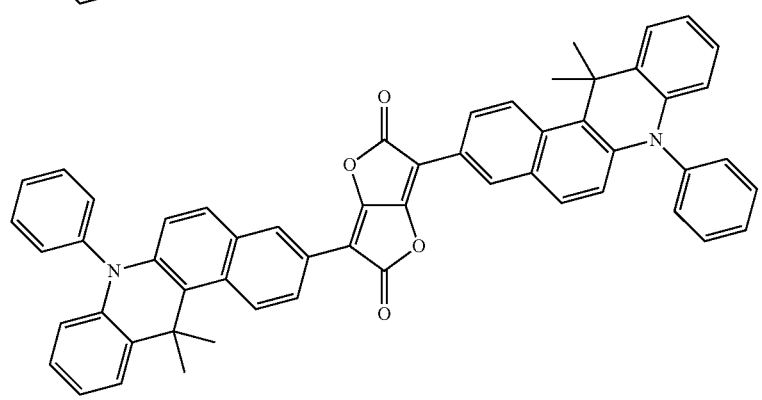

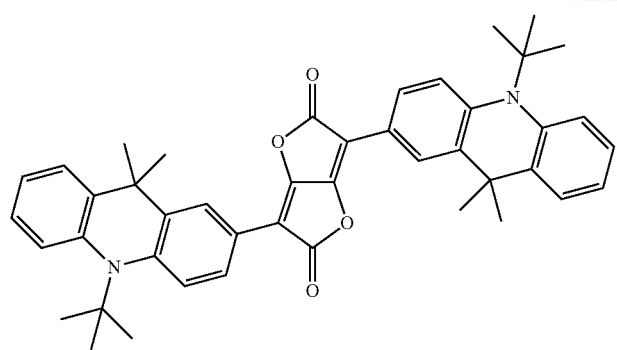
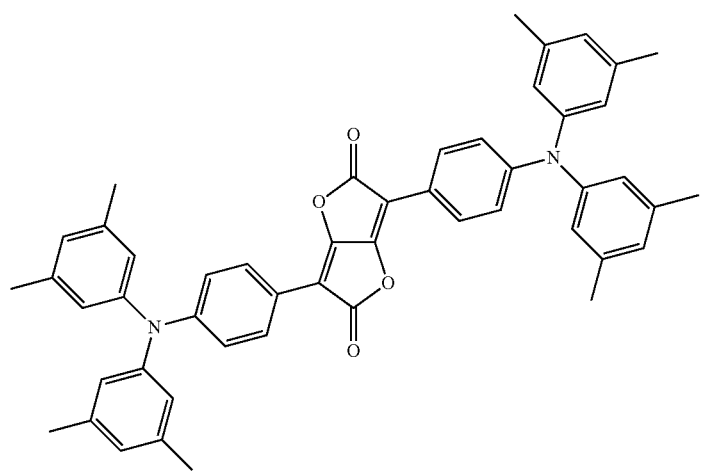
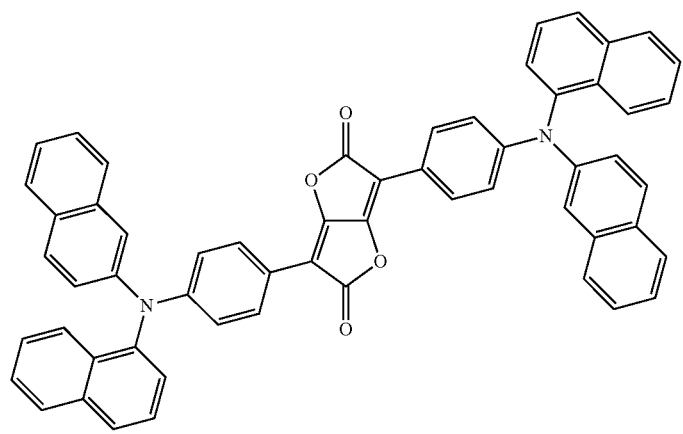
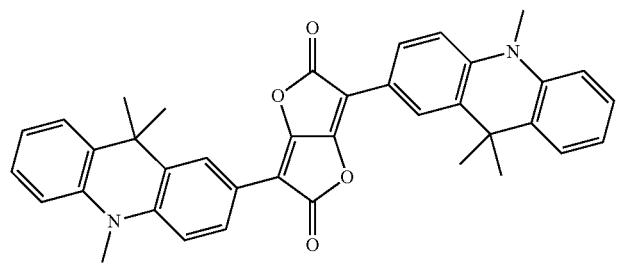

-continued
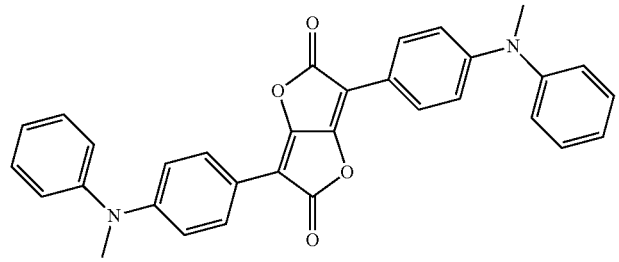
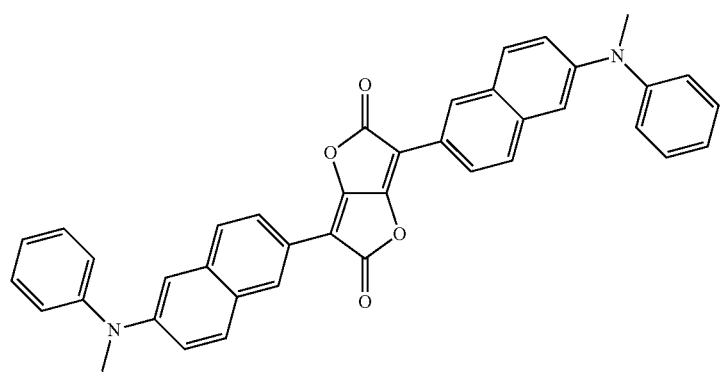
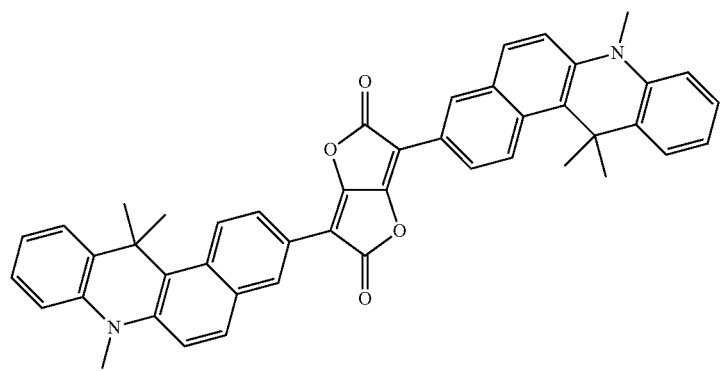
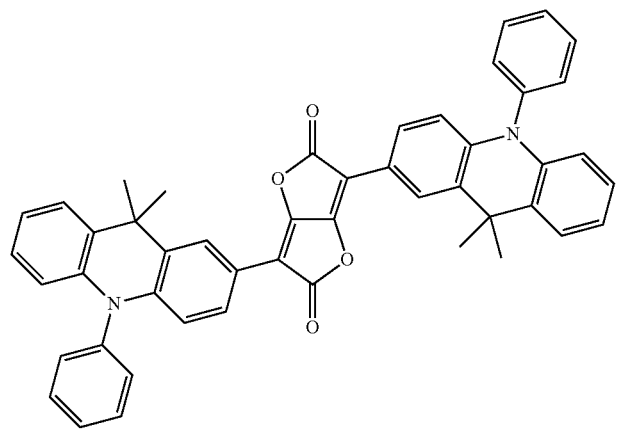

-continued
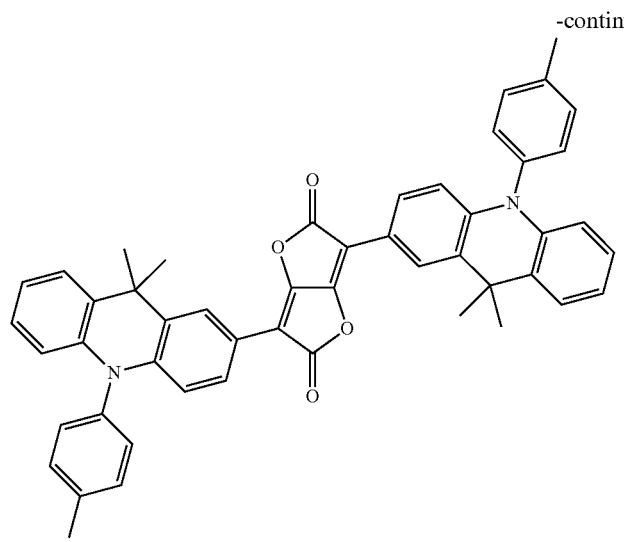
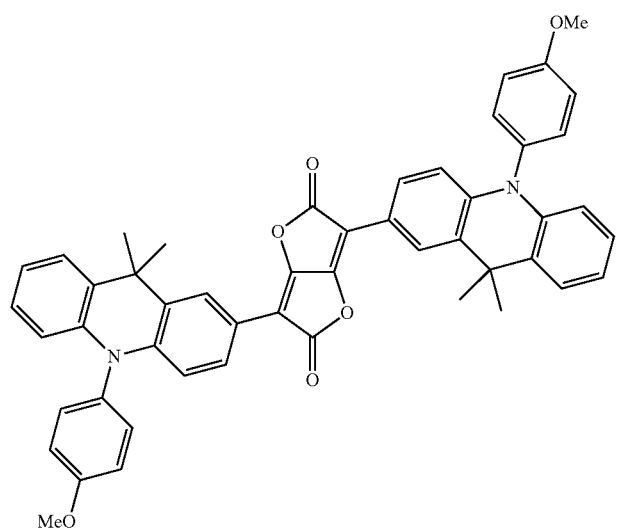
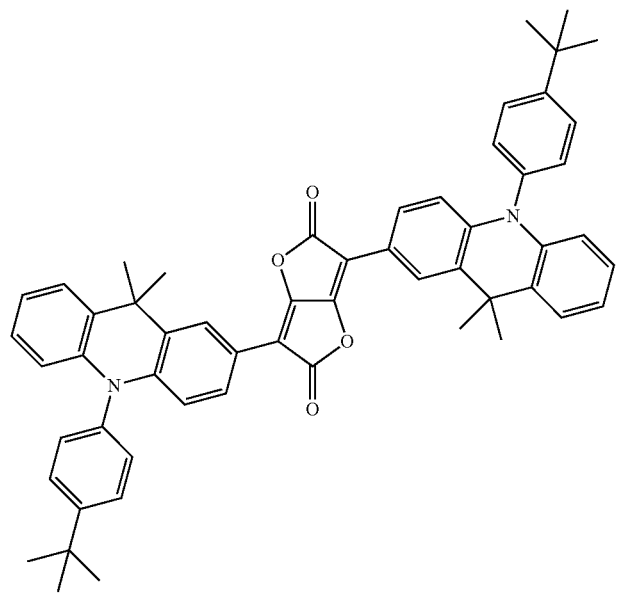

-continued
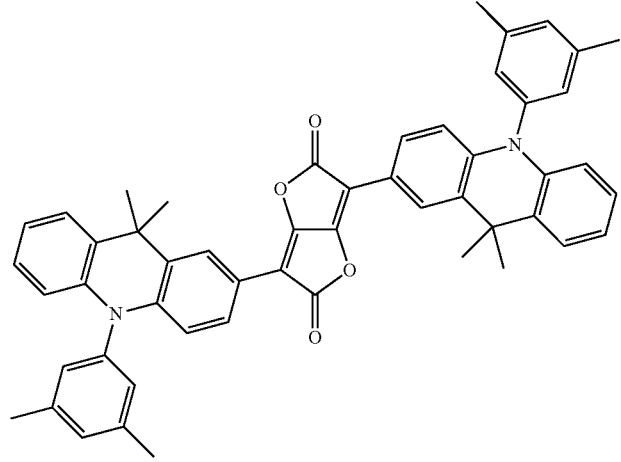
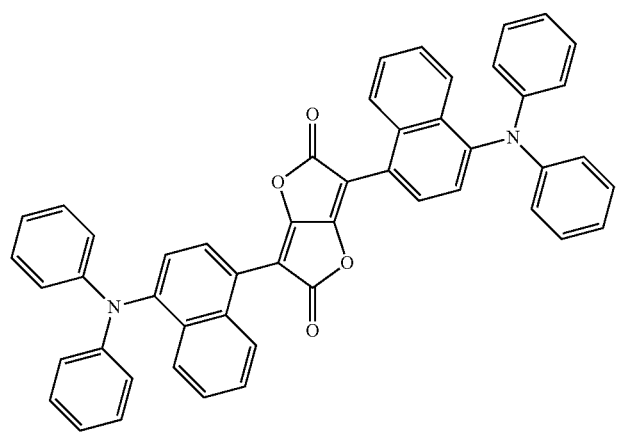
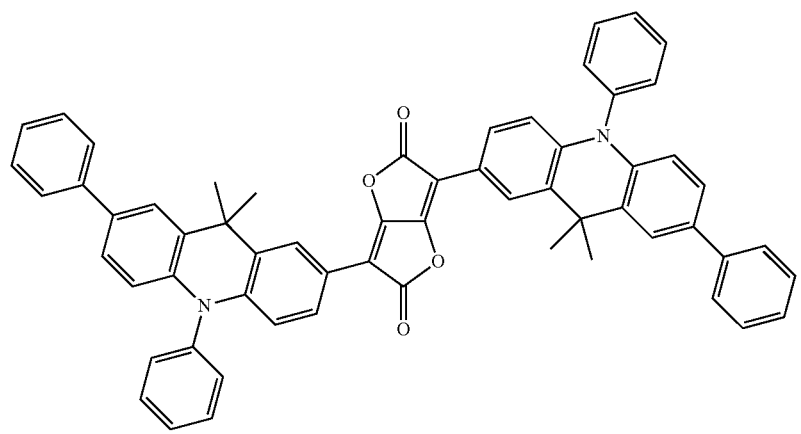
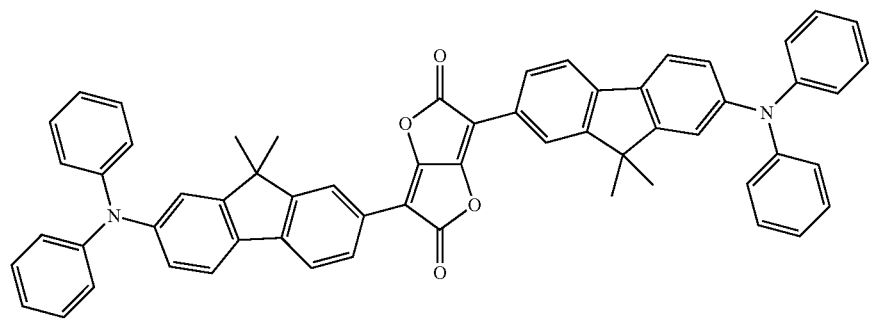

-continued
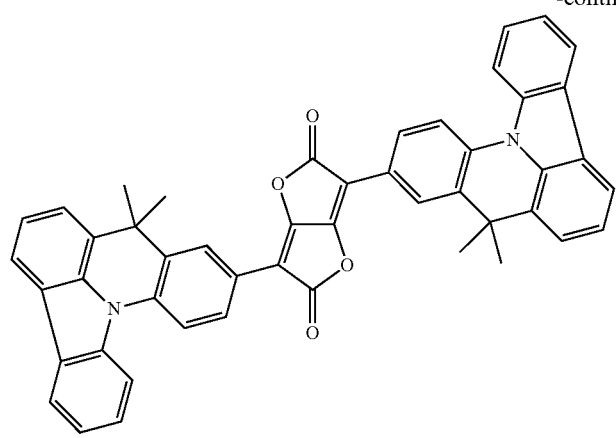
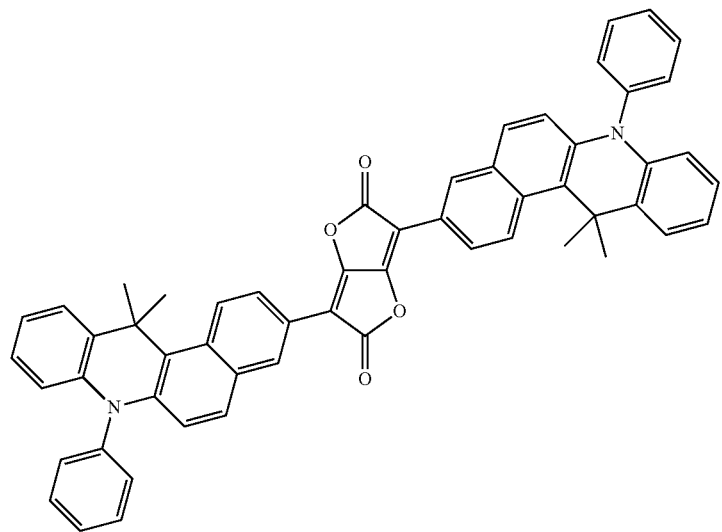
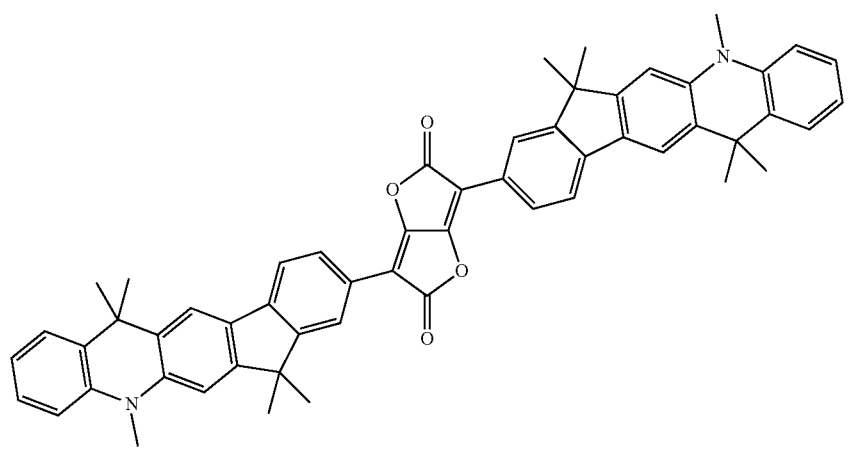

-continued
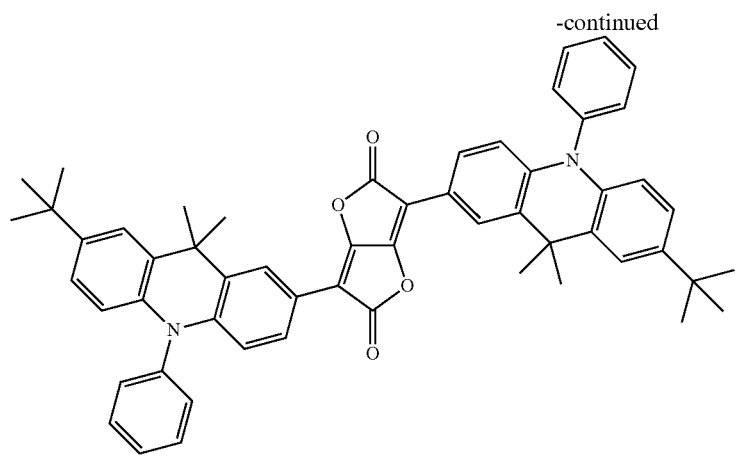
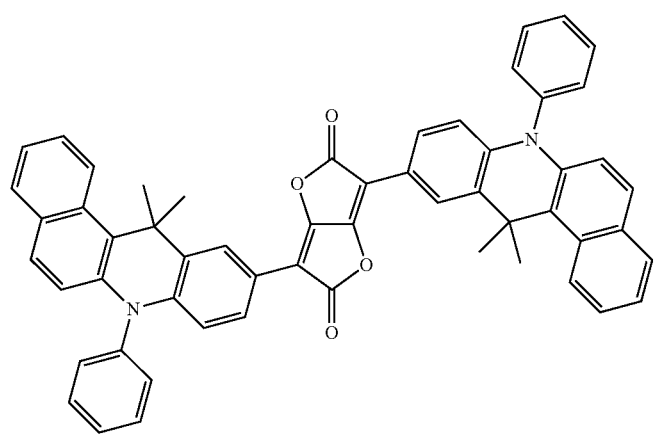
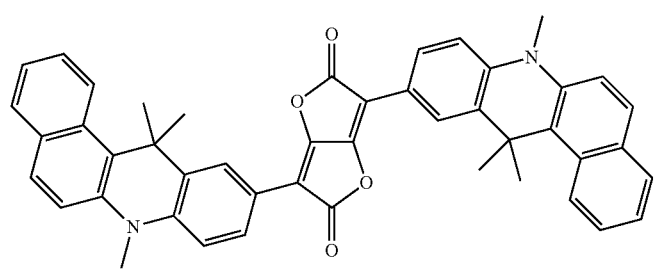
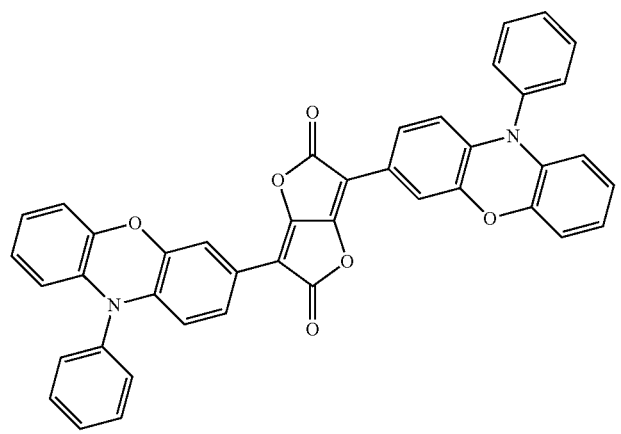

-continued
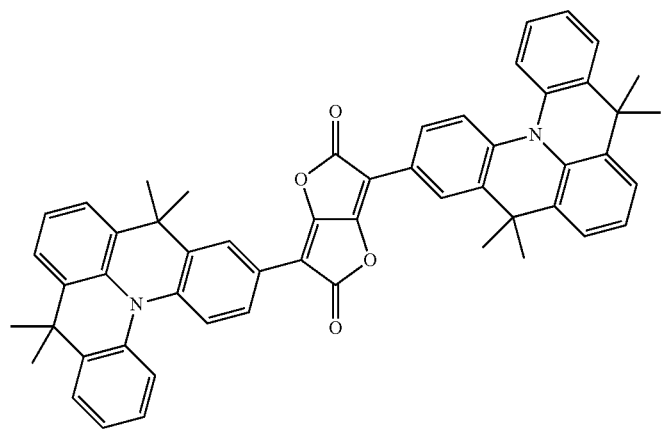
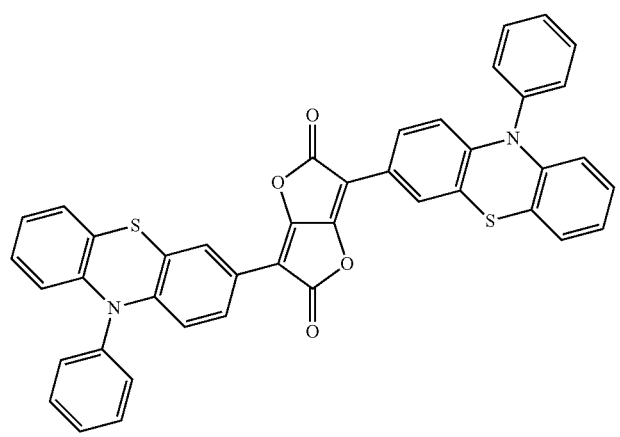
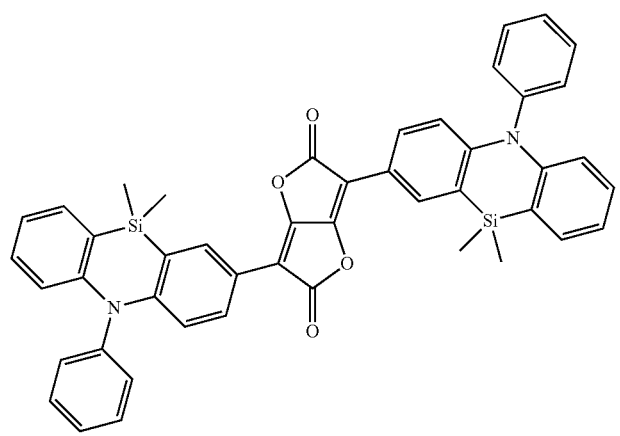

-continued
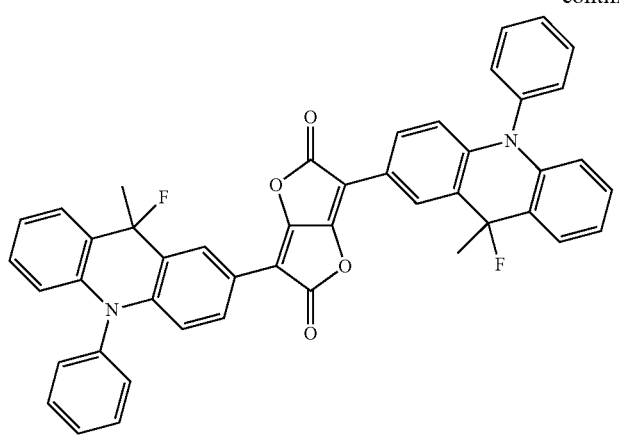
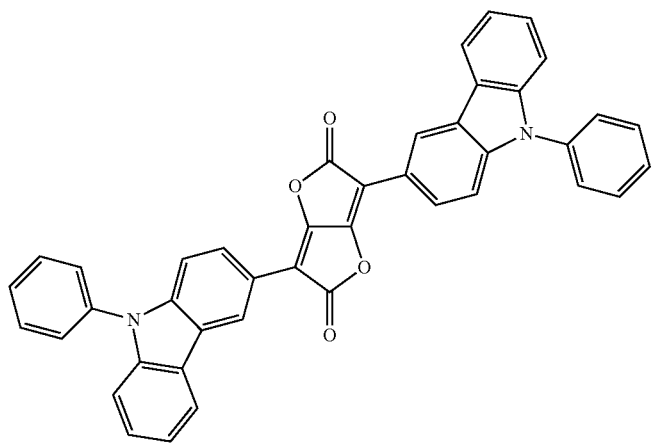
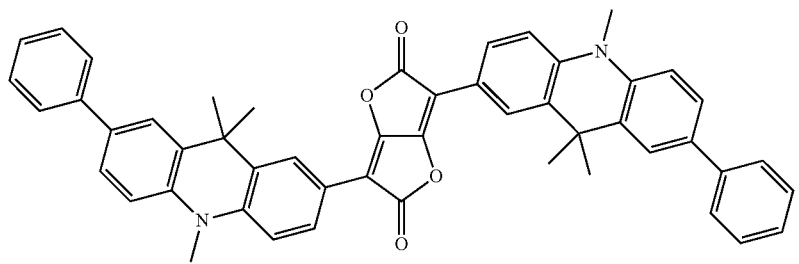
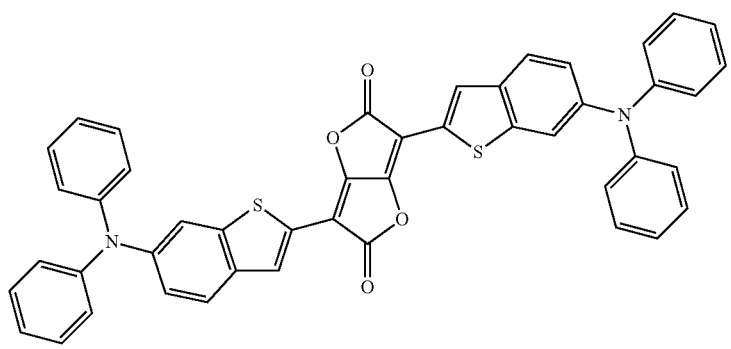

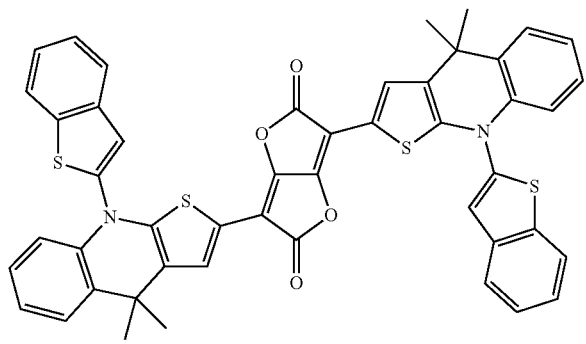
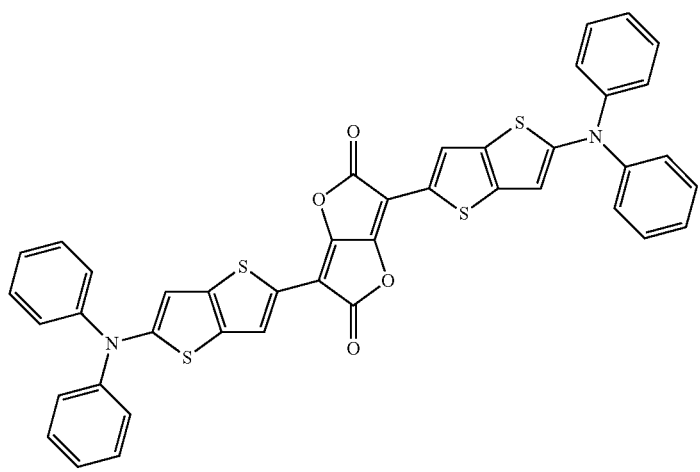
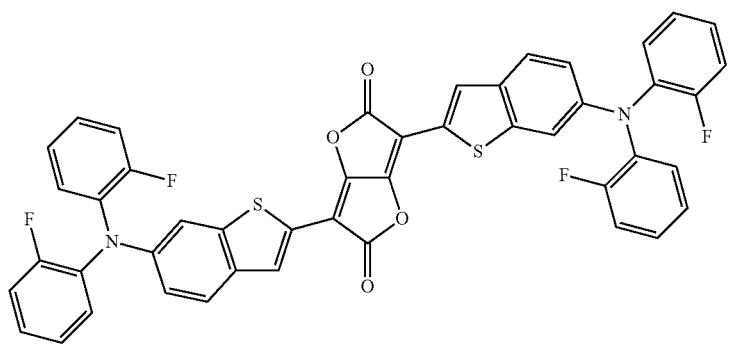
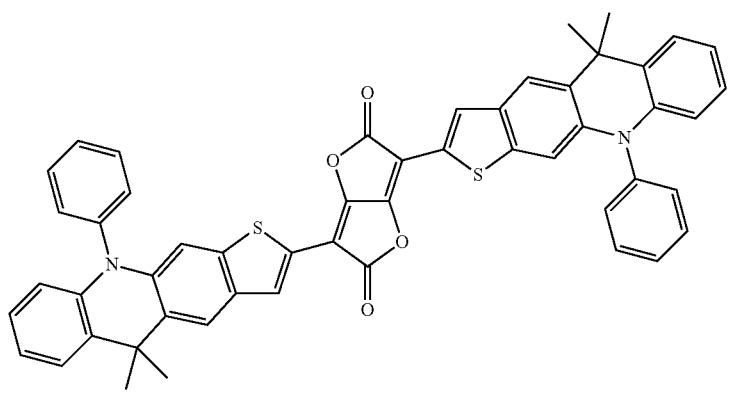

-continued
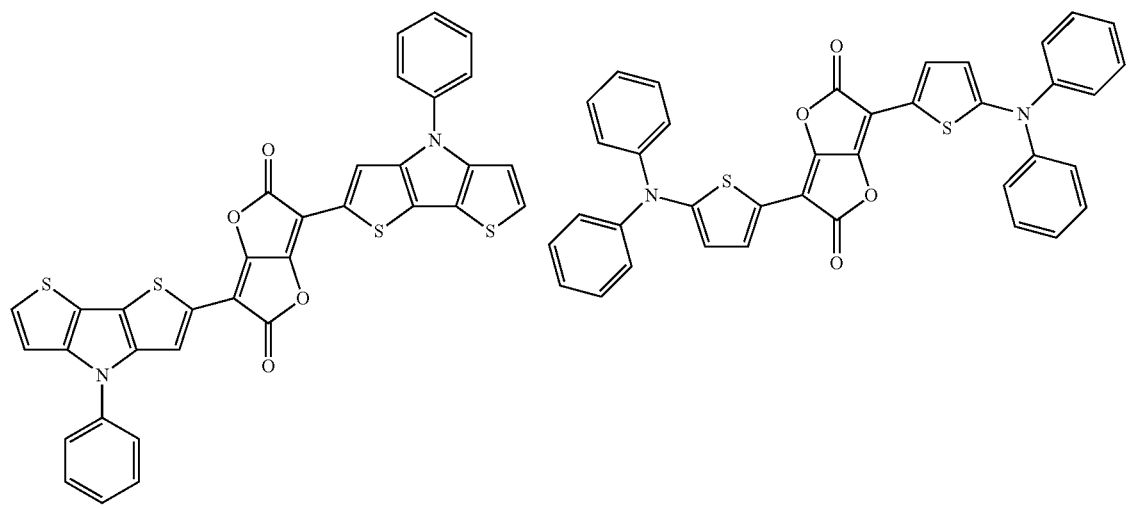
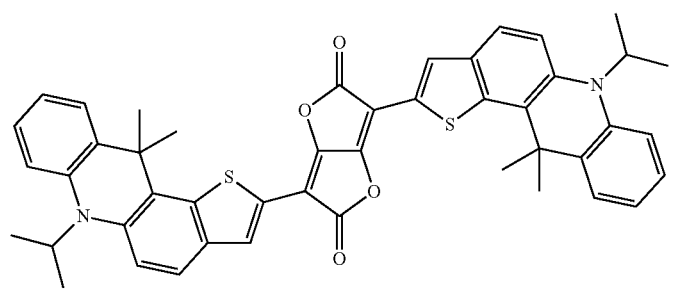
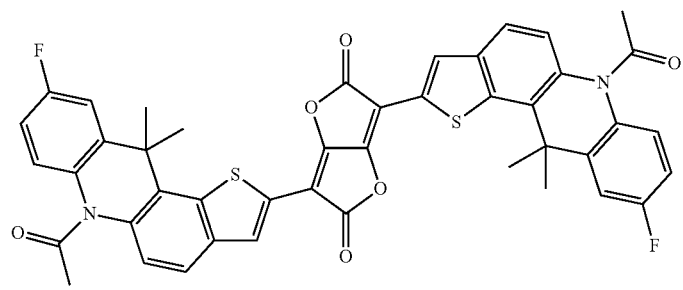
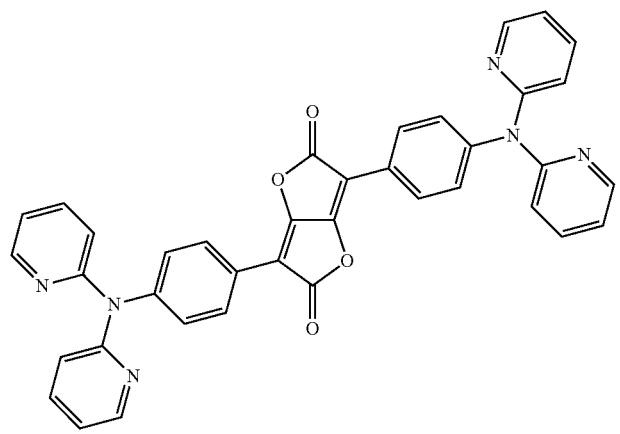

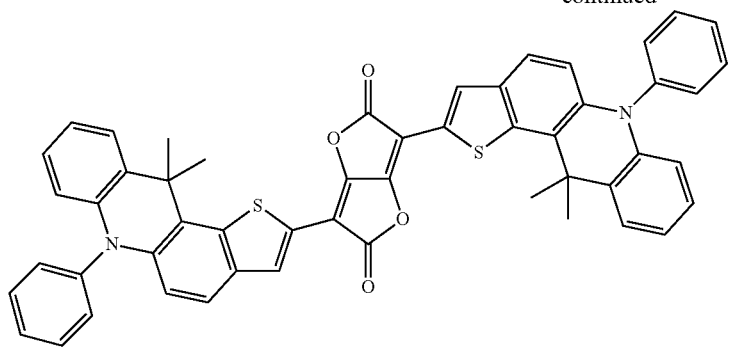
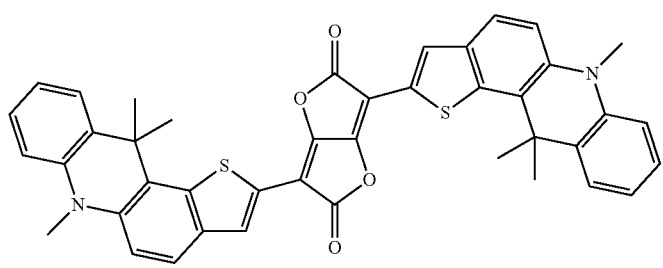
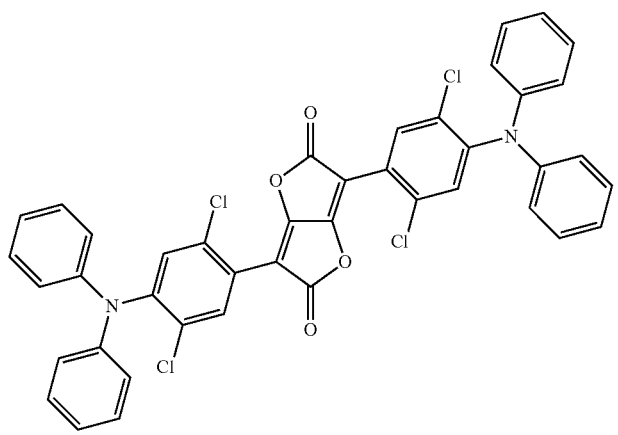
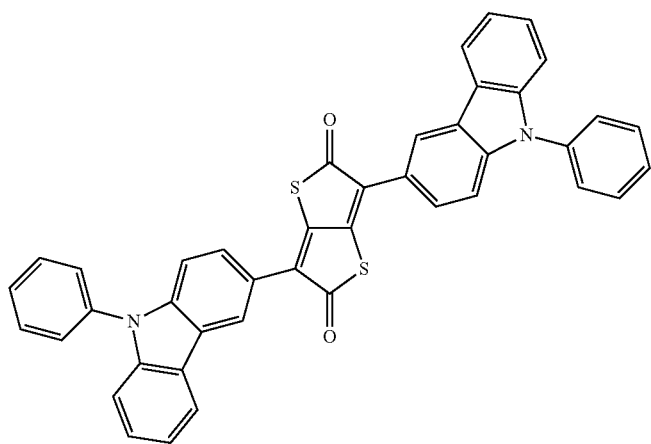

-continued
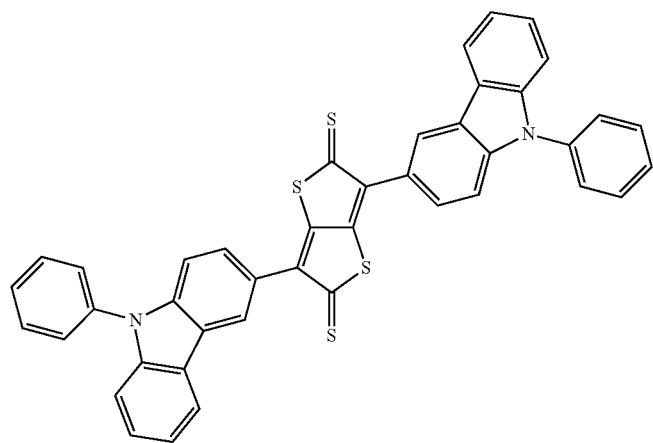
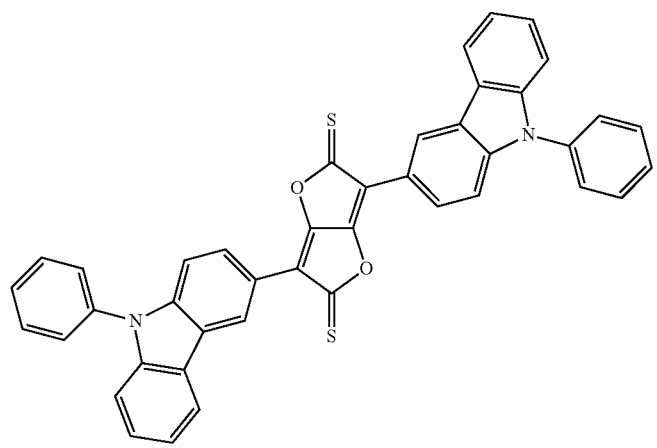
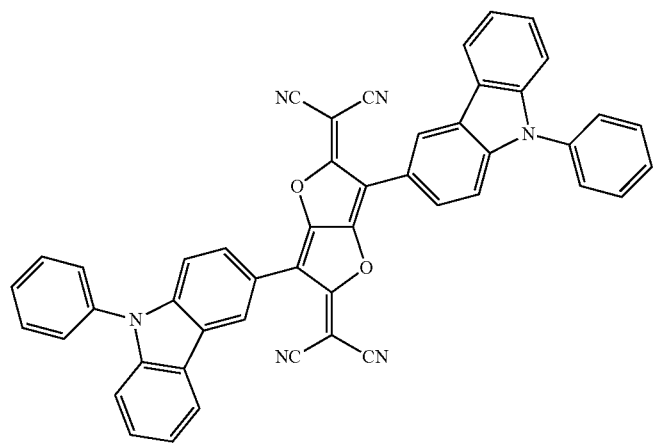

-continued
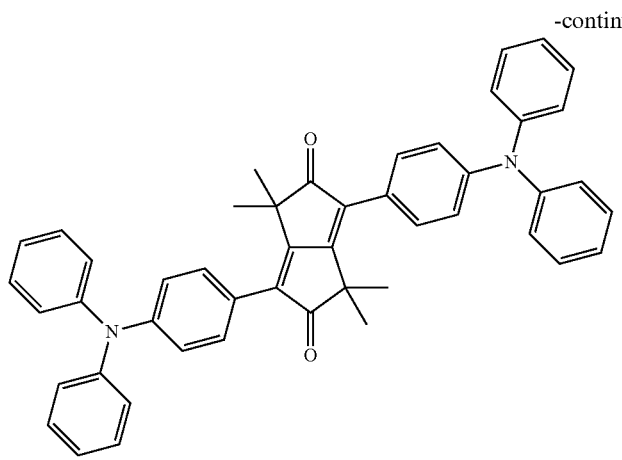
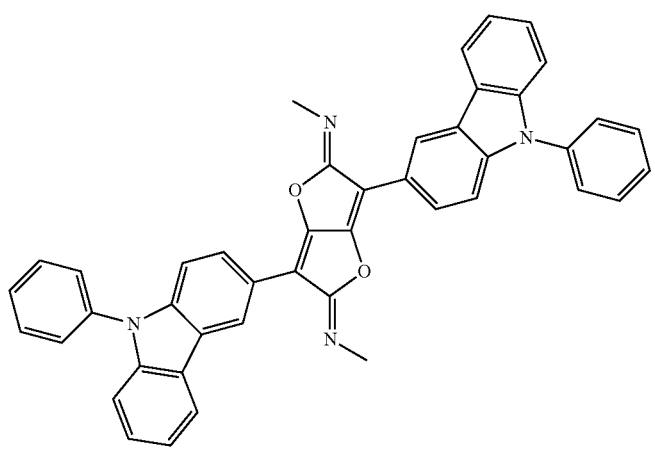
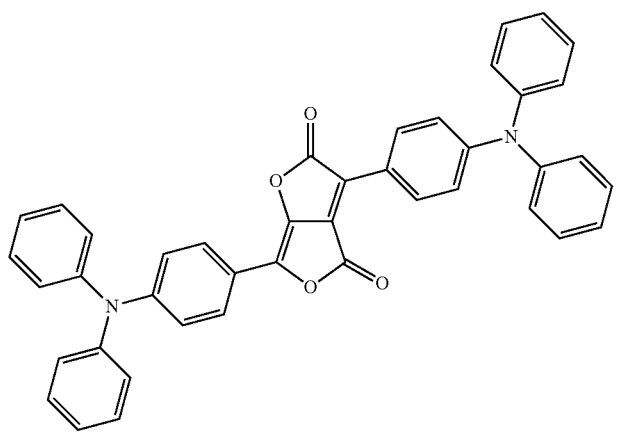

-continued
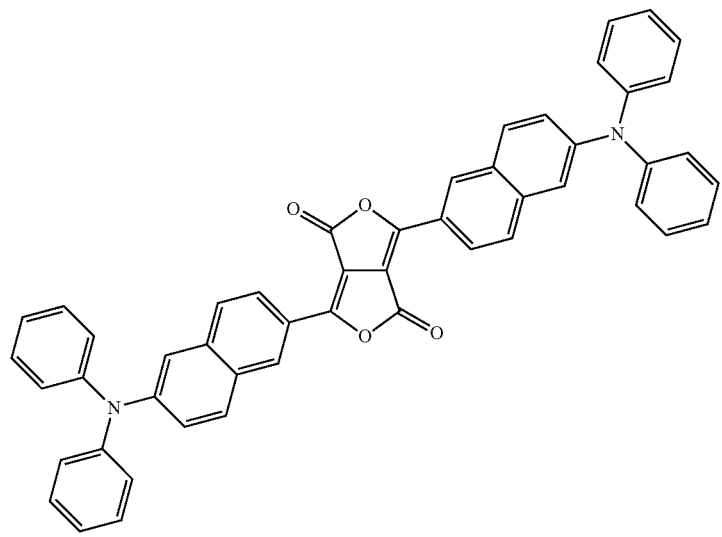
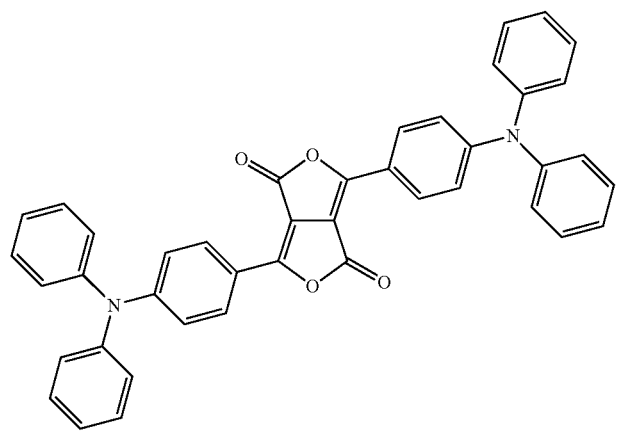
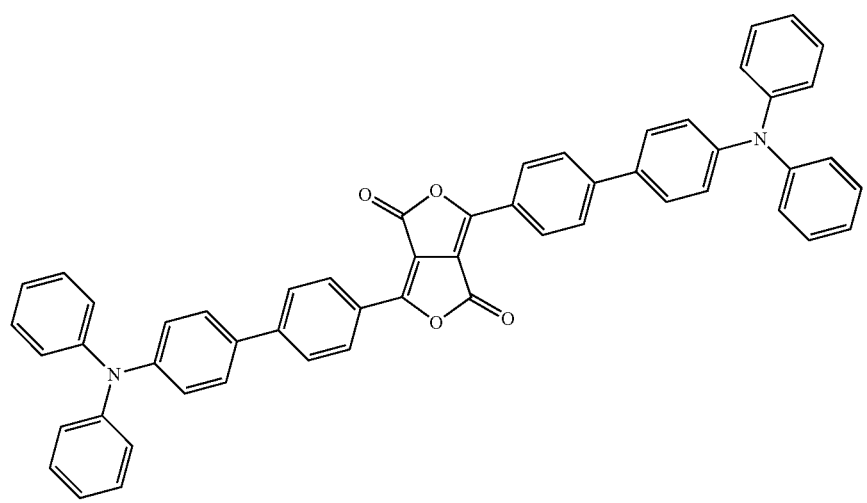

73
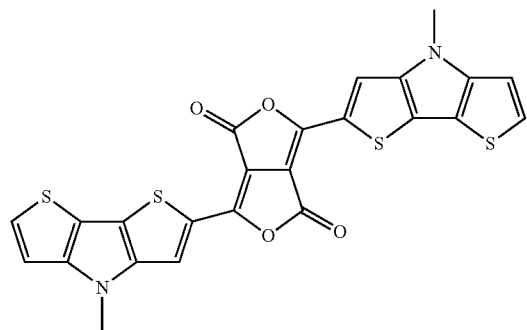
74
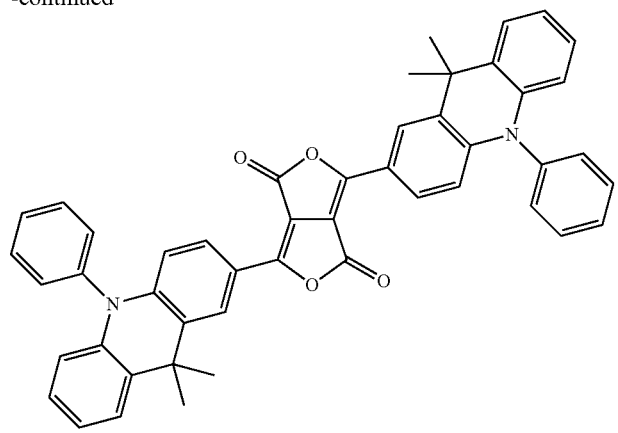
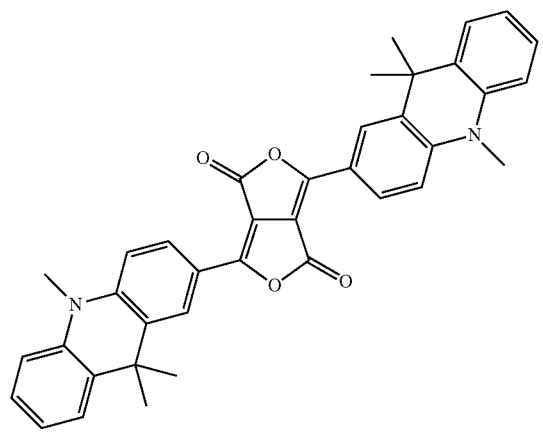
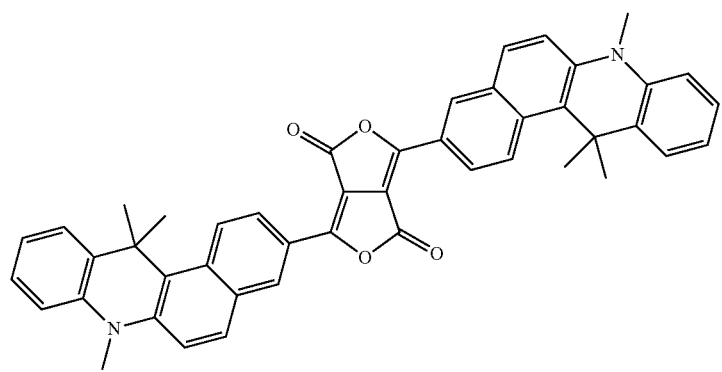

-continued
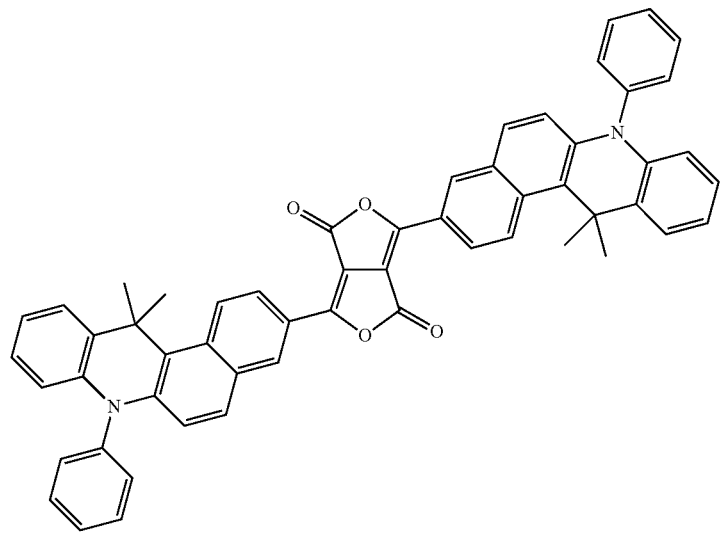
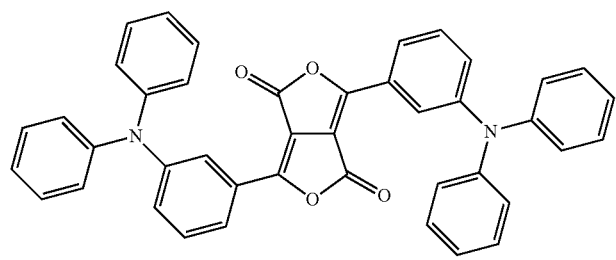
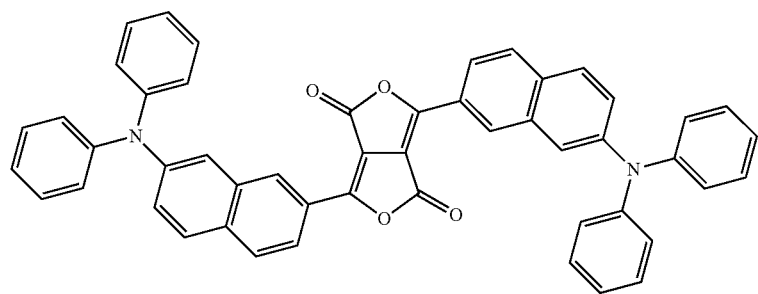
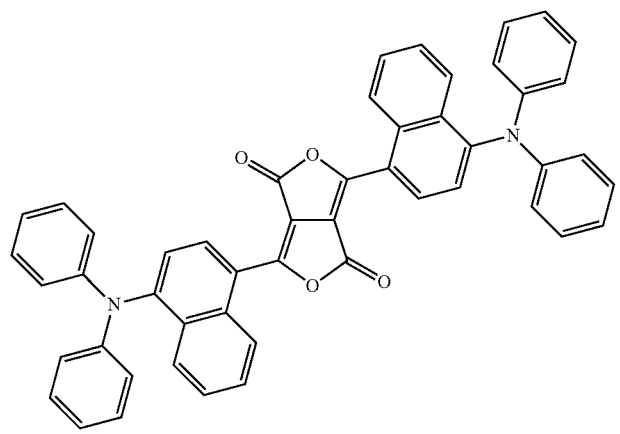

-continued
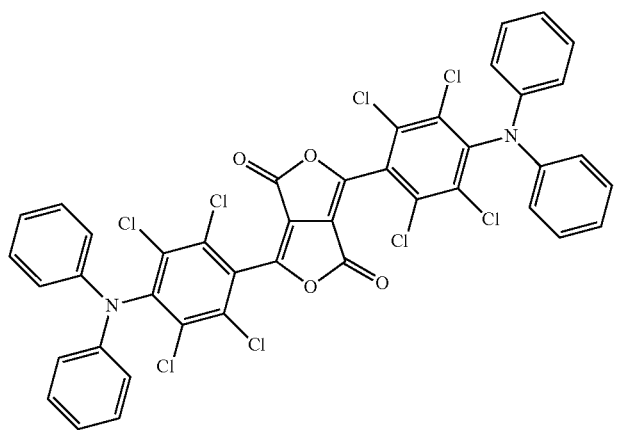
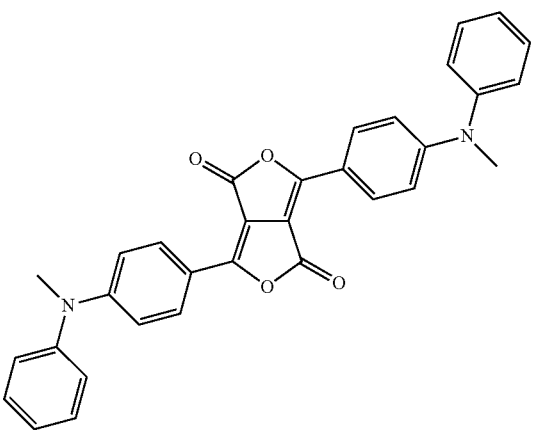
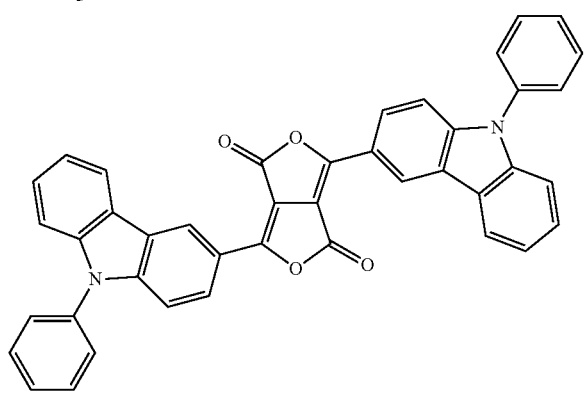
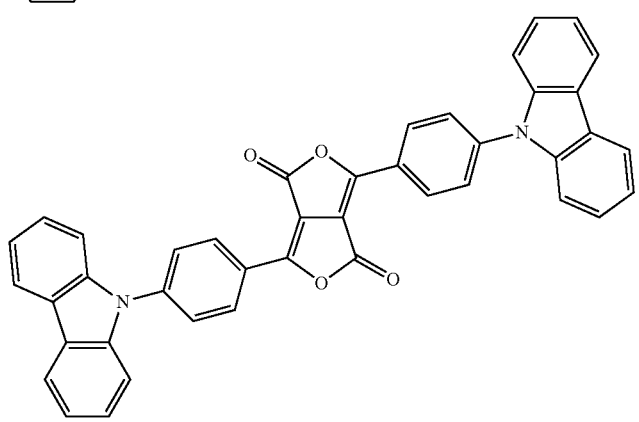
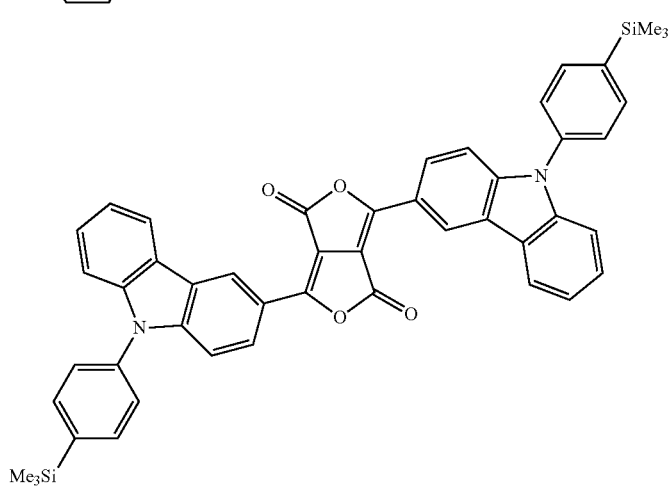
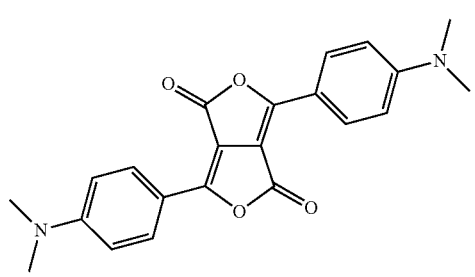

-continued
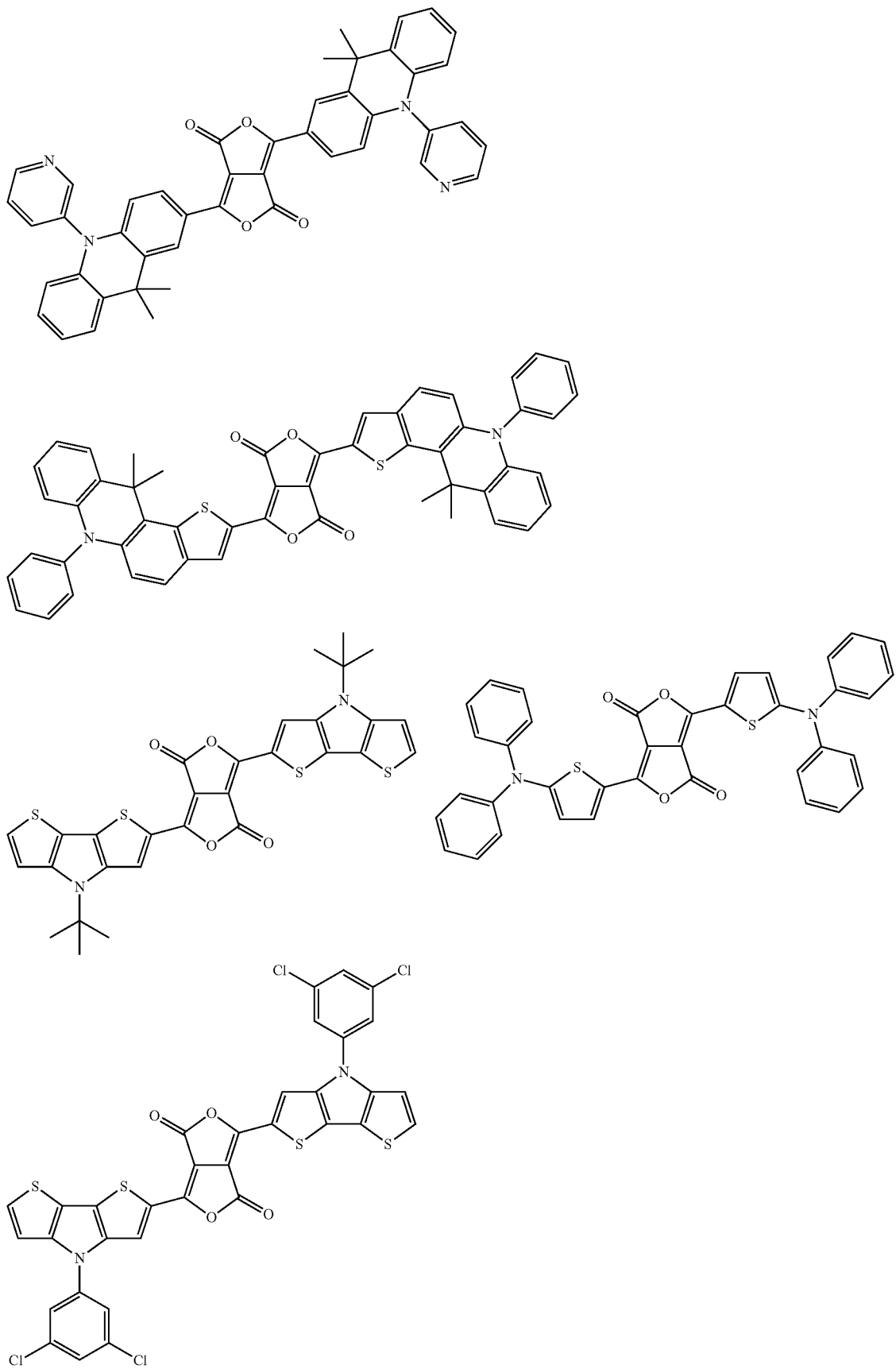 [SMILES: CC1(C)c2ccccc2N(c2cccnc2)c2ccc(C3=C4C(=O)OC(c5ccc6c(c5)C(C)(C)c5ccccc5N6c5cccnc5)=C4C(=O)O3)cc21 ; CC1(C)c2ccccc2N(c2ccccc2)c2ccc3cc(C4=C5C(=O)OC(c6cc7ccc8c(c7s6)C(C)(C)c6ccccc6N8c6ccccc6)=C5C(=O)O4)sc3c21 ; CC(C)(C)n1c2ccsc2c2sc(C3=C4C(=O)OC(c5cc6c(s5)c5sccc5n6C(C)(C)C)=C4C(=O)O3)cc21 ; O=C1OC(c2ccc(N(c3ccccc3)c3ccccc3)s2)=C2C(=O)OC(c3ccc(N(c4ccccc4)c4ccccc4)s3)=C12 ; O=C1OC(c2cc3c(s2)c2sccc2n3-c2cc(Cl)cc(Cl)c2)=C2C(=O)OC(c3cc4c(s3)c3sccc3n4-c3cc(Cl)cc(Cl)c3)=C12]

-continued
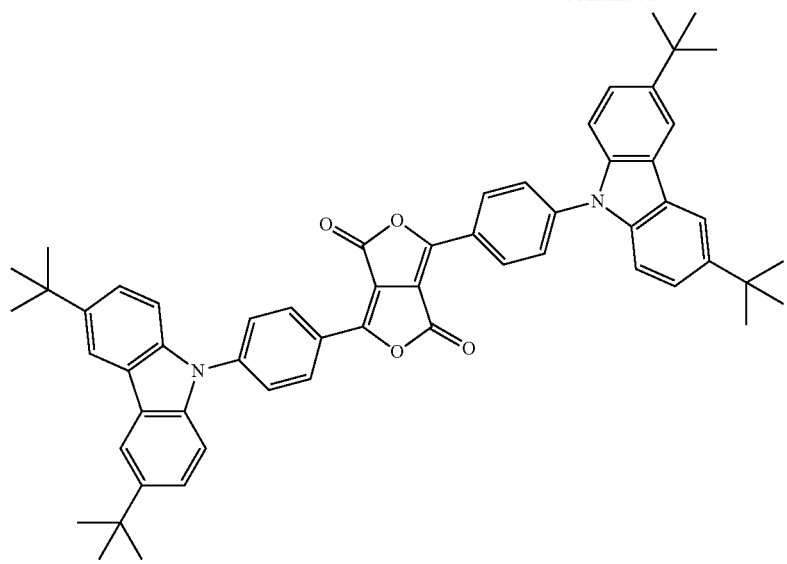
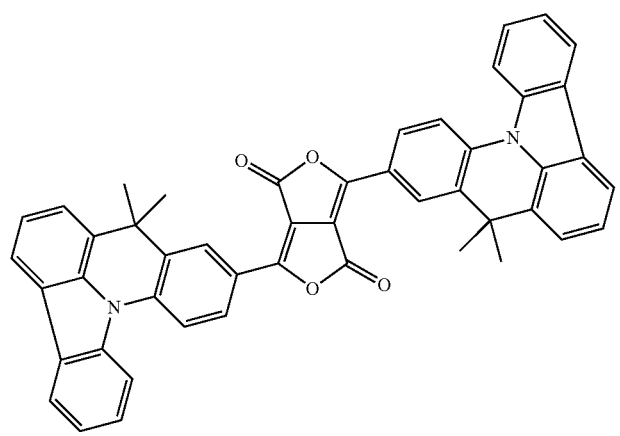
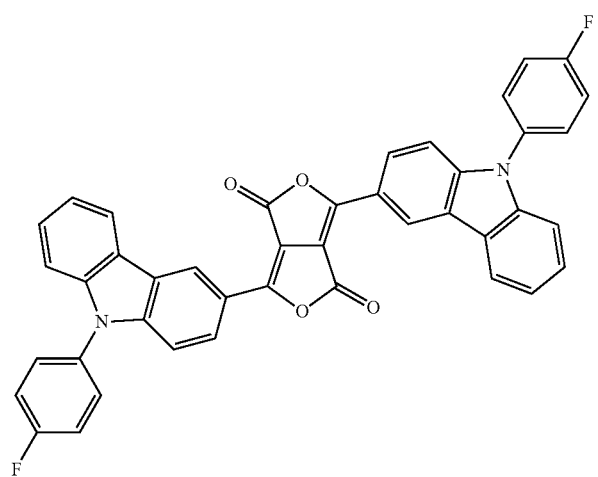

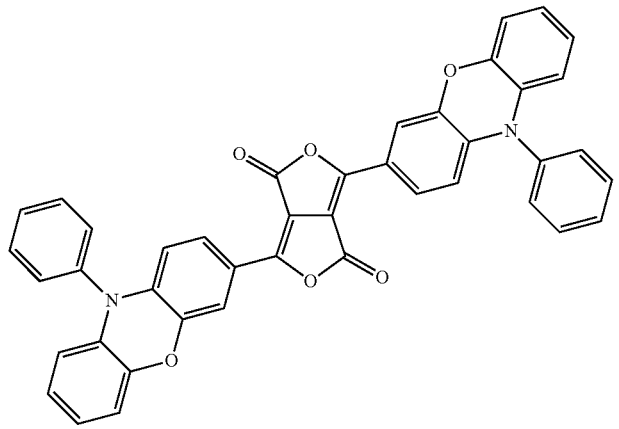
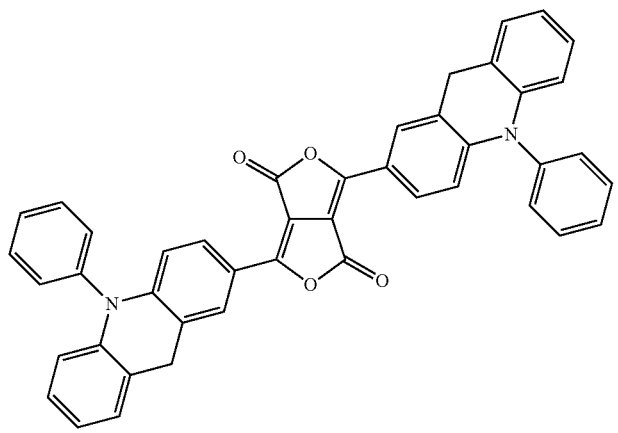
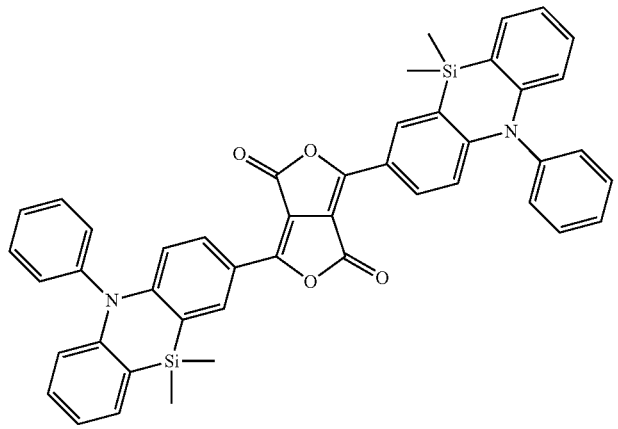
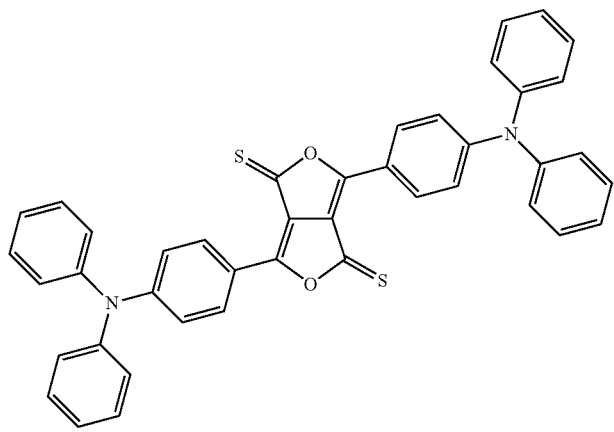

-continued
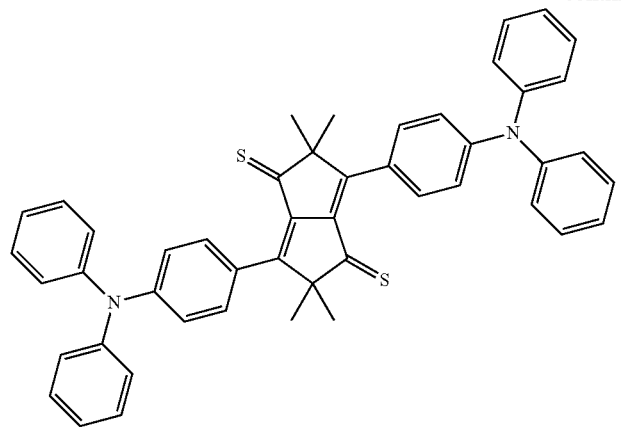
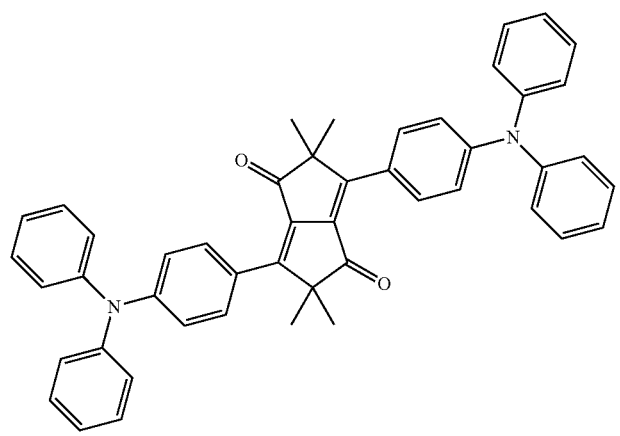
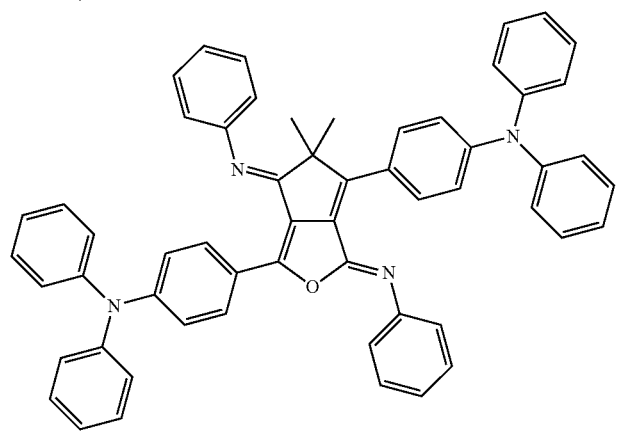
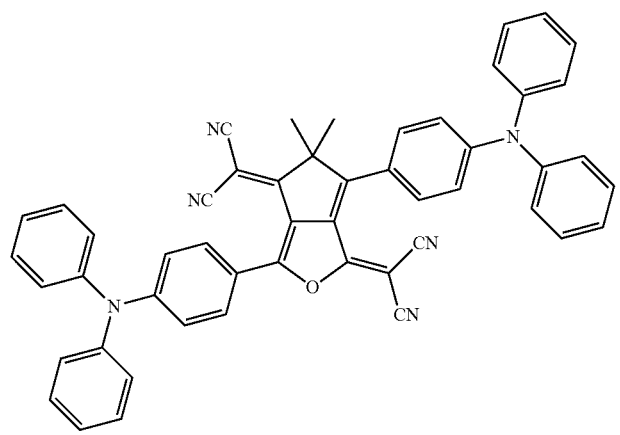

-continued

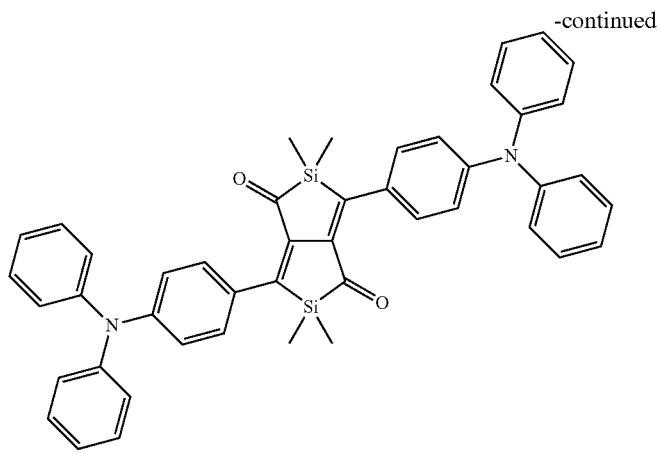

It is preferable that the compound represented by Formula (1), the compound represented by Formula (2), and the compound represented by Formula (3) (hereinafter, these are collectively referred to as a compound X) have an absorption maximum of 400 nm or greater and less than 720 nm in the ultraviolet-visible absorption spectrum. From the viewpoint of broadly absorbing light in a visible region, the peak wavelength of the absorption spectrum (absorption maximum wavelength) is more preferably in a range of 450 nm to 700 nm, more preferably in a range of 480 nm to 700 nm, and particularly preferably in a range of 510 nm to 680 nm.

The absorption maximum wavelength of the compound can be obtained by measuring a chloroform solution of the compound using UV-2550 (manufactured by Shimadzu Corporation). The concentration of the chloroform solution is preferably in a range of $5 \times 10^{-5}$ to $1 \times 10^{-7}$ mol/l, more preferably in a range of $3 \times 10^{-5}$ to $2 \times 10^{-6}$ mol/l, and particularly preferably in a range of $2 \times 10^{-5}$ to $5 \times 10^{-6}$ mol/l.

The compound X has an absorption maximum of 400 nm or greater and less than 720 nm in the ultraviolet visible absorption spectrum and the molar light absorption coefficient of the absorption maximum wavelength is preferably 10000 $mol^{-1} \cdot l \cdot cm^{-1}$ or greater. In order to reduce the film thickness of the photoelectric conversion layer and obtain an element having high charge collection efficiency, high-speed responsiveness, and high sensitivity, a material having a large molar light absorption coefficient is preferable. The molar light absorption coefficient of the compound X is more preferably 20000 $mol^{-1} \cdot l \cdot cm^{-1}$ or greater and still more preferably 40000 $mol^{-1} \cdot l \cdot cm^{-1}$ or greater. The molar light absorption coefficient of the compound X is obtained by measuring the chloroform solution.

The compound X is unlikely to be decomposed at the time of vapor deposition as a difference between the melting point and the vapor deposition temperature (melting point-vapor deposition temperature) is large and the vapor deposition rate can be increased at a high temperature. Further, a difference between the melting point and the vapor deposition temperature (melting point-vapor deposition temperature) is preferably 40° C. or higher, more preferably 50° C. or higher, still more preferably 60° C. or higher, and particularly preferably 80° C. or higher.

The molecular weight of the compound X is preferably in a range of 300 to 1500, more preferably in a range of 500 to 1000, and particularly preferably in a range of 500 to 900. When the molecular weight of the compound X is 1500 or less, the vapor deposition temperature is not increased and thus decomposition of the compound is unlikely to occur. When the molecular weight of the compound X is 300 or greater, the glass transition point of a vapor-deposited film is not decreased, the heat resistance of the element is unlikely to be decreased.

The glass transition point (Tg) of the compound X is preferably 95° C. or higher, more preferably 110° C. or higher, still more preferably 135° C. or higher, particularly preferably 150° C. or higher, and most preferably 160° C. or higher. It is preferable that the glass transition point is increased since the heat resistance of the element is improved.

(Other Materials)

The photoelectric conversion layer may further contain photoelectric conversion materials of the P-type organic compound.

The P-type organic compound indicates an organic compound which is a donor organic compound (semiconductor), mainly typified by a positive hole-transporting organic compound, and has a property of readily donating electrons. More specifically, the P-type organic compound indicates an organic compound having a smaller ionization potential when two organic materials are allowed to come into contact with each other and prepared. Therefore, any organic compound can be used as the toner organic compound if the organic compound has an electron donating property. Examples thereof include a triarylamine compound, a benzidine compound, a pyrazoline compound, a styrylamine compound, a hydrazone compound, a triphenylmethane compound, and a carbazole compound.

(N-Type Organic Semiconductor)

The N-type organic semiconductor indicates an organic compound which is an acceptor organic semiconductor, mainly typified by an electron-transporting organic compound, and has a property of readily accepting electrons. More specifically, the N-type organic semiconductor indicates an organic compound having a higher electron affinity when two organic materials are allowed to come into contact with each other and prepared. Therefore, a fullerene or a fullerene derivative which is an organic compound having an electron-accepting property is used as the acceptor organic semiconductor.

The photoelectric conversion layer 22 (photoelectric conversion layer 108) contain the N-type organic semiconductor formed of fullerenes. The fullerene indicate a fullerene $C_{60}$, a fullerene $C_{70}$, a fullerene $C_{76}$, a fullerene $C_{78}$, a fullerene $C_{80}$, a fullerene $C_{82}$, a fullerene $C_{84}$, a fullerene $C_{90}$, a fullerene $C_{96}$, a fullerene $C_{240}$, a fullerene $C_{540}$, a mixed fullerene, or a fullerene nanotube. Further, the fullerene derivative indicates a compound formed by providing a substituent for any of these.

Preferred examples of the substituent of the fullerene derivative include an alkyl group, an aryl group, or a heterocyclic group. As the alkyl group, an alkyl group having 1 to 12 carbon atoms is more preferable. Preferred examples of the aryl group and the heterocyclic group include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyrizine ring, a pyrazine ring, a pyrimidine ring, a pyridazine ring, an indolizine ring, an indole ring, a benzofuran ring, a benzothiophene ring, an inbenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring. Among these, a benzene ring, a naphthalene ring, an anthracene ring, a phenanthrene ring, a pyridine ring, an imidazole ring, an oxazole ring, or a thiazole ring is more preferable and a benzene ring, a naphthalene ring, or a pyrizine ring is particularly preferable. These may further have substituents and these substituents may be bonded to each other as many as possible to form a ring. Further, these may include a plurality of substituents and these substituents may be the same as or different from each other. In addition, the plurality of substituents may be bonded to each other as many as possible to form a ring.

The photoelectric conversion layer 22 (photoelectric conversion layer 108) has a bulk hetero-structure formed in a state in which the above-described compound X and a fullerene or a fullerene derivative are mixed with each other. The bulk hetero-structure is a layer formed by the P-type organic semiconductor (compound X) and the N-type organic semiconductor being mixed with each other and then dispersed in the photoelectric conversion layer 22 (photoelectric conversion layer 108) and can be formed using a wet method or a dry method, but it is preferable that the bulk hetero-structure is formed using a co-deposition method. When the photoelectric conversion layer 22 (photoelectric conversion layer 108) has a bulk heterobonding structure, a disadvantage that the carrier diffusion length of the photoelectric conversion layer is short can be compensated and the photoelectric conversion efficiency of the photoelectric conversion layer can be improved. Further, the bulk heterobonding structure is described in paragraphs [0013] and [0014] of JP2005-303266A in detail.

The molar ratio (the N-type organic semiconductor/the above-described compound X) of the N-type organic semiconductor to the above-described compound X in the photoelectric conversion layer 22 (photoelectric conversion layer 108) is preferably 1.0 or greater, more preferably in a range of 1 to 10, and still more preferably in a range of 2 to 8.

The content ratio (film thickness of fullerenes in terms of single layer/(film thickness of compound X in terms of single layer+film thickness of fullerenes in terms of single layer)) of fullerenes with respect to the total of fullerenes and the above-described compound X selected from the group consisting of fullerenes and derivatives thereof in the photoelectric conversion layer 22 (photoelectric conversion layer 108) is not particularly limited, but is preferably 50% by weight or greater and more preferably in a range of 60% by weight to 90% by weight, from the viewpoint that the characteristic (photoelectric conversion efficiency or responsiveness) of the photoelectric conversion element is more excellent.

In addition, the film thickness of the compound X (P-type organic semiconductor) in terms of a single layer indicates the film thickness of the compound represented any of Formulae (1) to (3) in terms of a single layer. For example, the film thickness of the compound X indicates the film thickness of the compound represented by Formula (1) in terms of a single layer in a case where only the compound represented by Formula (1) is used and indicates the total film thickness of the three compounds in terms of a single layer in a case where the compounds represented by Formulae (1) to (3) are used.

The photoelectric conversion layer (mixed with the N-type organic semiconductor) included in the compound X of the present invention is a non-luminescent film and has characteristics different from the characteristics of an organic light emitting diode (OLED). The non-luminescent film indicates a film having a light emitting quantum efficiency of 1% or less, more preferably 0.5% or less, and still more preferably 0.1% or less.

(Film Forming Method)

The photoelectric conversion layer 22 (photoelectric conversion layer 108) can be formed using a dry film forming method or a dry film forming method. Specific examples of the dry film forming method include physical vapor deposition methods such as a vacuum deposition method, a sputtering method, an ion plating method, and a molecular beam epitaxy (MBE) method; and a CVD method such as plasma polymerization. Examples of the wet film forming method include a casting method, a spin coating method, a dipping method, and a Langmuir-Blodgett (LB) method. Among these, a dry film forming method is preferable and a vacuum deposition method is more preferable. In a case where a film is formed using a vacuum deposition method, the production conditions such as the vacuum degree and the vapor deposition temperature can be set according to a conventional method.

It is preferable that the photoelectric conversion layer containing the compound X is produced using a vapor deposition method.

Typically, in a case where the vapor deposition rate is high (large), the productivity is improved, which is preferable. However, the thermal load becomes large. Therefore, the characteristic of the dark current of the manufactured photoelectric conversion element occasionally deteriorates when the vapor deposition rate is increased.

Meanwhile, when the above-described compound X is used, the characteristic of the dark current of the photoelectric conversion element to be manufactured is unlikely to deteriorate even if the vapor deposition rate is increased. Particularly in a case where the photoelectric conversion element has a fused ring structure (for example, in Formula (14), in a case where $R^{30}$ and $R^{31}$, $R^{30}$ and $R^{32}$, or $R^{31}$ and $R^{32}$ are respectively bonded to each other directly or through a linking group to form a ring), deterioration of the characteristic of the dark current is further suppressed. The expression that deterioration of the characteristic of the dark current is suppressed means that the heat resistance of the compound is high. The expression that the vapor deposition rate can be increased means that the mass productivity can be improved and the manufacture latitude is wide (the width of vapor deposition rate which can be applied is wide), and the compound X can be said to be more suitable for industrial productivity.

Moreover, the range of the vapor deposition rate is not particularly limited, but is preferably 0.5 Å/sec or greater, more preferably 1 Å/sec or greater, and still more preferably 2 Å/sec or greater.

Next, the charge blocking layer 106 (charge blocking layer 20) will be described.

(Charge Blocking Layer)

As the charge blocking layer 106 (charge blocking layer 20), an electron donating organic material can be used. Specific examples of low molecular weight materials which can be used for the charge blocking layer include an aromatic diamine compound such as N,N'-bis(3-methylphenyl)-(1,1'-biphenyl)-4,4'-diamine (TPD) or 4,4'-bis[N-(naphthyl)-N-phenylamino]biphenyl (α-NPD), a porphyrin compound such as oxazole, oxadiazole, triazole, imidazole, imidazolone, a stilbene derivative, a pyrazoline derivative, tetrahydroimidazole, polyarylalkane, butadiene, 4,4',4''-tris(N-(3-methylphenyl)N-phenylamino)triphenylamine (m-MTDATA), porphine, tetraphenylporphine copper, phthalocyanine, copper phthalocyanine, and titanium phthalocyanine oxide, a triazole derivative, an oxadiazole derivative, an imidazole derivative, a polyarylalkane derivative, a pyrazoline derivative, a pyrazolone derivative, a phenylene diamine derivative, an arylamine derivative, an amino-substituted chalcone derivative, an oxazole derivative, a styrylanthracene derivative, a fluorenone derivative, a hydrazone derivative, and a silazane derivative. Examples of high molecular weight materials which can be used for the charge blocking layer include polymers such as phenylene vinylene, fluorene, carbazole, indole, pyrene, pyrrole, picoline, thiophene, acetylene, and diacetylene and derivatives of these. Compounds sufficiently having positive hole transporting properties can be used in place of the electron donating compounds.

Specifically, it is preferable that the following compounds described in JP2008-72090A are used. Further, Ea represents the electron affinity of the material and Ip represents ionization potential of the material. The "EB" in EB-1, 2, . . . described below is an abbreviation of "electric charge blocking".

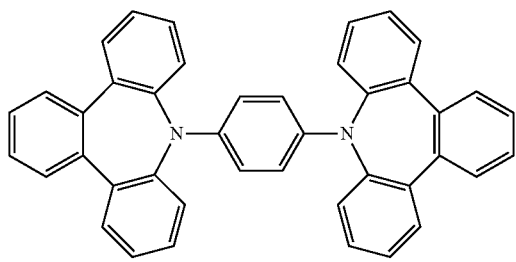

EB-1: Ea = 1.9, Ip = 4.9

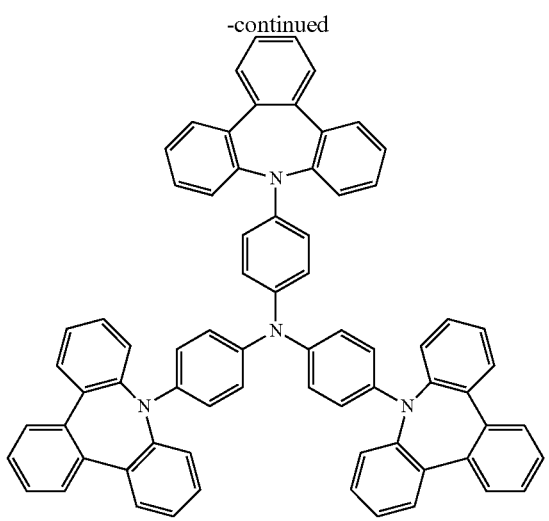

EB-2: Ea = 1.7, Ip = 4.7

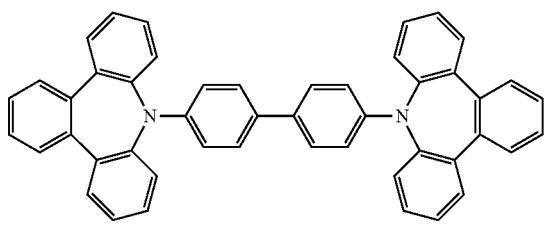

EB-3: Ea = 1.9, Ip = 5.2

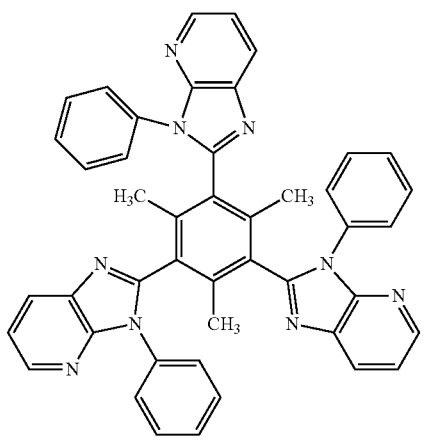

EB-4: Ea = 2.1, Ip = 5.4

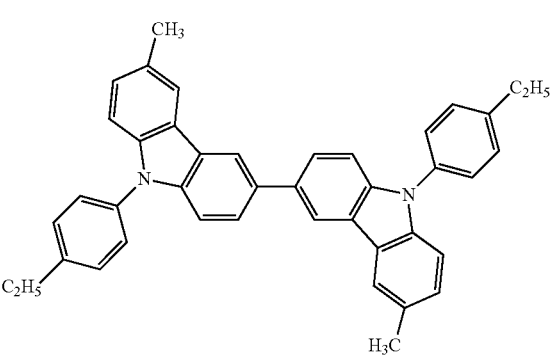

EB-5: Ea = 2.1, Ip = 5.8

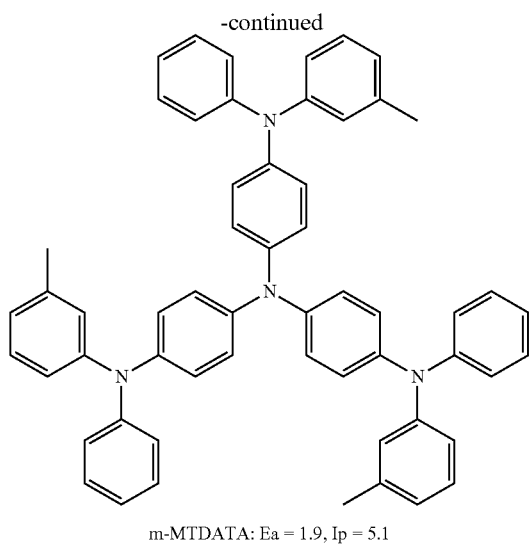

m-MTDATA: Ea = 1.9, Ip = 5.1

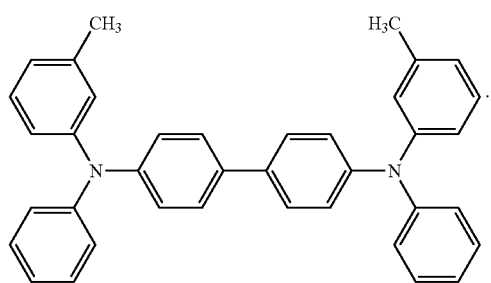

TPD: Ea = 2.3, Ip = 5.5

As the charge blocking layer 106 (charge blocking layer 20), an inorganic material can be used. Since an inorganic material typically has a higher dielectric constant than that of an organic material, a voltage is largely applied to the photoelectric conversion layer 22 (photoelectric conversion layer 108) in a case where the charge blocking layer 106 (charge blocking layer 20) is used, and thus the photoelectric conversion efficiency can be improved. Examples of the material which can be used as the charge blocking layer 106 (charge blocking layer 20) include calcium oxide, chromium oxide, chromium copper oxide, manganese oxide, cobalt oxide, nickel oxide, copper oxide, gallium copper oxide, strontium copper oxide, niobium oxide, molybdenum oxide, copper indium oxide, indium silver oxide, and indium oxide.

In the charge blocking layer 106 (charge blocking layer 20) formed of a plurality of layers, it is preferable that a layer, among the plurality of layers, which is adjacent to the photoelectric conversion layer 108 is a layer formed of a material which is the same as the P-type organic semiconductor included in the photoelectric conversion layer 108. Similarly, when the P-type organic semiconductor is used for the charge blocking layer 106 (charge blocking layer 20), formation of an intermediate level on the interface between the photoelectric conversion layer 108 (photoelectric conversion layer 22) and the layer adjacent to the photoelectric conversion layer 108 is suppressed and the dark current can be further suppressed.

In a case where the charge blocking layer 106 (charge blocking layer 20) is formed of a single layer, the layer can be used as a layer formed of an inorganic material. Alternatively, in a case where the charge blocking layer 106 (charge blocking layer 20) is formed of a plurality of layers, one or two or more layers can be used as a layer formed of inorganic materials.

The molecular weight of the charge blocking layer 106 (charge blocking layer 20) is preferably in a range of 400 to 1300.

When the molecular weight thereof exceeds 1300, the particle diameter of the charge blocking layer 106 (charge blocking layer 20) becomes large. Since the film form of the photoelectric conversion layer 22 (photoelectric conversion layer 108) having a bulk hetero-structure affects the film form of the charge blocking layer 106 (charge blocking layer 20), the charge blocking layer 106 becomes a microcrystalline film when the film form of the photoelectric conversion layer 22 (photoelectric conversion layer 108) is amorphous and has a bulk hetero-structure.

Further, when the molecular weight of the charge blocking layer 106 (charge blocking layer 20) is less than 400, heat resistance is not sufficiently obtained and thus the charge blocking layer is not capable of withstanding a heat treatment at a temperature of approximately 200° C. during a color filter laying process which is required for the imaging element.

When the molecular weight of the charge blocking layer 106 (charge blocking layer 20) is set to a range of 400 to 1300, the film form of the bulk hetero-structure of the photoelectric conversion layer can be maintained to be in an amorphous state from the initial state and a change in film form after the heat treatment can be suppressed.

Specific examples of materials used for the charge blocking layer 106 (charge blocking layer 20) are shown in the following Chemical Formula 1 (molecular weight of 1385), Chemical Formula 2 (molecular weight of 1284), Chemical Formula 3 (molecular weight of 940), Chemical Formula 4 (molecular weight of 798), and Chemical Formula 5 (molecular weight of 360). Among these, materials having a molecular weight of 400 to 1300 which are shown in Chemical Formula 2, Chemical Formula 3, and Chemical Formula 4 are preferable.

Chemical Formula 1
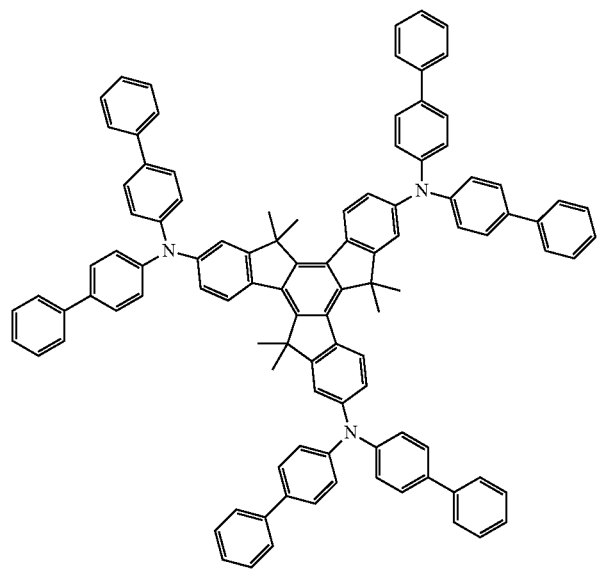
Chemical Formula 2
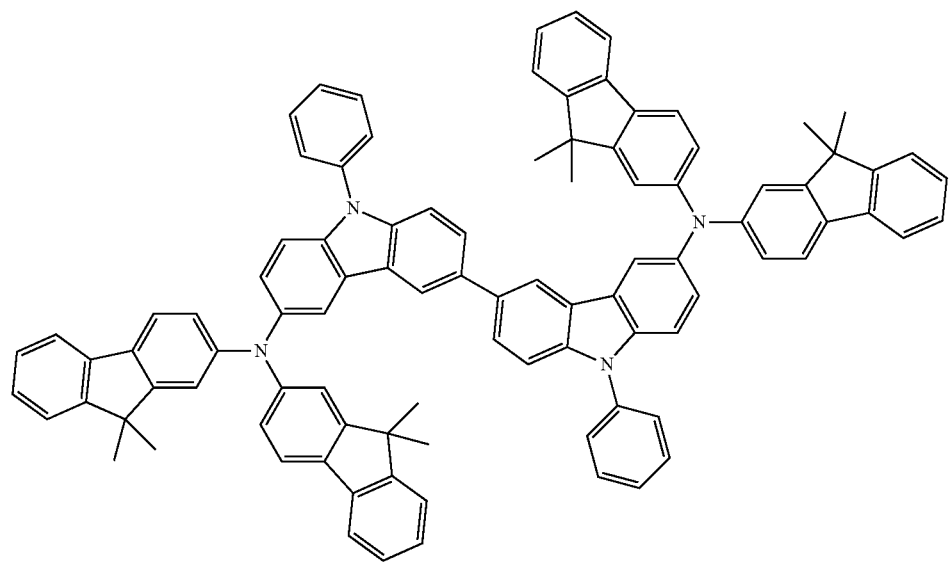
Chemical Formula 3
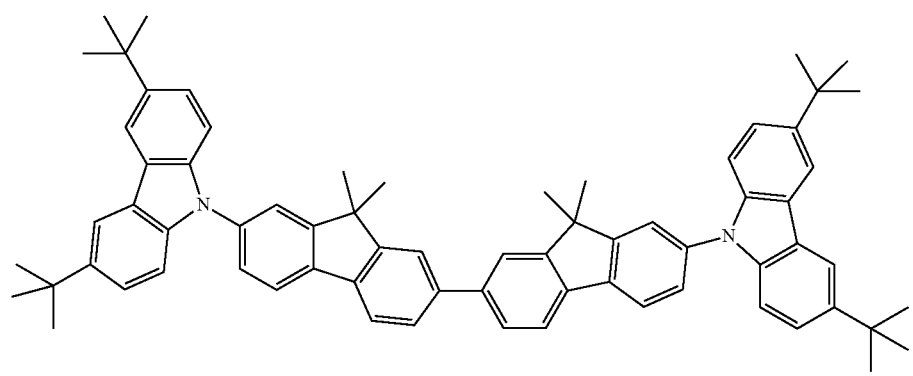

-continued

Chemical Formula 4

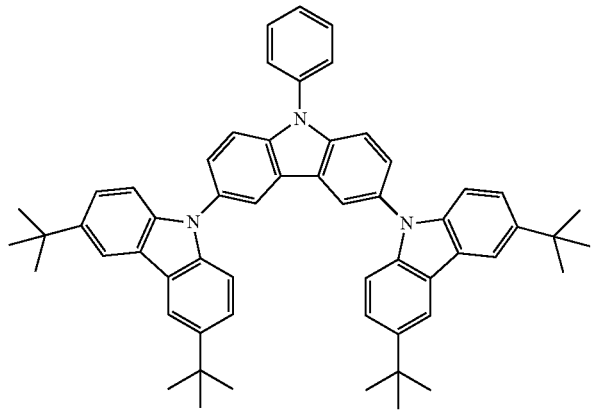

Chemical Formula 5

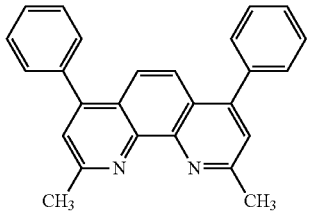

Next, the positive hole blocking layer will be described.

An electron-accepting organic material can be used for the positive hole blocking layer. Examples of the electron-accepting material include an oxadiazole derivative such as 1,3-bis(4-tert-butylphenyl-1,3,4-oxadiazolyl)phenylene (OXD-7), an anthraquinodimethane derivative, a diphenylquinone derivative, bathocuproine, bathophenanthroline, and derivatives thereof, a triazole compound, a tris(8-hydroxyquinolinato)aluminum complex, a bis(4-methyl-8-quinolinato)aluminum complex, a distylylarylene derivative, and a silole compound. In place of the electron-accepting organic materials, materials sufficiently having electron transporting properties can be used. Examples thereof include a porphyrin compound, a styryl-based compound such as DCM (4-dicyanomethylene-2-methyl-6-(4-(dimethylaminostyryl))-4H-pyran), and a 4H-pyran-based compound.

The present invention is basically configured as described above. Hereinbefore, the photoelectric conversion element and the imaging element of the present invention have been described in detail, but the present invention is not limited to the above-described embodiment, and various improvements and modifications can be made within the range not departing from the scope of the present invention.

EXAMPLES

Hereinafter, the effects of the photoelectric conversion layer of the imaging element of the present invention will be described in detail.

In the present examples, imaging elements of Examples 1 to 8 and Comparative Examples 1 to 6 were prepared. Further, the configuration of the photoelectric conversion element 100 illustrated in FIG. 1A was used as the configuration of each imaging element and the two-layer structure illustrated in FIG. 1B was used as the configuration of each sealing layer. The configuration of a pixel electrode (lower electrode), a charge blocking layer, a photoelectric conversion layer, a counter electrode (upper electrode), a protective film, and a stress relaxation layer formed on a glass substrate in this order was employed. Further, the sealing layer is formed of the protective film and the stress relaxation layer.

The imaging elements of Examples 1 to 8 and Comparative Examples 1 to 6 were subjected to a heat treatment at 200° C. and then the black currents were measured using a spectral sensitivity measuring device. The dark currents were measured at a temperature of 60° C. The results thereof are listed in the columns of black currents of the following Table 1. A constant energy quantum efficiency measuring device (as a source meter. Keithley 6430 was used) (manufactured by OPTEL Co., Ltd.) was used as the spectral sensitivity measuring device.

The film qualities of the photoelectric conversion layers were studied by investigating the surface roughness (Ra) using an atomic force microscope (AFM). A photoelectric conversion layer having a surface roughness (Ra) of 0.3 nm or less was set to an amorphous film and a photoelectric conversion layer having a surface roughness (Ra) of greater than 0.3 nm was set to a microcrystalline film.

The ionization potentials (IP) with a bulk hetero-structure in the following Table 1 are values measured at room temperature using an atmospheric photoelectron spectrometer AC-2 manufactured by RIKEN KEIKI Co., Ltd.).

The ionization potential (IP) value of the P-type organic semiconductor is a physical property value of the P-type organic semiconductor.

The electron affinity (Ea) of the N-type organic semiconductor is a value obtained by estimating a band gap from the absorption end of a spectrophotometer (U3310, manufactured by Hitachi High-Technologies Corporation) and calculating a difference between a value acquired from the ionization potential and the band gap.

The "Ip-Ea (eV)" listed in the following Table 1 indicates a difference between the ionization potential (IP) of the bulk hetero-structure and the electron affinity (Ea) of the N-type organic semiconductor.

Hereinafter, each of the imaging elements of Examples 1 to 8 and Comparative Examples 1 to 6 will be described.

Example 1

In Example 1, first, a glass substrate was prepared and a pixel electrode was formed using ITO. Next, the substrate was mounted on a substrate holder in a vapor deposition chamber and the pressure in the vapor deposition chamber was reduced to $1 \times 10^{-4}$ Pa or less. Thereafter, the following compound 1 was vapor-deposited on the pixel electrode such that the vapor deposition rate was in a range of 1.0 to 1.2 Å/Sec and the thickness thereof was 1000 Å according to a resistance heating vapor deposition method while the substrate holder was rotated, thereby forming a charge blocking layer.

Subsequently, the following compound 5 (P-type organic semiconductor) and the fullerene $C_{60}$ (N-type organic semiconductor) were vapor-deposited such that the vapor deposition rates were respectively in a range of 1.2 to 1.4 Å/Sec and in a range of 3.8 to 4.0 Å/Sec and the thickness thereof was 4700 Å, thereby forming a photoelectric conversion layer.

Next, the photoelectric conversion layer was conveyed to a sputtering chamber, ITO was sputtered on the photoelectric conversion layer using radio frequency (RF) magnetron sputtering such that the thickness thereof became 100 Å, thereby forming a counter electrode. Thereafter, the counter electrode was conveyed to an ALD chamber, an $Al_2O_3$ film was formed such that the thickness thereof became 2000 Å according to an atomic layer deposition (ALD) method, thereby forming a protective film. Next, the protective film was conveyed to a sputtering chamber, a SiON film was formed such that the thickness thereof became 1000 Å according to a planar sputtering, thereby forming a stress relaxation layer.

The electron affinity (Ea) of the above-described fullerene $C_{60}$ (N-type organic semiconductor) was 4.2 eV.

Example 2

An imaging element was prepared in the same manner as in Example 1 except that a photoelectric conversion layer was formed using the following compound 6 in place of the P-type organic semiconductor.

Example 3

An imaging element was prepared in the same manner as in Example 1 except that a photoelectric conversion layer was formed using the following compound 7 in place of the P-type organic semiconductor.

Example 4

An imaging element was prepared in the same manner as in Example 1 except that a photoelectric conversion layer was formed using the following compound 8 in place of the P-type organic semiconductor.

Example 5

An imaging element was prepared in the same manner as in Example 1 except that a photoelectric conversion layer was formed using the following compound 9 in place of the P-type organic semiconductor.

Example 6

An imaging element was prepared in the same manner as in Example 1 except that the following compound 2 was used in place of a charge blocking layer.

Example 7

An imaging element was prepared in the same manner as in Example 1 except that the following compound 3 was used in place of a charge blocking layer.

Example 8

An imaging element was prepared in the same manner as in Example 1 except that the following compound 4 was used in place of a charge blocking layer.

Comparative Example 1

An imaging element was prepared in the same manner as in Example 1 except that a photoelectric conversion layer was formed using the following compound 10 in place of the P-type organic semiconductor.

Comparative Example 2

An imaging element was prepared in the same manner as in Example 1 except that a photoelectric conversion layer was formed using the following compound 11 in place of the P-type organic semiconductor.

Comparative Example 3

An imaging element was prepared in the same manner as in Example 1 except that a photoelectric conversion layer was formed using the following compound 12 in place of the P-type organic semiconductor.

Comparative Example 4

An imaging element was prepared in the same manner as in Comparative Example 3 except that the following compound 2 was used in place of a charge blocking layer.

Comparative Example 5

An imaging element was prepared in the same manner as in Comparative Example 2 except that the following compound 2 was used in place of a charge blocking layer.

Comparative Example 6

An imaging element was prepared in the same manner as in Comparative Example 1 except that the following compound 4 was used in place of a charge blocking layer.

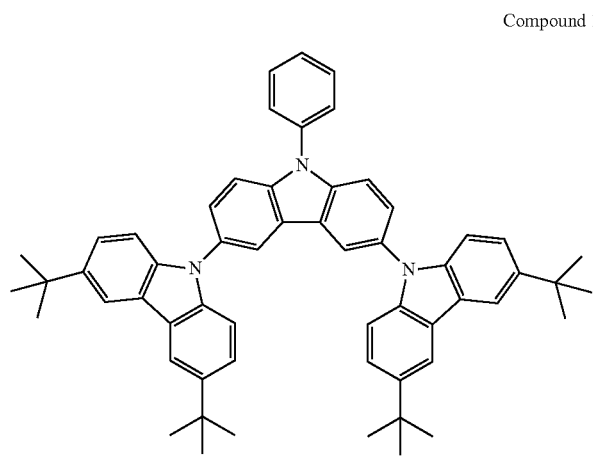

Compound 1

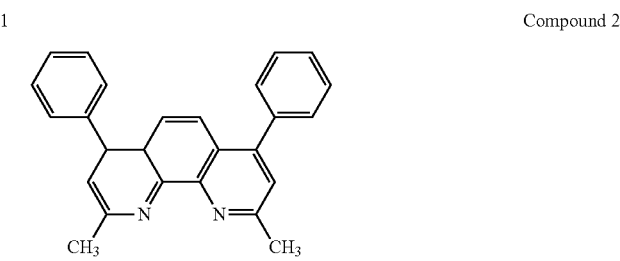

Compound 2

-continued
Compound 3
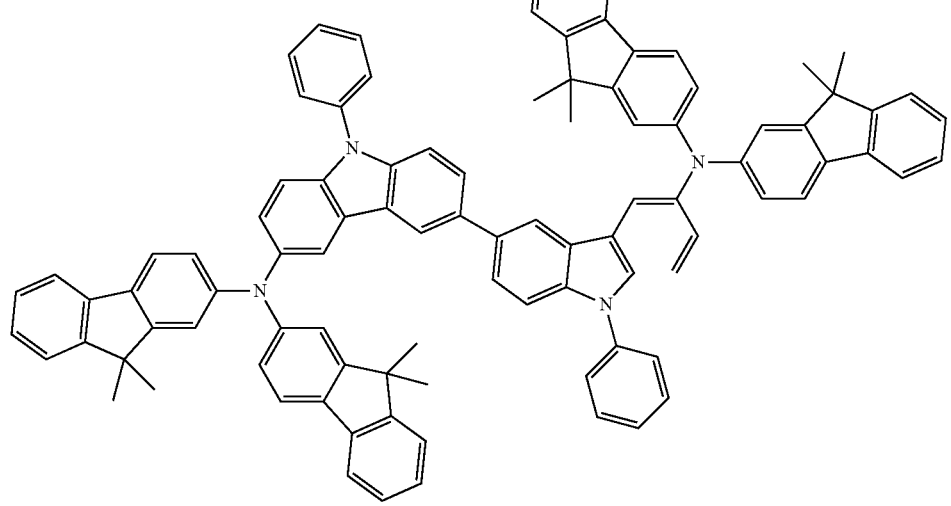
Compound 4
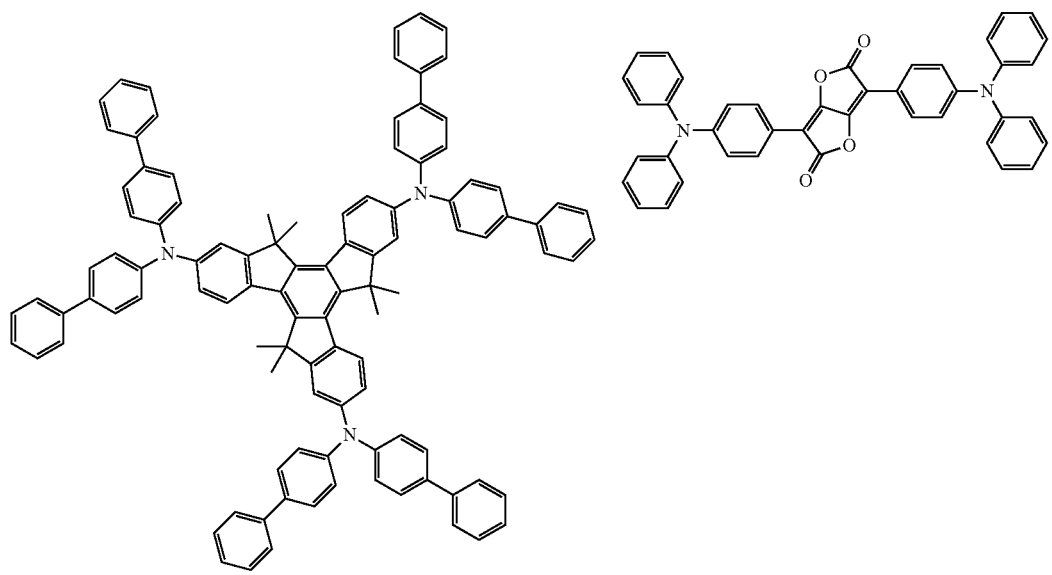
Compound 5
Compound 6
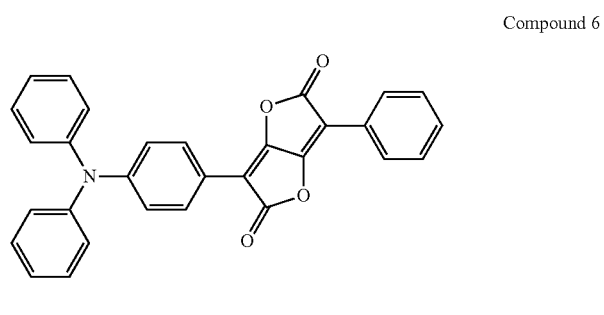
Compound 7
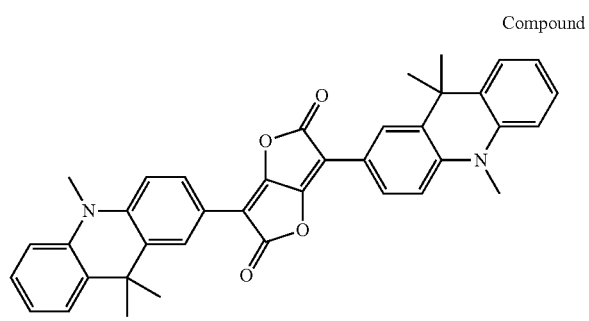

-continued
Compound 8
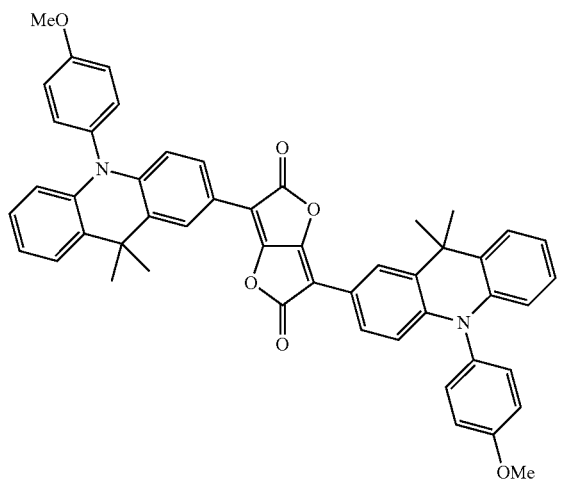
Compound 9
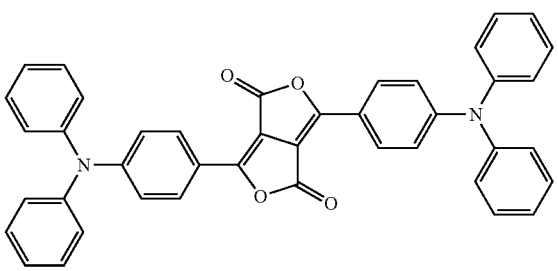
Compound 10
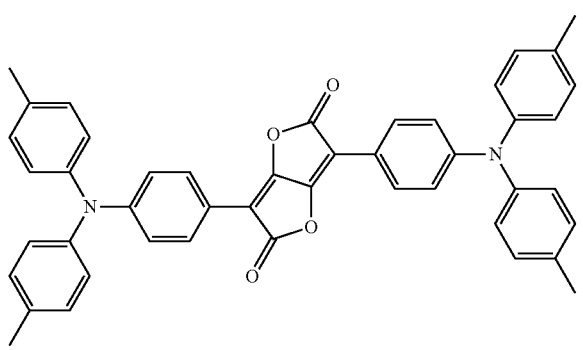
Compound 11
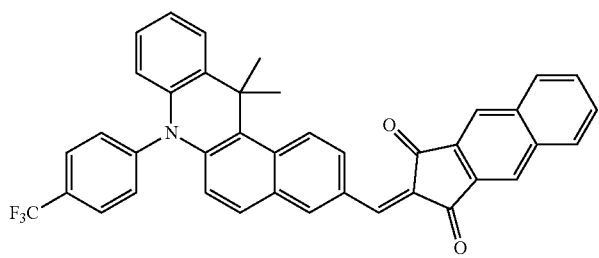
Compound 12
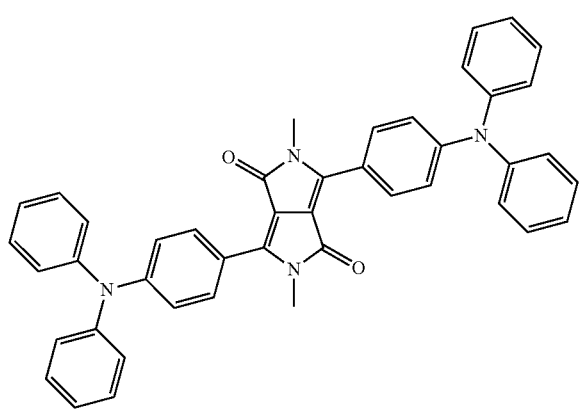

TABLE 1

| | Type of charge blocking layer | Molecular weight of charge blocking layer | Type of P-type semiconductor | Ionization potential (eV) of P-type semiconductor | Ionization potential (eV) of bulk heterostructure | IP-Ea difference (eV) | Film form of photoelectric conversion layer | Dark current (A/cm$^2$) | Remark |
|---|---|---|---|---|---|---|---|---|---|
| Example 1 | Compound 1 | 798 | Compound 5 | 5.4 | 5.6 | 1.4 | Amorphous | $6 \times 10^{-12}$ | |
| Example 2 | Compound 1 | 798 | Compound 6 | 5.4 | 5.58 | 1.38 | Amorphous | $7 \times 10^{-12}$ | |
| Example 3 | Compound 1 | 798 | Compound 7 | 5.43 | 5.51 | 1.31 | Amorphous | $9.5 \times 10^{-12}$ | |
| Example 4 | Compound 1 | 798 | Compound 8 | 5.48 | 5.52 | 1.32 | Amorphous | $9 \times 10^{-12}$ | |
| Example 5 | Compound 1 | 798 | Compound 9 | 5.31 | 5.59 | 1.39 | Amorphous | $8 \times 10^{-12}$ | |
| Example 6 | Compound 2 | 360 | Compound 5 | 5.4 | 5.6 | 1.4 | Amorphous | $1.5 \times 10^{-11}$ | |
| Example 7 | Compound 3 | 1284 | Compound 5 | 5.4 | 5.6 | 1.4 | Amorphous | $7 \times 10^{-12}$ | |
| Example 8 | Compound 4 | 1385 | Compound 5 | 5.4 | 5.6 | 1.4 | Amorphous | $1.5 \times 10^{-11}$ | The film form was amorphous, but the particle diameter of the charge blocking layer was large to have microcrystalline properties |
| Comparative Example 1 | Compound 1 | 798 | Compound 10 | 5.45 | 5.49 | 1.29 | Microcrystalline | $1 \times 10^{-10}$ | |
| Comparative Example 2 | Compound 1 | 798 | Compound 11 | 5.38 | 5.4 | 1.2 | Microcrystalline | $2 \times 10^{-10}$ | |
| Comparative Example 3 | Compound 1 | 798 | Compound 12 | 5.2 | 5.43 | 1.23 | Amorphous | $3 \times 10^{-10}$ | |
| Comparative Example 4 | Compound 2 | 360 | Compound 12 | 5.2 | 5.43 | 1.23 | Amorphous | $8 \times 10^{-9}$ | |
| Comparative Example 5 | Compound 2 | 360 | Compound 11 | 5.38 | 5.4 | 1.2 | Microcrystalline | $9 \times 10^{-9}$ | |
| Comparative Example 6 | Compound 4 | 1385 | Compound 10 | 5.45 | 5.49 | 1.29 | Microcrystalline | $9 \times 10^{-9}$ | |

As listed in the above-described Table 1, the dark current values were small in Examples 1 to 8. Particularly, in Examples 1 to 5 and Example 7 in which the molecular weight of the charge blocking layer was in a range of 400 to 1300, the dark current values were set to be in a range of 6 to 9.5 pA/cm$^2$ at 60° C.

Meanwhile, all of the dark current values in Comparative Examples 1 to 6 were greater than those of Examples 1 to 8 and the dark current values were in a range of 100 pA/cm$^2$ to 9000 pA/cm$^2$. The dark current values in Comparative Examples 4 and 5 in which the molecular weight of the charge blocking layer was less than 400 were respectively 8000 and 9000 pA/cm$^2$, whether the photoelectric conversion layer was an amorphous film or a microcrystalline film, which were greater than those of Comparative Examples 1 to 3 in which the molecular weight of the charge blocking layer was in a range of 400 to 1300. The dark current value in Comparative Example 6 in which the molecular weight of the charge blocking layer was greater than 1300 was 9000 pA/cm$^2$, which was greater than those of Comparative Examples 1 to 3 in which the molecular weight of the charge blocking layer was in a range of 400 to 1300.

EXPLANATION OF REFERENCES

10: imaging element
12, 102: substrate
14: insulating layer
16: pixel electrode
20, 106: charge blocking layer
22, 108: photoelectric conversion layer
24, 110: organic layer
26: counter electrode
28, 114: sealing layer
40: readout circuit
42: counter electrode voltage supply unit
44: first connection unit
46: second connection unit
100: photoelectric conversion element
104: lower electrode
112: upper electrode

What is claimed is:

1. A photoelectric conversion element comprising:
a lower electrode;
a charge blocking layer which suppresses injection of a charge from the lower electrode;
an organic layer which includes a photoelectric conversion layer; and
an upper electrode which includes a transparent electrode layer, which are laminated in this order on a substrate, wherein
the photoelectric conversion layer is configured of an amorphous film and has a bulk hetero-structure of a P-type organic semiconductor and an N-type organic semiconductor formed of fullerenes,
a difference between an ionization potential of the photoelectric conversion layer having the bulk heterostructure and an electron affinity of the N-type semiconductor is 1.30 eV or greater, and
the charge blocking layer is formed of an electron donating organic material shown in the following Chemical Formula 2 or Chemical Formula 3:

Chemical Formula 2

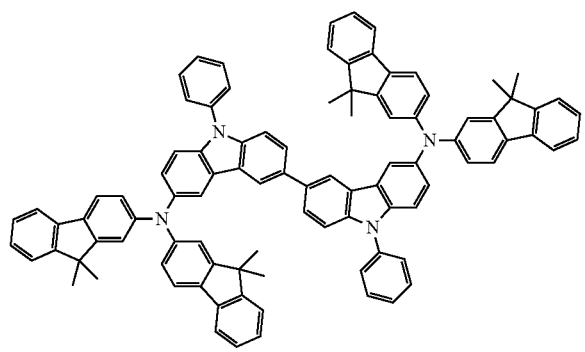

Chemical Formula 3

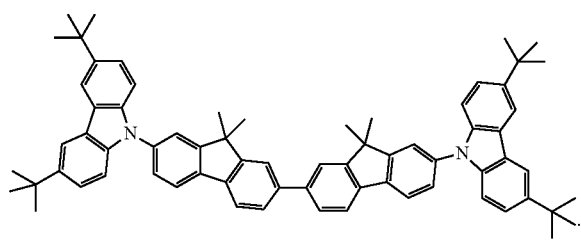

2. An imaging element comprising a photoelectric conversion element, the photoelectric conversion element comprising:

a lower electrode;

a charge blocking layer which suppresses injection of a charge from the lower electrode;

an organic layer which includes a photoelectric conversion layer; and an upper electrode which includes a transparent electrode layer, which are laminated in this order on a substrate, wherein the photoelectric conversion layer is configured of an amorphous film and has a bulk hetero-structure of a P-type organic semiconductor and an N-type organic semiconductor formed of fullerenes, a difference between an ionization potential of the photoelectric conversion layer having the bulk hetero-structure and an electron affinity of the N-type semiconductor is 1.30 eV or greater, and the charge blocking layer is formed of an electron donating organic material shown in the following Chemical Formula 2 or Chemical Formula 3:

Chemical Formula 2

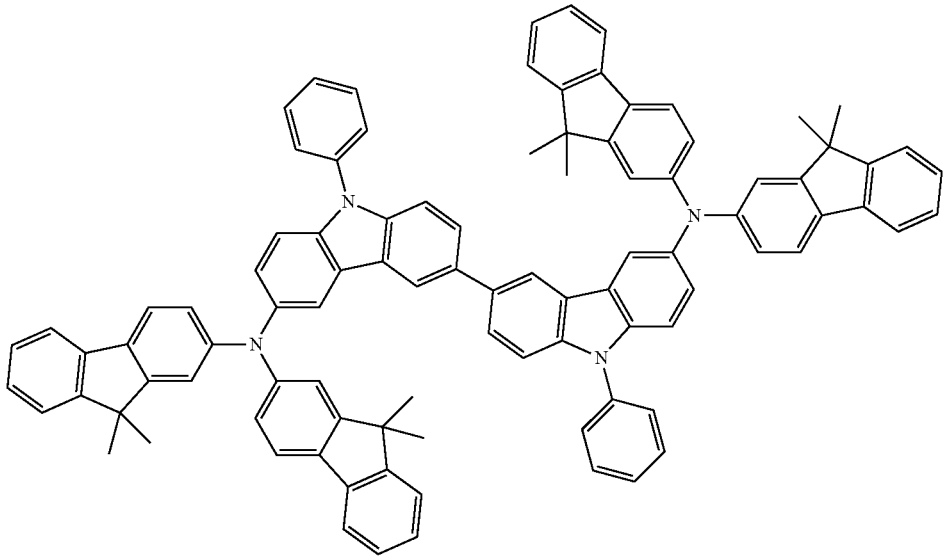

Chemical Formula 3

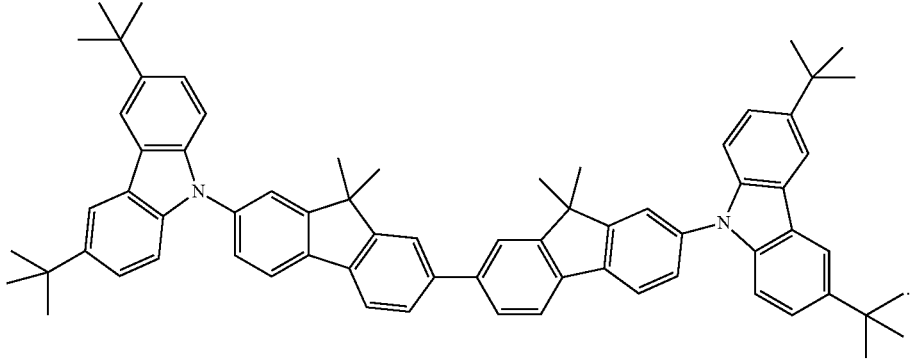

3. The imaging element according to claim 2, further comprising:
  a charge accumulation unit which accumulates a charge generated in the photoelectric conversion layer of the photoelectric conversion element; and
  a connection unit which transmits the charge of the photoelectric conversion layer to the charge accumulation unit.

* * * * *